(12) United States Patent
Kaltenegger et al.

(10) Patent No.: US 10,338,126 B2
(45) Date of Patent: Jul. 2, 2019

(54) OPEN LOAD DETECTION IN OUTPUT STAGES

(71) Applicant: Infineon Technologies AG, Neubiberg (DE)

(72) Inventors: Martin Kaltenegger, Graz (AT); Heinz Novak, Graz (AT)

(73) Assignee: Infineon Technologies AG, Neubiberg (DE)

(*) Notice: Subject to any disclaimer, the term of this patent is extended or adjusted under 35 U.S.C. 154(b) by 299 days.

(21) Appl. No.: 15/173,415

(22) Filed: Jun. 3, 2016

(65) Prior Publication Data

US 2017/0299644 A1 Oct. 19, 2017

Related U.S. Application Data

(60) Provisional application No. 62/323,420, filed on Apr. 15, 2016.

(51) Int. Cl.
*G01R 31/14* (2006.01)
*G01R 31/02* (2006.01)
(Continued)

(52) U.S. Cl.
CPC ....... *G01R 31/025* (2013.01); *G01R 31/2608* (2013.01); *G01R 31/2621* (2013.01); *H03K 5/24* (2013.01); *H03K 17/687* (2013.01)

(58) Field of Classification Search
CPC .............. G01R 31/025; G01R 31/2608; G01R 31/2621; G01R 31/2884; H03K 17/18;
(Continued)

(56) References Cited

U.S. PATENT DOCUMENTS 5,438,286 A * 8/1995 Pavlin ................ H03K 17/0824
327/50
6,448,800 B1 9/2002 Yamamoto et al.
(Continued)

FOREIGN PATENT DOCUMENTS

CN 101316469 A 12/2008
CN 103427613 A 12/2013
(Continued)

OTHER PUBLICATIONS

"§1968.2. Malfunction and Diagnostic System Requirements—2004 and Subsequent Model-Year Passenger Card, Light-Duty Trucks, and Medium-Duty Vehicles and Engines," retrieved from http://www.arb.ca.gov/msprog/obdprog/obdregs.htm, Sep. 25, 2013, 151 pp.
(Continued)

*Primary Examiner* — Minh N Tang
(74) *Attorney, Agent, or Firm* — Shumaker & Sieffert, P.A.

(57) ABSTRACT

Systems, devices, methods, and techniques are disclosed for open load detection in the connections coming from output stages of electrical systems. In some examples, an open load detection circuit includes a circuit output configured to provide an output voltage to a load, a first switch coupled to the circuit output and coupled to a first supply voltage configured to switch the load, and at least one delta voltage circuit coupled to the circuit output configured to provide a delta voltage. The at least one delta voltage circuit is coupled to the first switch to create a reduction in voltage magnitude of the first supply voltage to a switch voltage of the first switch provided to the circuit output. The open load detection circuit also includes at least one current source coupled to the circuit output to provide a current to the circuit output.

39 Claims, 13 Drawing Sheets

(51) Int. Cl.
    *G01R 31/26* (2014.01)
    *H03K 5/24* (2006.01)
    *H03K 17/687* (2006.01)

(58) Field of Classification Search
    CPC .... H03K 17/64; H03K 17/687; H03K 17/662; H03K 17/567
    See application file for complete search history.

(56) References Cited

U.S. PATENT DOCUMENTS

| | | | |
|---|---|---|---|
| 7,667,940 B2 | 2/2010 | Turpin et al. | |
| 9,480,193 B2 * | 10/2016 | Vermeir | H05B 33/0887 |
| 2008/0298088 A1 | 12/2008 | Shen et al. | |
| 2009/0309607 A1 | 12/2009 | Arndt et al. | |
| 2013/0313906 A1 | 11/2013 | Gupta et al. | |
| 2014/0327450 A1 | 11/2014 | Schmauss et al. | |
| 2015/0362550 A1 | 12/2015 | Wibben | |

FOREIGN PATENT DOCUMENTS

| | | |
|---|---|---|
| CN | 204216774 U | 3/2015 |
| CN | 105372552 A | 3/2016 |
| CN | 106255893 A | 12/2016 |
| DE | 19737628 C1 | 1/1999 |
| DE | 19705339 C2 | 11/2001 |
| DE | 102006045308 A1 | 3/2008 |
| DE | 102007002953 A1 | 7/2008 |
| DE | 102011086412 A1 | 5/2013 |

OTHER PUBLICATIONS

"§1968.5. Enforcement of Malfunction and Diagnostic System Requirements for 2004 and Subsequent Model-Year Passenger Cars, Light-Duty Trucks, and Medium-Duty Vehicles and Engines," retrieved from http://www.arb.ca.gov/msprog/obdprog/obdregs.htm, Jul. 31, 2013, 29 pp.

Office Action, in the Chinese language, from counterpart Chinese Application No. 201710243704.5, dated May 7, 2019, 6 pp.

* cited by examiner

OPEN LOAD DETECTION IN OUTPUT STAGES

RELATED APPLICATIONS

This application claims the benefit of U.S. Provisional Application Ser. No. 62/323,420 filed Apr. 15, 2016, the entire contents of which is hereby incorporated by reference herein.

TECHNICAL FIELD

This disclosure relates generally to methods, devices, and systems for open load detection in the connections coming from output stages of electrical systems.

BACKGROUND

In various electrical systems, for example in automotive applications, a central control unit is coupled to various sensors to receive inputs, and is coupled to one or more loads or other control units to provide control functions related to these loads or other control units. In various systems, the central control unit is operable to turn loads or other control units to an "ON" or "OFF" state by providing an ON/OFF signal to the load or other control unit. In an automotive application, the central control unit is often referred to as the Engine Control Module (ECM). In addition to providing control and management of functions related to the automotive engine system, the ECM is often coupled to other control units, such as a transmission control unit, an Anti-lock Brake System (ABS) control unit, a body control module, a climate control module, an ignition module, and an anti-theft system for the automobile in which the ECM resides.

In various examples, the ECM is coupled to one of these other control units or modules through a conductor coupling an output stage (circuit) of the ECM to an input of the control unit or module. For various automotive applications, the ECM includes one or more output stages that are operable to provide ON/OFF control signals to loads or other control units that are separate from the ECM. By way of illustration, the ECM can include an output stage (circuit) that is connected to an input of a smart ignition module, wherein the ECM is operable to provide an ON/OFF control signal to the ignition module that controls an ON and OFF state for the smart ignition module.

SUMMARY

In one example, the disclosure is directed to an open load detection circuit comprising: a circuit output configured to provide an output voltage to a load, a first switch coupled to the circuit output and coupled to a first supply voltage configured to switch the load, at least one delta voltage circuit coupled to the circuit output configured to provide a delta voltage, wherein the delta voltage circuit is coupled to the first switch to create a reduction in voltage magnitude of the first supply voltage to a switch voltage of the first switch provided to the circuit output, at least one current source coupled to the circuit output to provide a current to the circuit output, the current source configured to overcome the switch voltage provided to the circuit output in a case of an open load condition, and at least one comparator configured to provide a failure signal in the case of an open load condition.

In another example, the disclosure is directed to a method comprising: coupling, by a first switch, a circuit output of an open load detection circuit to a first supply voltage to switch a load, generating, by at least one delta voltage circuit, a switch voltage at the circuit output when no open load conditions exist at the circuit output, generating, by at least one current source, a voltage level at the circuit output that overcomes the switch voltage and provides a second output voltage different from the switch voltage when an open load condition exists at the circuit output, and generating, by at least one comparator, a failure signal when an open load condition exists at the circuit output.

The details of one or more examples of this disclosure are set forth in the accompanying drawings and the description below. Other features, objects, and advantages of this disclosure will be apparent from the description and drawings, and from the claims.

Figure 1:
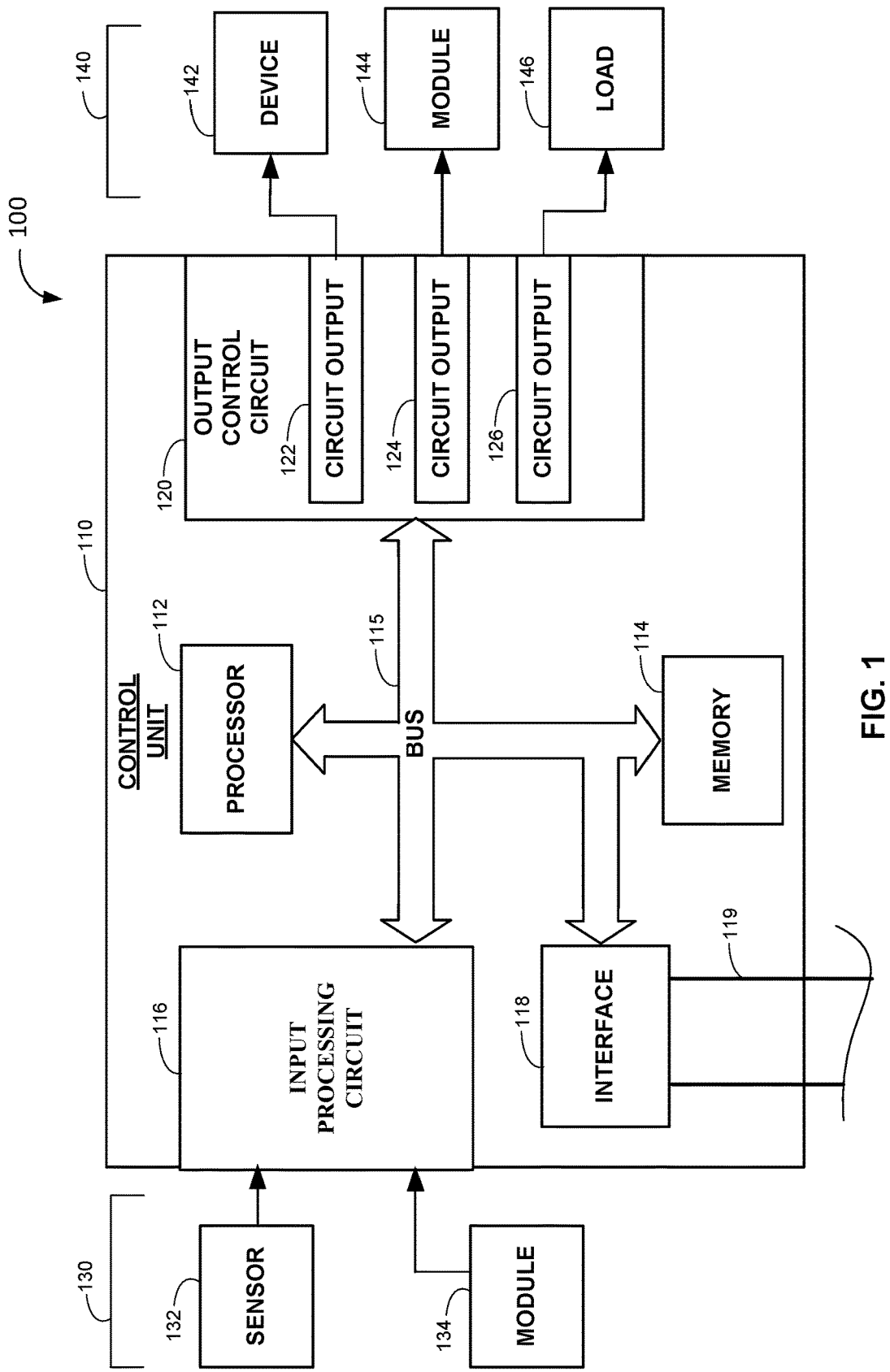
FIG. 1 illustrates a block diagram of an example control unit comprising one or more open load detection circuits in accordance with one or more example methods, devices, and systems described in the present disclosure.

The drawings and the description provided herein illustrate and describe various examples of the inventive methods, devices, and systems of the present application. However, the methods, devices, and systems of the present application are not limited to the specific examples as illustrated and described herein, and other examples and variations of the methods, devices, and systems of the present application, as would be understood by one of ordinary skill in the art, are contemplated as being within the scope of the present application.

In various illustrations and descriptions provided herein, reference is made to "ground" or to a voltage level as "ground." However, reference to "ground" or to a voltage level of "ground" is not limited to any particular voltage level, or to specifically meaning "earth ground," and is to be interpreted as referring to a common voltage level between points designated as being coupled to "ground" or as being "grounded." In addition, in various examples illustrated and described herein, a "ground" is shown or described for an open load detection circuit, and for a load, module, or other device coupled to or intended to be coupled to the open load detection circuit. It some instances, the "ground" is a same reference voltage level. However, is various examples the ground voltage level of the open load detection circuit is a different reference voltage level than the reference voltage level illustrate and described for a "ground" provided at the load, the module, or other device that is coupled to or intended to be coupled to the open load detection circuit.

DETAILED DESCRIPTION

As noted above, various electrical systems include a central control unit that is operable to be electrically coupled to one or more other devices, such as sensors, loads, or one or more other control modules. In various examples, output stages (electrical circuits) of the central control unit include circuit outputs that are operable to be coupled to an input of a load, an input to a module, or an input to another device (hereinafter each of which is referred to simply as a/the "load") by a conductor, such as a wire. Because this conductor can inadvertently become disconnected, or a break in the conductor can occur, an open load condition can occur. In various examples, an open load condition exists whenever the electrical connection between an output stage, such as the output stage of the central control unit, and the input to a load is electrically broken so that a current path no longer exists from the output stage to the input of the load. In other examples, an open load condition also exists when the coupling between the output stage of the central control unit and the input of the load to which the output stage is intended to be electrically coupled to presents a high ohmic condition relative to the output stage. Such a high ohmic condition exists when a current path for a flow of current from the output circuit of the output stage exists, but the path presents a path having a much higher ohmic resistance than would be provided when a proper coupling exists between the output stage and the input of the load. An example of a high ohmic path is an instance wherein the conductor between the output stage and the input to the load to which the output stage is intended to be coupled is in fact broken, but a leakage current path exists from the conductor that allows for some level of current flow from the output stage to occur. However, instances of high ohmic path conditions at the output stage are not limited to small current flows caused by leakage currents, and any condition that causes a high ohmic path to exist at the output stage can be considered an "open load condition." In various examples, an "open load condition" can be defined to occur when only a percentage of current flow to or from the output of the output stage exists relative to a nominal value of current flow that would be expected as an output current flow to or from the output stage when the intended load is properly coupled to the output stage. In other words, in various examples, an open load condition can be defined by a percentage of the expected level of current flow (nominal) output to or from the output stage, the nominal output being the current flow that would occur when a load intended to be coupled to the output stage is in fact properly connected electrically to the output stage. Thus, in various examples one definition for an "open load condition" is dependent on the load that is intended to be coupled to the output stage.

As an example, if the intended load to be coupled to an output circuit of an output stage normally provides a current path at the output stage for a current flow of 100 milliamps (when the output is providing a particular output state, such as an "ON" or an "OFF" state), an "open load condition" for that output stage when providing that output state can be defined as a current flow of 1% or less (1 milliamp or less) relative to the expected output current flow of 100 milliamps. Therefore, if a 1 milliamp or less current flow is provided from the output stage when providing the ON state signal, that current flow can be defined as a high ohmic condition, and thus an "open load condition" for this output stage and this particular load during this particular state. It would be understood by one of skill in the art that these "open load conditions" based on high ohmic conditions can be defined for different levels of current flow for different output stages, and/or for different loads, and can be set at different percentages of the nominal value for current flow as the threshold level for making the determination that a high ohmic condition, and thus an "open load condition" exists at the output stage of a given output circuit. Therefore, as used throughout this disclosure, reference to an "open load condition" is any condition that will be detected by the open load detection circuit associated with the output stage under consideration as on open load condition, including both actual open load circuits and any high ohmic load conditions relative to the output stage utilizing an open load detection circuit as described herein, or the equivalent thereof.

When an open load condition occurs in a particular conductor coupling an output stage of the central control unit to an input of a load or other module, the central control unit may no longer be able to control the load or module as intended. In various examples, the ability to detect the occurrence of an open load condition is desirable. In various applications, detection of the occurrence of an open load condition is required by various safety standards or legal regulations. By way of illustration, in automotive applications, various governmental regulatory agencies such as the State of California and the U.S. Environmental Protection Agency (EPA) have mandated On-Board Diagnosis Requirements (OBD-2) for automotive applications, the regulations requiring monitoring of the functionality of an ECM for emission relevant functions. In such applications, push-pull drivers used to drive ignition Insulated Gate Bipolar Transistors (IGBTs) must fulfill the OBD-2 requirements, and therefore use of open load detection is mandatory in these applications.

In some conventional open load detection circuits, the load voltage is monitored via a dedicated feedback pin coupling the load or module coupled to an output of the control unit. The disadvantages of this approach include the requirement for an added feedback pin and additional connector coupling the control unit and the load or module, requiring an added terminal on each device along with the added conductor, and the requirement for high voltage robust circuitry. In various examples, a feedback pin cannot be afforded for space or other reasons, or is technically unfeasible, for example in a control of a smart ignition module in an automotive application, where the open load detection must be performed on the output pin of the output stage itself. In the smart ignition module example, the output pin of the control unit driving the input of the smart ignition module would need to be in a tristate mode for the detection, wherein the control input of the switching device used at the input of the smart ignition module would be uncontrolled, which is not allowed for safety systems in automotive applications such as smart ignition modules. Thus, in conventional systems in these instances a high voltage feedback pin is needed to meet the requirements for open load detection with push-pull output stages. For input stages to be controlled by a signal from an output stage of a central control unit, the input stage can incorporate a passive pull-down, and the open load detection is possible without the feedback pin, but at the cost of switch-off time or high power consumption due to the low-ohmic external resistor used to provide the passive pull-down at the input of the module to be controlled.

Figure 2:
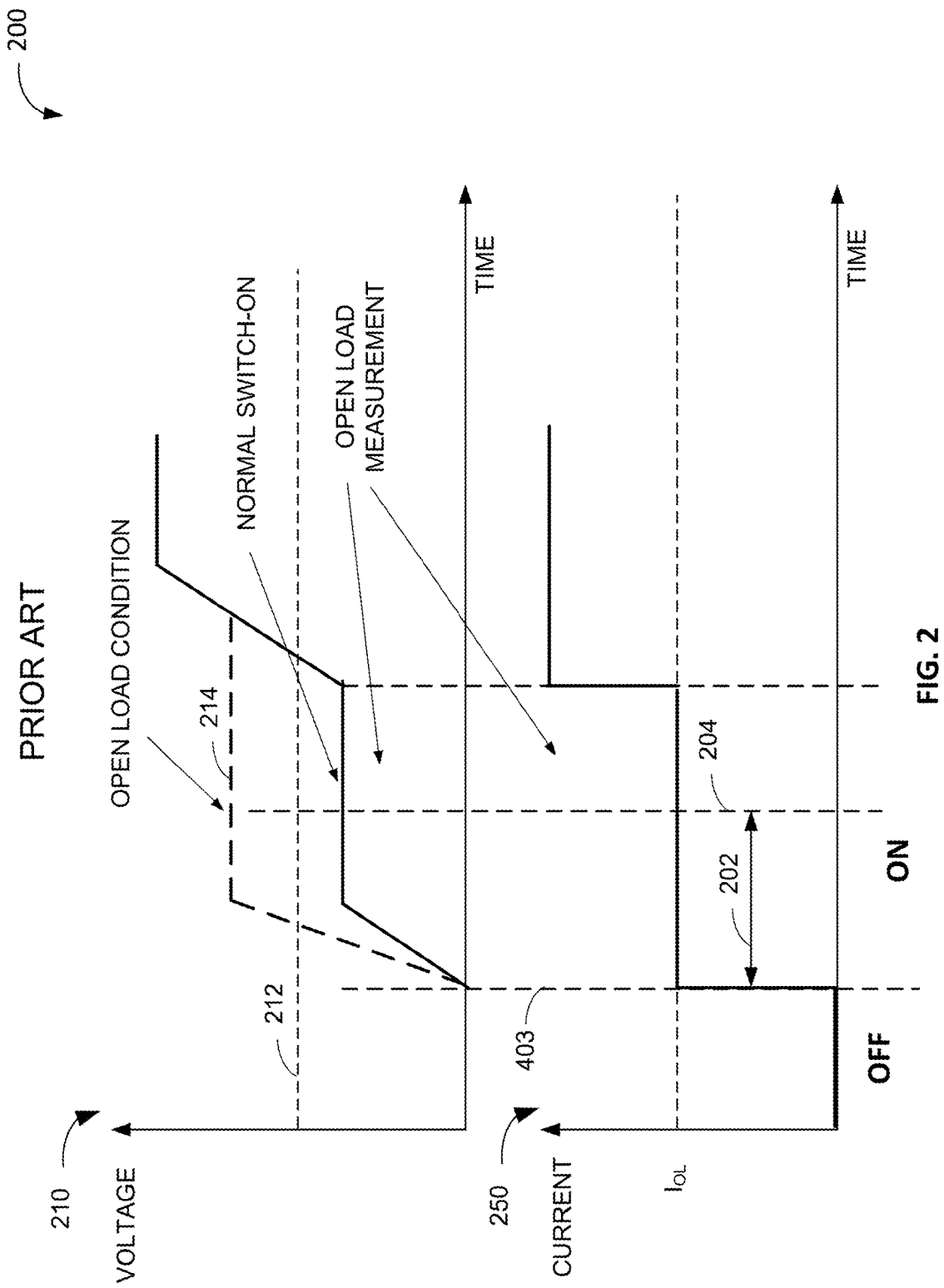
FIG. 2 illustrates graphical diagrams of various signals associated with conventional open load detection techniques.

FIG. 2 illustrates graphical diagrams 210 and 250 of various signals associated with conventional open load detection techniques. Diagram 210 illustrated voltage signals relative to time, and diagram 250 illustrates a pull-up current relative to time. For open load detection in instances where a passive pull-down at the input is utilized, during the time the input is being transitioned from an "OFF" state to an "ON" state by a signal provided by an output stage of the central control unit, a weak pull-up current is applied for a defined (short) detection time at the beginning of the switch-on phase. This time period is illustrated as time period 202 in FIG. 2. The detection of the open load condition is done at the end of the detection time, illustrated at time 204 in FIG. 2. An open load condition is detected if at the end of the detection time when the output voltage 210 is above the open-load threshold voltage 212, as illustrated by voltage level 214 in FIG. 2. The weak pull-up current needs to be chosen in a way that the output voltage $I_{OL}$*Rload is below the open-load threshold voltage ($I_{OL}$ maximum open load current, Rload is the maximum pull-down resistor at the input pin). The disadvantages of this technique for open load detection include that the "ON" level during the open load detection is dependent on the pullup current and the external resistor, which can lead to a weak switch on of the input, or no switch on of the IGBT device at the input. In addition, the open load detection is not being performed during the entire switch on time, but only at the end of the detection time.

FIG. 1 illustrates a block diagram 100 of an example Control Unit (CU) 110 including one or more open load detection circuits in accordance with one or more example methods, devices, and systems described in the present disclosure. In various examples, CU 110 is an Engine Control Module (ECM) used in an automotive application, although examples of Control Unit 110 are not limited to any particular type of control unit, and are not limited to any particular application of a control unit. As illustrated in FIG. 1, CU 110 includes one or more devices or circuits including a processor 112, a memory 114, an input processing circuit 116, an interface 118, and an output control circuit 120. As illustrated, processor 112, memory 114, input processing circuit 116, interface 118, and output control circuit 120 are communicatively coupled through bus 115, wherein bus 115 allows any of processor 112, memory 114, input processing circuit 116, interface 118, and output control circuit 120 to communicate with each other, including inputting and outputting data and other communication signals between these devices and circuits using bus 115. In addition, interface 118 is communicatively coupled to bus 119, wherein bus 119 is coupled to one or more devices (not shown in FIG. 1) that are external to CU 110, and wherein interface 118 is configured to allow CU 110 to communicate with the one or more devices that are external to CU 110 through bus 119.

In various examples, bus 119 is a standard bus, such as a Controller Area Networking (CAN) bus, or a High Speed CAN (H-S CAN) bus, but examples of bus 119 are not limited to any particular type of bus, and interface 118 is not limited to any particular type of protocol for use in providing and receiving communications over bus 119.

As illustrated, block diagram 100 includes one or more input devices 130, including sensor 132 and module 134. Sensor 132 is not limited to any particular type of sensor, and is illustrative of any type of sensor that is configurable to be coupled to CU 110 through input processing circuit 116, and provide input signals to CU 110. Examples of sensors include temperature sensors, pressure sensors, accelerometers, light sensors, and encoders coupled to motors, but again, sensor 132 is not limited to any particular type of sensor. Similarly, module 134 is not limited to any particular type of module, and is illustrative of any type of module that is configurable to be coupled to CU 110 through input processing circuit 116 and to provide input signals to CU 110.

As illustrated, block diagram 110 includes one or more output devices 140, including device 142, module 144, and load 146. Device 142 is not limited to any particular type of device, and is illustrative of any type of device that is configurable to be coupled to output control circuit 120 of CU 110, and to receive an output signal from circuit output 122 of output control circuit 120. In various examples, circuit output 122 is operable to provide an ON/OFF signal to device 142 in order to either turn device 142 to an "ON" state or to turn device 142 to an "OFF" state. In various examples, device 142 is a semiconductor device, such as a bipolar transistor, or a Metal Oxide Field Effect Transistor (MOSFET) device, that is operable to be switched on or off by the output signal provided by circuit output 122. Module 144 is not limited to any particular type of module, and is illustrative of any type of module that is configurable to be coupled to output control circuit 120 of CU 110, and to receive an output signal from circuit output 124 of output control circuit 120. In various examples, module 144 is a smart ignition module used in an automotive application, but module 144 is not limited to any particular type of module. In various examples, circuit output 124 is operable to provide an ON/OFF signal to module 144 in order to either turn module 144 to an "ON" state, or to turn module 144 to an "OFF" state. In various examples, module 144 also provides an input signal back to CU 110, as is illustrated for example by module 134.

Load 146 is not limited to any particular type of load, and is illustrative of any type of load that is configurable to be coupled to output control circuit 120 of CU 110, and to receive an output signal from circuit output 126 of output control circuit 120. In various examples, illustrative load 146 comprises a resistive load. In various examples, illustrative load 146 comprises resistive-capacitive load. In various examples, illustrative load 146 includes an inductive load, which in various examples incudes an associated capacitive load element. Examples of loads include indicator lamps and motors, although load 146 is not limited to an indicator lamp or to a motor. In various examples, circuit output 126 is operable to provide an ON/OFF signal to load 146 in order to either turn load 146 to an "ON" state, or to turn load 146 to an "OFF" state. In various examples, circuit output 126 is configured to provide, from circuit output 126, the electrical power needed to drive load 146, and thus can turn load 146 on or off by providing the drive power or by not providing the drive power, respectively, to load 146. In various examples, load 146 also provides an input signal back to CU 110 as is illustrated for example by sensor 132, wherein sensor 132 is part of or is coupled to load 146, for example, optically coupled, electrically coupled, or mechanically coupled, and provides feedback to CU 110 regarding the operation of load 146. By way of illustration, load 146 can comprise a motor, for example a stepper motor, and wherein load 146 also includes an encoder operable to provide feedback (sensor 132) to CU 110 regarding the rotational status of the stepper motor, as would be understood by one of skill in the art. In various examples, one or more of circuit outputs 122, 124, 126 are configured to provide open load detection regarding any open load condition(s) that exist relative to the connections between circuit outputs 122, 124, and 126 and device 142, module 144, and load 146 respectively, according to the methods, devices, and systems disclosed herein.

In various examples, processor 112 includes one or more microprocessors, and is configured to store programs, receive signals and data, to process these received signals and data, and to provide output signals and to output data based on the stored programs. In various examples, processor retrieves and stores data in memory 114. In various examples, various signals, including programs, are received by interface 118 over bus 119, and stored in memory 114, or processed by processor 112, or both processed by processor 112 and stored in memory 114. In various examples, input signals are received from one or more input devices 130 through input processing circuit 116, and are processed by processor 112. In various examples, input signals received through input processing circuit 116 are used in conjunction with one or more programs by processor 112 to generate output signals provided to output control circuit 120. These output signals provided to output control circuit 120 are configured to control the operation of one or more of devices 142, module 144, and load 146.

In various examples, output control circuit 120 is operable to provide output signals to one or more output devices 140 based on the output signals provided to output control circuit 120 by processor 112. In various examples, output control circuit 120 includes open load detection circuitry for one or more of circuit outputs 122, 124, and 126. In various examples, output control circuit 120 is configured to provide an alarm signal when an open load condition is detected by output control circuit 120. In various examples, detection of an open load condition includes generating an alarm signal, and providing the alarm signal as an output from output control circuit 120. In various examples, the alarm signal is provided to processor 112 for further processing, which in various examples includes providing additional signals to output control circuit 120 regarding instructions related to changes to one or more output signals provided at circuit outputs 122, 124, and 126. In various examples, in response to an alarm signal indicating detection of an open load condition on one or more of circuit outputs 122, 124, and 126, processor 112 is configured to provide output control circuit 120 with control signals that cause output control circuit 120 to modify an output signal provided at one or more of circuit outputs 122, 124, and 126. In various examples, the control signal provided to output control circuit 120 by processor 112 in response to an alarm signal includes a control signal to cause output control circuit 120 to provide a signal that would turn off one or more of circuit outputs 122, 124, 126 where the circuit output 122, 124, or 126 have detected an open load condition on the connection between the circuit output 122, 124, and 126 and the device 142, module 144, or load 146 coupled, respectively, relative to one or more of these circuit outputs. In various examples, the particular one of circuit outputs 122, 124 and 126 where an open load condition was detected is turned off by the control signal sent from processor 112 to the output control circuit. In various examples, the particular one of the circuit outputs 122, 124 and 126 where the open load condition was detected is turned off, along with one or more other outputs of circuit outputs 122, 124, and 126 in response to the control signal sent from processor 112 in response to the alarm signal indicative that an open load condition was detected.

In various examples, CU 110 is configured to provide an output signal over bus 119, through interface 118, to other devices external to CU 110 when an open circuit condition is detected. In various examples, memory 114 is configured to store information related to an occurrence of detection of an open load condition, including but not limited to storing information related to which of the circuit output(s) of output control circuit 120 had an open load condition that was detected. In various examples, date and time information related to when the open load condition was detected can be stored in memory 114. In various examples, information regarding the state a circuit output was in at the time the detection of an open load condition occurred can be stored in memory 114. For example, the open load condition can be detected during a transition phase from an "OFF" state to an "ON" state, or during a phase following the transition from the "OFF" state to the "ON" state while the circuit output was maintaining a signal level indicative of the "ON" state for the device, module, or load intended to be coupled to the circuit output where the open load condition occurred. In addition, the open load condition can be detected during a transition phase from an "ON" state to the "OFF" state, or during a phase following the transition from the "ON" state to the "OFF" state while the circuit output was maintaining a signal level indicative of the "OFF" state for the device, module, or load intended to be coupled to the circuit output where the open load condition occurred.

Figure 3:
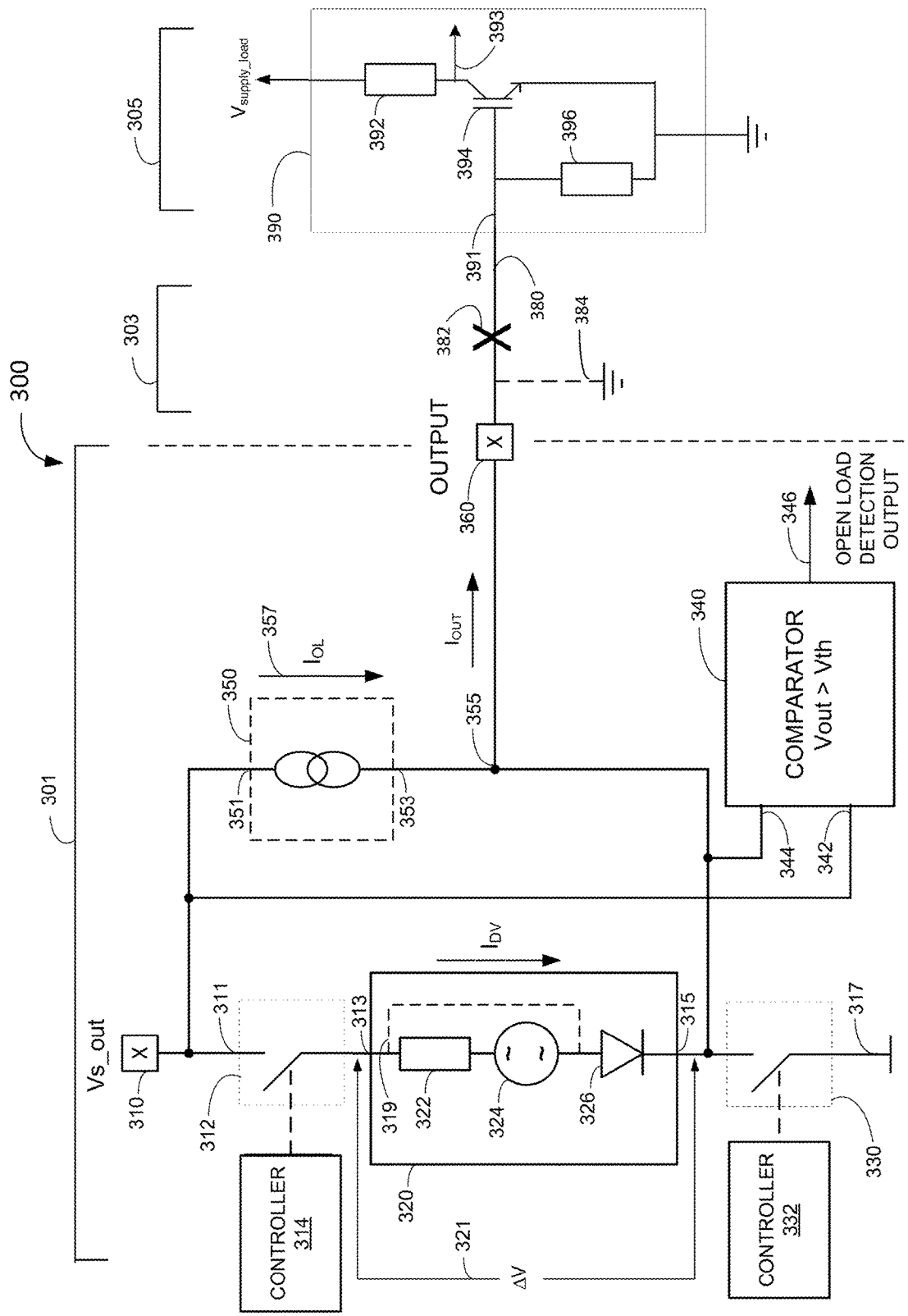
FIG. 3 illustrates a schematic diagram of an open load detection circuit in accordance with one or more example techniques described in the present disclosure.

FIG. 3 illustrates a schematic diagram 300 comprising an open load detection circuit 301 in accordance with one or more example techniques described in the present disclosure. Basic principles of the open load detection circuit 301 include a circuit output that is switched on low ohmic to a defined output voltage level Vout,O that is equal to a supply voltage level Vs_out less a voltage drop ΔV. An open load detection pull-up current $I_{OL}$ is applied during the entire switch-on time and the entire on-time when the circuit output is being transitioned from providing an "OFF" state output signal to providing an "ON" state output signal and during the whole time of being in "ON" state. In the case that an open load condition occurs relative to the circuit output during this transition time or during the "ON" time, the pull-up current $I_{OL}$ pulls the circuit output to a voltage level above the voltage level of Vout,O, and further above an open load detection threshold voltage level. The supply voltage Vs_out is designed to allow the circuit output to be pulled to a voltage level above Vout,O. A comparator detects output voltages above Vout,O that are also above the detection threshold voltage level. After a very brief initial charging period, the detection for an open load condition is performed during the remaining transition phase and during the whole "ON" state. In various examples, the detection threshold voltage level is defined as a voltage level between the Vs_out and Vs_out minus ΔV, for example Vs_out minus ΔV/2, wherein Vs_out is the output voltage provided by the voltage supply coupled to open load detection circuit 301, and ΔV is the voltage drop level subtracted from Vs_out in order to provide the output voltage Vout,O at the circuit output, Vout,O being provided at the end of the transition from the "OFF" state to the "ON" state and when no open load conditions exist at the circuit output. In various examples, the open load detection pull-up current $I_{OL}$ is also applied during the time following the transition phase from the "OFF" to the "ON" state, and remains applied while the open load detection circuit 301 continues to provide the "ON" state output signal. Thus, in various examples, after the very brief initial charging period when transitioning from the "OFF" to the "ON" state, open load detection circuit 301 provides detection of open load conditions for the remainder of the transition period, and continues to provide detection of open load conditions throughout the time open load detection circuit 301 remains in the "ON" state.

In various examples, open load detection circuit 301 includes a delta voltage circuit ($\Delta V$) 320 and a current source 350 coupled to a circuit output 360. As illustrated, a first node 313 of delta voltage circuit 320 is coupled to a voltage supply (Vs_out) 310 through a first switch 312, and a second node 315 of delta voltage circuit 320 is coupled to ground 317 through a second switch 330. As illustrated, first switch 312 is coupled to controller 314, wherein controller 314 is operable to control switch 312 so that switch 312 connects or disconnects first node 313 to or from voltage supply 310. First switch 312 is not limited to any particular type of switch, and in various examples is a semiconductor device, such as a Solid State Relay (SSR), a bipolar transistor, a Metal Oxide Field Effect Transistor (MOSFET), a Complementary Metal-Oxide Semiconductor (CMOS) device, but is not limited to one of these devices or to any particular type of device, and can be any other type of device that can operate as a switching device as described and shown herein in the open load detection circuit 301. Controller circuit 314 can be any device that is operable to be controlled by open load detection circuit 301 to provide a control signal operable to control the state of switch 312. Similarly, a second switch 330 is coupled to controller circuit 332, wherein controller 332 is operable to control switch 330 so that switch 330 connects or disconnects second node 315 to or from ground 317. Second switch 330 is not limited to any particular type of switch, and in various examples is a semiconductor device, such as a SSR, a bipolar transistor, a MOSFET device, a CMOS device, but is not limited to one of these devices or any particular type of device, and can be any other type of device that can operate as a switching device as described and shown herein in the open load detection circuit 301. Controller circuit 332 can be any circuit that is operable to be controlled by open load detection circuit 301 to provide a control signal operable to control the state of second switch 330. Further, in various examples first switch 312 and second switch 330 are a same type of device, although examples of open load detection circuit 301 are not limited to having first switch 312 and second switch 330 comprising a same type device.

In various examples, delta voltage circuit 320 includes a series connected string of devices connected as follows. A resistive load 322 comprises a first lead coupled to first node 313 of delta voltage circuit 320, and a second lead coupled to a first lead of voltage source 324. Voltage source 324 includes a second terminal coupled to an anode of diode 326. Diode 326 includes a cathode coupled to the second node 315 of the delta voltage circuit 320. Examples of delta voltage circuit 320 are not limited to including resistive load 322, voltage source 324, and diode 326, and in various examples include a different set of devices, or a different arrangement of devices, or both a different set of devices and a different arrangement of devices from that which is illustrated in FIG. 3. For example, in various examples, delta voltage circuit 320 incudes only diode 326, wherein the anode of diode 326 is coupled directly to first node 313 of delta voltage circuit 320, and the cathode of diode 326 is coupled directly to second node 315 of delta voltage circuit 320, as represented by dashed line 319 in FIG. 3. In various examples, any device or combination of devices can be included in delta voltage circuit 320 that are operable to provide a voltage differential, represented by voltage drop ($\Delta V$) 321, between first node 313 and second node 315 of delta voltage circuit 320 when a current is flowing through delta voltage circuit 320.

In various examples, current source 350 incudes a first input 351 coupled to voltage supply 310 at node 311, and includes a current output 353 coupled to circuit output 360 through node 355. Node 355 is also coupled to the second node 315 of delta voltage circuit 320. In various examples, current source 350 is a low drop current source. A low drop current source in various examples is a current source that is operable to provide a current output without a large voltage drop across the input and output terminals of the current source, and is operable to pull the voltage level of the output of the current source up to a voltage level at or near the voltage level provided at the input to the current source and that is a minimum level above the threshold level for detection of an open load condition, while not pulling out the voltage at the output of the current source when the nominal current is being sourced from current source 350. In various examples, current source 350 is a low drop current source operable to source a current ($I_{OL}$) 357 to node 355 from current output 353 when node 355 provides a path for sinking a nominal level of current from current source 350, and wherein current source 350 is operable to pull the voltage level present at current output 353 up to a voltage level at or near the voltage level present at the first input 351 of current source 350 when node 355 is not providing a path for sinking current provided from current source 350, or in instances where only a small level of current, such as a leakage current, is being sunk by a current path provided by node 355. In various examples, node 355 provides a path to sink current from current source 350 when second switch 330 is closed, thus coupling node 355 to ground. In various examples, node 355 provides a path to sink current from current source 350 when a load, such as load 390 as illustrated in FIG. 3, is coupled to output 360, and load 390 is operable to sink current provided to output 360. In various examples, delta voltage circuit 320 is not operable to sink current provided to node 355 due to one or more devices included in delta voltage circuit 320 acting as a current block to current entering second node 315 of delta voltage circuit 320. By way of illustration, diode 326 is operable to block current from entering delta voltage circuit 320 through second node 315, but examples of devices operable to block current entering second lead 315 are not limited to a diode.

In various examples, when node 355 is not providing a path to sink current from current source 350, or is only providing a current path operable to sink less than the nominal current flow level for current source 350, current source 350 is operable to pull the voltage level provided at current output 353 of current source 350 up to a voltage level that is at or near a voltage level provided at first input 351 of current source 350, but that is above the minimum level of the threshold for detection of an open load condition. In various examples, when node 355 is not providing a path to sink current that could be provided from current output 353 of current source 350, or is only providing the current path operable to sink less than to the nominal current flow level for current source 350, current source 350 is operable to pull the voltage level of current output 353 up to or nearly up to a voltage level provided at first lead 351 by voltage supply 310, and thus pull the voltage level of node 355 up to or nearly to the voltage level provided by voltage supply 310, that is a minimum level above the threshold for detection of an open load condition.

In various examples, open load detection circuit 301 includes a comparator 340 having a first input 342 coupled to voltage source 310 at node 311, a second input 344 coupled to node 355, and an open load detection output 346. In various examples, comparator 340 is configured to determine a voltage differential level provided at node 355, and thus also at circuit output 360, with a voltage level provided by voltage supply 310, compare the voltage differential level to a threshold voltage level, and provide an output signal representative of detection of an open load condition, as further described herein. In various examples, comparator 340 is operable to receive a voltage level at second input 344 representative of the voltage level being provided at circuit output 360, compare the received voltage level to an absolute threshold voltage level, and if the received voltage level exceeds the absolute threshold voltage level, provide an output signal representative of detection of an open load condition as further described herein. In various examples, the comparator provides a signal to open load detection circuit 301 indicating that an open circuit condition has been detected relative to circuit output 360. In various examples, open load detection circuit 301 is operable to turn off comparator 340 during certain times, and to activate comparator 340 during certain times. In various examples, open load detection circuit 301 is operable to turn comparator 340 off when open load detection circuit 301 is providing a signal representative of an "OFF" state at circuit output 360, and open load detection is not required during the "OFF" state indication. In various examples, open load detection circuit 301 is operable to turn comparator 340 off so that regardless of the voltage differential provided between first input 342 and second input 344 of comparator 340, comparator 340 does noes not provide an open load detection signal at open load detection output 346. In various examples, open load detection circuit 301 is operable to activate comparator 340 at a time prior to a time when open load detection circuit 301 is going to transition the circuit output 360 from an "OFF" state to a state indicative of an "ON" state for a load operable to be coupled to circuit output 360.

As illustrated, circuit output 360 of open load detection circuit 301 is operable to be coupled to load 305 through coupling 303. Load 305 is not limited to any particular type of load, and as illustrated in FIG. 3, load 305 is one example of a load that circuit output 360 is operable to be coupled to through coupling 303. In various examples, illustrative load 390 can be any of the loads such as loads 142, 144, or 146 described and illustrated with respect to output devices 140 of FIG. 1. As illustrated in FIG. 3 load 305 includes a device 390 having an input 391 coupled to a conductor 380, a first resistive load 392 coupling a switching device 394 to a supply voltage Vsupply_load, and a second resistive load 396 coupling input 391 to ground. As illustrated, switching device 394 is a semiconductor device having a gate coupled to input 391, and an emitter (or a source in an example using a MOSFET type semiconductor for switching device 394) coupled to ground. The collector (or a drain in an example using a MOSFET type semiconductor for switching device 394) is coupled to a switched output 393. In various examples, switching device 394 is an Insulated Gate Bipolar Transistor (IGBT).

As would be understood by one of ordinary skill in the art, switched output 393 can be controlled by switching device 394 operating as a switch by providing a voltage output indicative of an "ON" state or an "OFF" state based on a voltage level received at input 391. For example, when a voltage level at or near ground is provided at input 391 of device 390 by output 360, or when output 360 is switched to a tri-state mode, the resistive load 396 is able to pull the voltage level provided at the gate of switching device 394 to ground, thereby biasing switching device 394 to switch off. As such, the switched output 393 is pulled up through resistive load 392 to the voltage level provided by supply voltage Vsupply_load, representative of a first state for example "OFF" for switched output 393. This arrangement is sometimes referred to as a "passive pull-down" because resistive load 396 is operable to pull the voltage level at input 391 to ground unless a voltage is applied to input 391 from another source, such as circuit output 360. If a voltage level that is being provided at input 391 of device 390 is now raised to a voltage level that is adequate to, when provided to that gate of switching device 394, bias switching device 394 to a point of saturation, switching device 394 in effect operates as a closed switch, coupling switched output 393 to ground, and thereby provided a voltage level representative of a second state, for example an "ON" state, that is different from the first state, at switched output 393. Therefore, by providing different voltage levels at input 391 of device 390, device 390 can be switched between an "OFF" state and an "ON" state through control of the voltage level provided at input 391.

As illustrated in FIG. 3, circuit output 360 of open load detection circuit 301 is operable to be coupled to input 391 of device 390 through conductor 380. Conductor 380 is not limited to any particular type of conductor, and in various examples is a wire comprising metal or any other conductive material. In various examples, conductor 380 is a single conductor included in a multiple conductor device such as a cable. As illustrated, under the intended conditions conductor 380 couples circuit output 360 of open load detection circuit 301 to input 391 of device 390, and the voltage levels provided at circuit output 360 are transferred by conductor 380 to input 391, thus controlling the state of device 390 relative to an "OFF" or "ON" state for device 390. In various examples, if a near zero voltage level is provided at circuit output 360, representative of an "OFF" state for device 390, or output 360 is in tri-stat mode and thus the voltage level at input 391 is pulled to ground by resistive load 396, switching device 394 will act as an open switch between switched output 393 and ground, allowing switched output 393 to be pulled up to the voltage level of voltage supply Vsupply_load. In various examples, if a voltage level at circuit output 360 is raised to an adequate positive voltage level representative of an "ON" state for device 390, switching device 394 will act as a closed switch, coupling the switched output of device 390 to ground, and changing the status of switched output 393 from an "OFF" state to an "ON" state. In various examples, an adequate positive voltage level is provided on input 391 when the voltage level provided by circuit output 360, and thus to input 391 of device 390, is high enough to bias the gate of switching device 394 so as to saturate switching device 394, as would be understood by one of ordinary skill in the art. Under these conditions, device 390 with pulldown resistor 396 is also operable to sink current provided to circuit output 360 by open load detection circuit 301.

As illustrated, an open load condition, represented by open circuit condition "X" 382, can occur in conductor 380, and interrupt the connection between circuit output 360 of open load detection circuit 301 and the input 391 of device 390. As noted above, an "open load condition" can also be a high ohmic condition at circuit output 360. When an open circuit condition represented by open circuit condition 382 occurs, the voltage level being provided at output 360 is no longer operable to control the state of device 390. In various examples, open load detection circuit 301 is operable to detect the occurrence of the open load condition, and provide an output signal at open load detection output 346 of comparator 340 to the open load detection circuit 301, indicating that the open load circuit condition is occurring. In various examples, open load detection output 346 is operable to provide an output signal (failure signal) indicating that an open load condition has occurred during the entire time open load detection circuit 301 is transitioning from outputting an "OFF" state indication at circuit output 360 until the output signal level indicative of the "ON" state has been fully established at circuit output 360. In various examples, open load detection output 346 is operable to provide an output signal indicating that an open load condition has occurred during a time after the output signal level indicative of the "ON" state has been fully established at circuit output 360, and the output level indicative of the "ON" state remains provided at circuit output 360 by open load detection circuit 301. Examples of open load conditions include but are not limited to a break in conductor 380. Other open load conditions can include a disconnection of the coupling used to connect conductor 380 to circuit output 360. Other open load conditions can include a disconnection of the coupling used to connect conductor 380 to input 391 of device 390. Examples of open load conditions are not limited to these examples, and other conditions that cause circuit output 360 of open load detection circuit 301 to be disconnected from input 391 of device 390 are contemplated to comprise an open load condition.

In operation, open load detection circuit 301 is operable to provide a first output state representative of an "OFF" state at circuit output 360 in various examples as follows. Open load detection circuit 301 operates controller 314 to open or to leave open first switch 312, and operates controller 332 to close or leave closed second switch 330. When first switch 312 is open, delta voltage circuit 320 is disconnected from voltage supply 310, and no current is provided from delta voltage circuit 320 at second node 315. In addition, because second switch 330 is closed, circuit output 360 is coupled to ground 317 through node 355, and provides a ground level voltage output to circuit output 360. Assuming no open load conditions exist, this ground level voltage output is provided as a switch voltage through conductor 380 to input 391 of device 390, causing device 390 to be in an "OFF" state as described above. When open load detection circuit 301 is configured in the "OFF" condition, in various examples, current source 350 can be turned off so as to not have any influence on the voltage level provided at node 355 and circuit output 360. In the alternative, current source 350 can be left on during the "OFF" state condition, but because node 355 is coupled to ground through second switch 330, the small current from current source 350 will flow from current source 350 to ground, thus preventing current source 350 from pulling the voltage level provided at node 355 up from the ground level voltage, as described above. As also described above, current source 350 is operable to regulate the current flow provided at current output 353 to ground under these conditions so that only a small current flow is provided by current output 353. In various examples, current output provided by current source 355 is a nominal current when activated during the "OFF" state condition for open load detection circuit 301. In various examples, this nominal current flow is in a single digit percentage range of the load current, but above a leaking current level. In various examples, if a load current is 10 milliamps, the current provided by current source 350 when activated during the "OFF" state condition is in a range of 100 μamps, which is approximately 1% of the 10 milliamp load current. In various examples, when open load detection circuit 301 is providing the "OFF" state condition, comparator 340 is turned off. In the alternative, comparator 340 remains active when open load detection circuit 301 is in the "OFF" state condition. However, because input 344 of comparator 342 is coupled to ground through second switch 330, and input 342 of comparator 340 is coupled to the voltage provided at voltage source 310, in various examples the voltage differential between input 342 and input 344 of comparator 340 is configured to be larger than the differential threshold value used by comparator 340 to detect an open load condition, as is further explained with respect to FIG. 4A and FIG. 4B, and thus open load detection output 346 will provide a signal level indicating that no open load condition exists at circuit output 360. In examples wherein comparator 340 uses an absolute threshold voltage level to determine if an open load condition exists at circuit output 360, a ground level voltage input at input 344 of comparator 340 will cause comparator to provide an output at open load detection output 346 indicative that no open load condition exists at circuit output 360.

In various examples, open load detection circuit 301 is operable to transition from providing an "OFF" state indication at circuit output 360 to providing an "ON" state indication at circuit output 360 as follows. Prior to beginning the transition from the "OFF" state indication to the "ON" state indication, open load detection circuit 301 is operable to turn on current source 350 if current source 350 is not already activated, and to turn on comparator 340 if comparator 340 is not already activated. Once both current source 350 and comparator 340 are activated, open load detection circuit 301 operates second controller 332 to open switch 330, and once switch 330 is open, operates first controller 314 to close switch 312. Opening second switch 332 disconnects node 355 and circuit output 360 from ground. Closing first switch 312 couples first node 313 of delta voltage circuit 320 to voltage supply 310. Assuming that no open load conditions exists at circuit output 360, node 355 and circuit output 360 provide a path for a flow of current from voltage source 310 through delta voltage circuit 320 to circuit output 360, the current flow conducted to device 390 through conductor 380, wherein the current is sunk by device 390. The delta voltage circuit 320 act as a voltage source providing a current flow to device 390. The current flow ($I_{DV}$) through delta voltage circuit 320 causes a voltage differential represented by voltage drop ($\Delta V$) 321 to be provided between first node 313 and second node 315 of delta voltage circuit 320. As a result, the voltage level provided at second node 315, and thus also at node 355 and circuit output 360, transitions from a ground level voltage to a voltage level less than the voltage level provided by voltage supply 310, but to a voltage level that is high enough to saturate switching device 394 of device 390, thus providing an "ON" voltage level at circuit output 360 indicative of an "ON" state for device 390.

During this transition from providing an "OFF" state indication to providing an "ON" state indication, and assuming no open load conditions exist relative to circuit output 360, current source 350 begins to provide a current flow ($I_{OL}$) from current output 353 to node 355, the current flow provided by current output 353 being provided to circuit output 360 and sunk by device 390, as described above with respect to the current provided by second lead 315 of delta voltage circuit 320. However, as current source 350 is configured as having a nominal output current $I_{OL}$, the level of current flow provided by current source 350 during this transition from an "OFF" state to an "ON" state is a level that prevents current source 350 from pulling the voltage level provided at node 355 up towards the voltage level provided to current source 350 at first input 351. As a result, the voltage level provided at node 355, and thus at circuit output 360, is dictated by the voltage level provided at second node 315 of delta voltage circuit 320, with delta voltage circuit 320 being able to source the current required to establish this voltage over the load resistor 396.

In various examples, during this transition from providing an "OFF" state indication to providing an "ON" state indication, comparator 340 monitors the voltage differential provided between input 342 and 344 of comparator 340. Under these conditions, input 342 is provided an input voltage level as provided by voltage source 310. Input 344, being coupled to node 355, will see a transition of voltage levels from a ground level voltage up to a voltage level representative of the voltage level provided at the second node 315 of delta voltage circuit 320. At the completion of the transition, a maximum voltage level Vout,O is provided at node 355, wherein Vout,O can be represented by a voltage level calculated using the formula:

$$V\text{out},O = V\text{supply\_voltage} - \Delta V$$

wherein Vsupply_voltage represents the voltage level provided by voltage supply 310, and $\Delta V$ represents the voltage drop $\Delta V$ 321 provided between first node 313 and second node 315 of delta voltage circuit 320 at the end of the transition period from the "OFF" state indication to the "ON" state indication for open load detection circuit 301. For this calculation it is assumed for simplicity that switch 314 is ideal and does not have a voltage drop. When the end of the transition state has been reached, and no open load conditions have occurred relative to circuit output 360, the maximum voltage level for Vout,O is provided at node 355 and circuit output 360. At the end of this transition phase the voltage level provided at circuit output 360 will reach the maximum voltage level for Vout,O. The current $I_{OUT}$ flowing out of output 360 is the sum of the current $I_{OL}$ provided by the current source 350 and current flow $I_{DV}$ through delta voltage circuit 320. In various examples, under these conditions, the difference voltage provided at input 342 and input 344 of comparator 340 is greater than a minimum value set as the threshold differential voltage value used by comparator 340 to detect an open load condition, and thus comparator 340 is operable provide a signal at open load detection output 346 indicating that no open load conditions exist at circuit output 360.

Once the end of the transition from "OFF" to "ON" state indication is reached, the current flow through delta voltage circuit 320 will reach a substantially steady and maximum value, thus causing the voltage Vout,O to be provided at node 355 and at circuit output 360. Under these condition, and assuming no open load conditions have occurred, device 390 should have been fully switched on, and comparator 340 is not providing an indication that an open load condition has been detected. Further, current source 350 remains activated, providing a nominal current flow $I_{OL}$ from current output 353 to node 355, but remains in a configuration that does not pull-up the voltage level provided at node 355 above the voltage level Vout,O provided by delta voltage circuit 320. In various examples, current source 350 and comparator 340 remain active continuously during the "ON" state indication and following the end of the transition from providing the "OFF" state indication to providing the "ON" state indication, and thus continue to monitor circuit output 360 for any occurrences of open load conditions at circuit output 360 during the time the ON state indication is being provided at circuit output 360. The voltage levels relative to circuit output 360 during the "OFF" state, during the transition from the "OFF" state to the "ON" state, and following the transition state during the steady state "ON" state, where no open load conditions exist, are illustrate in FIG. 4A and FIG. 4B, trace 422, further discussed below.

Referring again to FIG. 3, in various examples, open load detection circuit 301 is operable to transition from providing an "OFF" state indication at circuit output 360 to providing an "ON" state indication at circuit output 360 as follows. As described above, prior to beginning the transition from the "OFF" state indication to the "ON" state indication, open load detection circuit 301 is operable to turn on current source 350 if current source 350 is not already on, and to turn on comparator 340 if comparator 340 is not already on. Once both current source 350 and comparator 340 are activated, open load detection circuit 301 operates second controller 332 to open second switch 330, and once second switch 330 is open, operates first controller 314 to close first switch 312. Opening second switch 332 disconnects node 355 and circuit output 360 from ground. Closing first switch 312 couples first lead 313 of delta voltage circuit 320 to voltage source 310. Once the transition from the "OFF state indication to the "ON" state indication has been initiated, and an open load condition does exist, open load detection circuit 301 is operable to perform as follows. With first switch 312 closed and second switch 330 open, delta voltage circuit 320 is coupled to voltage source 310 though first node 313, and second node 315 is disconnected from ground. The delta voltage circuit 320 act as a voltage source providing any current flow to device 390 as a result of the voltage provided at node 315. First output 360 is pulled up to Vout,O with 350 providing current $I_{OL}$ and 320 providing current $I_{DV}$, where $I_{DV}$ is much larger than $I_{OL}$. With an open load condition at the output the voltage will rise above Vout,O. At the level of Vout,O, delta voltage circuit 320 stops sourcing current and only the current $I_{OL}$ will source current, which will pull-up output 360 further above Vout,O and also above the open load threshold voltage level. Once current source 350 has pulled the voltage level provided at node 355 to a voltage level that, based on the difference between the voltage level at node 342 and the voltage level provided by voltage source 350 is less than the threshold differential voltage level, or exceeds an open load threshold voltage level, comparator 340 is operable to provide an output at open load detection output 346 indicative of an open load condition at circuit output 360.

In this manner, open load detection circuit 301 is operable to provide an indication of an open load condition during the entire time open load detection circuit 301 is transitioning from providing an "OFF" state indication to providing an "ON" state indication at circuit output 360. In various examples, if no open load conditions occur during this transition phase, current source 350 and comparator 340 can remain activated, and provide an indication of an open load condition if an open load condition occurs during the time the open load detection circuit 301 continues to provide the "ON" state indication at circuit output 360. The voltage levels relative to circuit output 360 during the "OFF" state, during the transition from the "OFF" state to the "ON" state, and following the transition state during the steady state "ON" state, where an open load condition exists, are illustrate in FIG. 4A and FIG. 4B, as further discussed below. In various examples, open load detection circuit 301 is operable to generate an alarm signal when an open load detection signal indicative of an open load condition is generated at open load detection output 346 of comparator 340. In various examples, open load detection circuit 301 is operable to transition from providing an "ON" state indication to an "OFF state indication, as described above, when an open load condition is detected at circuit output 360.

Assuming that no open load condition exists during this transition phase, node 355 and circuit output 360 provide a path for flow of current from voltage source 310 through current source 350 and delta voltage circuit 320 to circuit output 360, the current flow ($I_{OUT}$) conducted to device 390 through conductor 380 and being sunk by device 390. As described, delta voltage circuit 320 is operable to provide a voltage drop $\Delta V$ 321 between first node 313 and second node 315 of delta voltage circuit 320. As a result, the voltage level provided at second node 315, and thus also at node 355 and circuit output 360, transitions from a ground level voltage to a voltage level less than the voltage level provided by voltage source 310, but to a voltage level that is high enough to saturate switching device 394 of device 390, thus providing an "ON" voltage level at circuit output 360 indicative of an "ON" state for device 390. In various examples, a short circuit condition, represented by "ground" 384, can occur along conductor 380, or can occur simply by a short circuit to circuit output 360. In various examples, both voltage supply 310 and current source 350 are operable to limit current flow, or to stop current flow altogether to circuit output 360 in the event of a short circuit condition occurring relative to circuit output 360.

Advantages of the open load detection circuit 301 include that open load detection is performed during the entire transition time between the "OFF" state indication and the "ON" state indication for the circuit output. Further, open load detection can continue to be performed during the 'ON' state indication after the transition to the "ON" state indication has been completed. The open load detection does not influence the switching behavior of the circuit output during the transition, wherein the open load detection circuit does not for example increase the duration of the transition time or delay the time needed for the circuit output to provide the steady state (Vout,O) voltage level to the circuit output. Detection time when an open load condition occurs is short due to the small voltage difference between Vs_out minus $\Delta V$ and the detection threshold voltage, in various examples 10 millivolts to 1 volt, and in various examples can be less than 10 millivolts, wherein conventional open load detection techniques require a tristate range of voltages. Open detection parameters, such as maximum load resistance, minimum open load resistance, and maximum leakage current are easily definable. For example, load resistances can range from very low, e.g. single digit ohm range, up to 20 Kohms. Examples of resistances that would be considered to be indicative of an "open load condition" and include resistances having a value two times or more the expected resistance value for a load intended to be coupled to the output of an open load detection circuit, such as circuit output 260 of open load detection circuit 301. Examples of leakages current that could be indicative of an "open load condition" could be in a range of μamps, and in other examples in a range of milliapmpers. In addition, no additional switching phase needs to be generated and controlled by the processor or microcontroller that controls the open load detection module in order to provide open load detection, thus reducing the work load on the processor or microcontroller. In addition, no external device(s) are required, including no feedback pin or feedback conductors in order to provide open load detection relative to circuit output 360 of open load detection circuit 301. Further, no tristate phase is required during which the load would be uncontrolled in order to provide the open load detection using open load detection circuit 301, and thus open load detection circuit 301 can be use in applications where the tristate phase is not allowed.

Figure 4A:
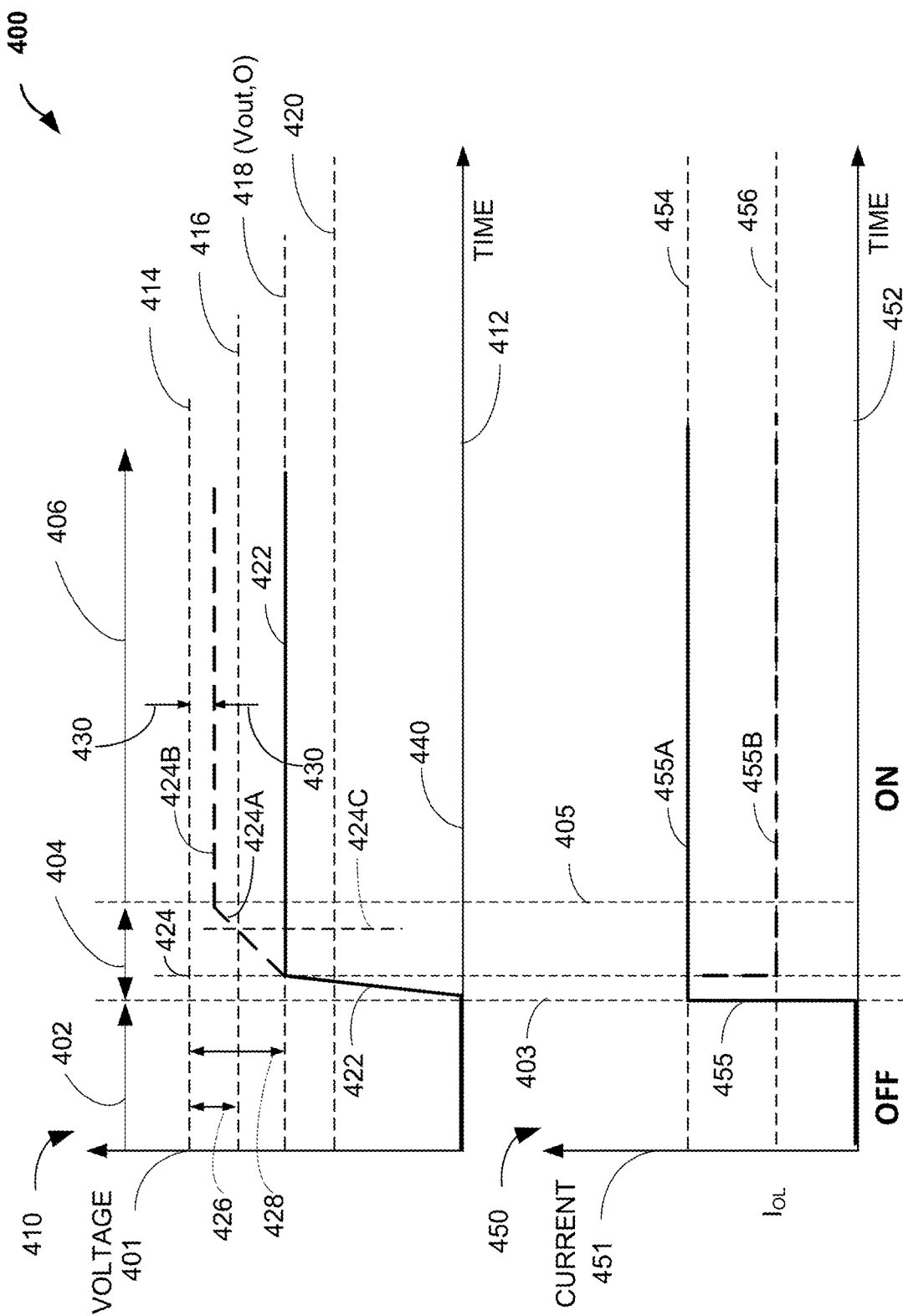
FIGS. 4A and 4B illustrate graphical representations of various signals in accordance with one or more aspects of the present disclosure.

FIG. 4A illustrates a graphical representation 400 of various signal levels in accordance with one or more aspects of the present disclosure. Graphical representation 400 includes graph 410 having voltage axis 401 and a time axis 412. Graph 410 includes a graphical representation of various voltage levels 414, 416, 418, 420, and 440, and various time periods 402, 404, and 406. As illustrated in FIG. 4A, graph 410 includes various voltage traces 422, 424A, and 424B representative of various voltage levels that could be provided, in various examples, by circuit output 360 of open load detection circuit 301. In various examples, voltage level 414 represents the voltage level of voltage supply 310, voltage level 416 represents a threshold voltage level used to determine if an open load condition exists at circuit output 360, voltage level 418 represents a typical voltage level Vout,O provided when open load detection circuit 360 is providing an "ON" state voltage level indication at circuit output 360 when no open load conditions exist, and voltage level 420 represents a minimum voltage level that must be provided at circuit output 360 in order to provide an adequate "ON" signal to switch on device 390 coupled to circuit output 360. As illustrated in FIG. 4A, graph 450 includes a current axis 451 and a time axis 452. A set of current levels 452, 454, and 456 representative of current $I_{OUT}$ provided by open load detection circuit 301 at output 360 in FIG. 3 is illustrated over time periods 402, 404, and 406 by current trace 455. As illustrated in FIG. 4A, graph 450 includes various current traces 455, 455A, and 455B representative of various current levels that could be provided, in various examples, by circuit output 360 of open load detection circuit 301. In various examples, current level 454 represents the current level of current $I_{OUT}$ at output 360, which represents the sum of $I_{DV}$ and $I_{OL}$ when no open load condition exists. Current level 456 represents the current level of current $I_{OL}$ provided by current source 356.

During time period 402, open load detection circuit 301 is providing an "OFF" state indication at circuit output 360, represented by voltage trace 422 being at voltage level 440 representing zero (ground) level voltage. During time period 404, indicated as beginning at time 403 and ending at time 405, open load detection circuit 301 transitions from providing an "OFF" level voltage indication at circuit output 360 to providing an "ON" level voltage indication at circuit output 360. At the start of time period 404, current source 350 and delta voltage circuit 320 are operable to provide a current above $I_{OUT}$, as repressed by graph 450, to circuit output 360, represented by the transition from no current output to the current output represented by current trace 455 rising from a zero level 452 to level 454 in graph 450. Assuming no open load conditions exist relative to circuit output 360, voltage trace 422 rises to a maximum voltage level 418 at time point 424, and remains at that voltage level as long a no open load conditions occur relative to circuit output 360. In addition, if no open load conditions exist relative to circuit output 360, current flow $I_{OUT}$ will remain at the current level 454 as shown by the solid line 455A. As long as no open load conditions occur during time period 406, wherein time period 406 represents a time during which open load detection circuit 301 remain in the "ON" state incitation phase, voltage trace 422 will remain at voltage level 418. As illustrated in FIG. 4A, voltage trace 422 during time periods 402, 404 and 406 is below the voltage level 416 representing a threshold voltage level used to determine if an open load condition exists. In various examples, under such conditions, comparator 340 uses voltage level 416 as an absolute threshold voltage level for determining if an open load condition exists, and when comparator 340 receives voltage level 422 at input 344, because this voltage level is less than the threshold, voltage level 416, comparator 340 determines that no open load conditions exist relative to circuit output 360. In the alternative, in various examples comparator 340 is operable to compare a voltage differential 428 of voltage trace 422 relative to the voltage supply level 414, and determine if the voltage different 428 is greater than a threshold voltage differential 426 (representative of the voltage different between voltage level 414 and threshold voltage level 416). If voltage differential 428 is greater than voltage differential 426, comparator is operable to again determine that no open load conditions exist relative to circuit output 360.

In the alternative, at time 403 when open load detection circuit begins the transition phase represented by time period 404, if an open load condition does exist relative to circuit output 360, the output voltage provided at circuit output 360 will initially rise as shown by voltage trace 422 to a level at voltage level 418. During this initial time, the current $I_{OUT}$ will also follow the path illustrated by trace 455, rising initially to the current level 454. However, at time 424, output node 360 has been pulled up to the voltage level 418, and no current path, or only an extremely small current path exists for current provided from current source 350 from node 355. As a result, current flow $I_{OUT}$ drops to the level of $I_{OL}$ as shown by (dashed line) 455B. Dashed line 455B represents the current flow $I_{OL}$ provided by current source 350 remaining from node 355 such as when a high ohmic condition exists at output 360. Because and open load condition exists at output 360, current source 350 pulls the voltage level at output 360 up, as illustrated by voltage trace (dashed line) 424A, to a voltage level above the threshold voltage level 416 but less than voltage level 414 for voltage supply 310, as illustrated by voltage trace (dashed line) 424B.

Once voltage level 424A rises above the threshold voltage level 416 at time 424C, in various examples comparator 340 has received voltage level 424(A-B) at input 344 that exceeds the absolute threshold voltage 416, and based on trace 424A and 424B having exceeded that threshold voltage level 416, determines that voltage trace 424 is indicative of an open load condition existing at circuit output 360. In the alternative, in various examples comparator 340 is operable to compare a voltage differential 430 of voltage trace 424 relative to the voltage supply level 414, and if the voltage differential 430 is less than a threshold voltage differential 426 (representative of the voltage different between voltage level 414 and threshold voltage level 416), comparator is operable to again determine that an open load condition exists relative to circuit output 360.

Figure 4B:
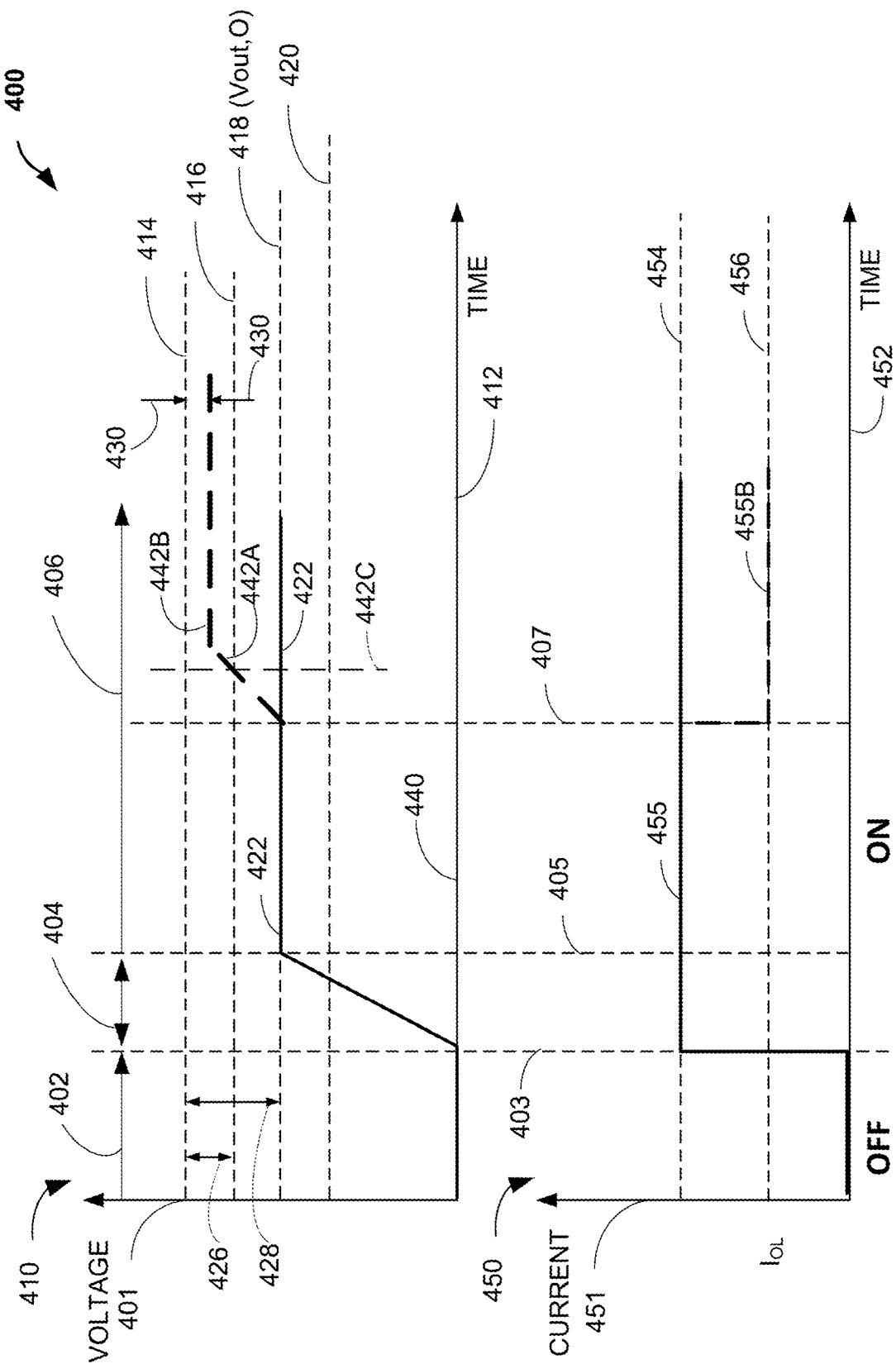

As further illustrated in FIG. 4B, no open load conditions may exist relative to circuit output 360 for voltage trace 422 during the transition period represented by time period 404, but at some time during time period 406, represented by time 407, an open load condition occurs relative to circuit output 360. As noted above, open load detection circuit 301 continues to monitor for open load conditions relative to circuit output 360 during the "ON" state indication represented by time period 406, even when no open load conditions were detected during the transition period 404. As illustrated in FIG. 4B, if an open load condition first occurs during time period 406, the current path provided by output 360 provides no path for current flow, or only an extremely small path for current flow, where current trace 455 will drop to the current flow level 456 of current flow (dashed line 455B) as described above with respect to FIG. 4A. When current flow 455 drops to the level of current flow 456 as illustrated by dashed line 455B, current source 350 is operable to cause the voltage level provided at circuit 360 to rise as shown by voltage trace (dashed line) 442A to a level above threshold voltage level 416, as illustrated by voltage level (dashed line) 442B. As illustrated in FIG. 4B, voltage trace 442A and 442B illustrates a voltage level at circuit output that rises to a level above the threshold voltage level 416 upon occurrence of the open load condition relative to circuit output 360. As described above with respect to voltage trace 424A and 424B, when voltage trace 442A-B rises to a voltage level above threshold voltage level 416 at time 442C, comparator 340 is operable to provide an output signal indicating that an open load condition has been detected at circuit output 360. While these illustrations and open load detection techniques as illustrated in FIG. 4A and FIG. 4B have been described with respect to open load detection circuit 301, these techniques are not limited to utilization by the open load detection circuit 301 described with respect to FIG. 3, and it would be understood that these techniques, or variations of these techniques, can be applied by the additional example open load detection circuits, or variations thereof, as described in the present disclosure.

Figure 5:
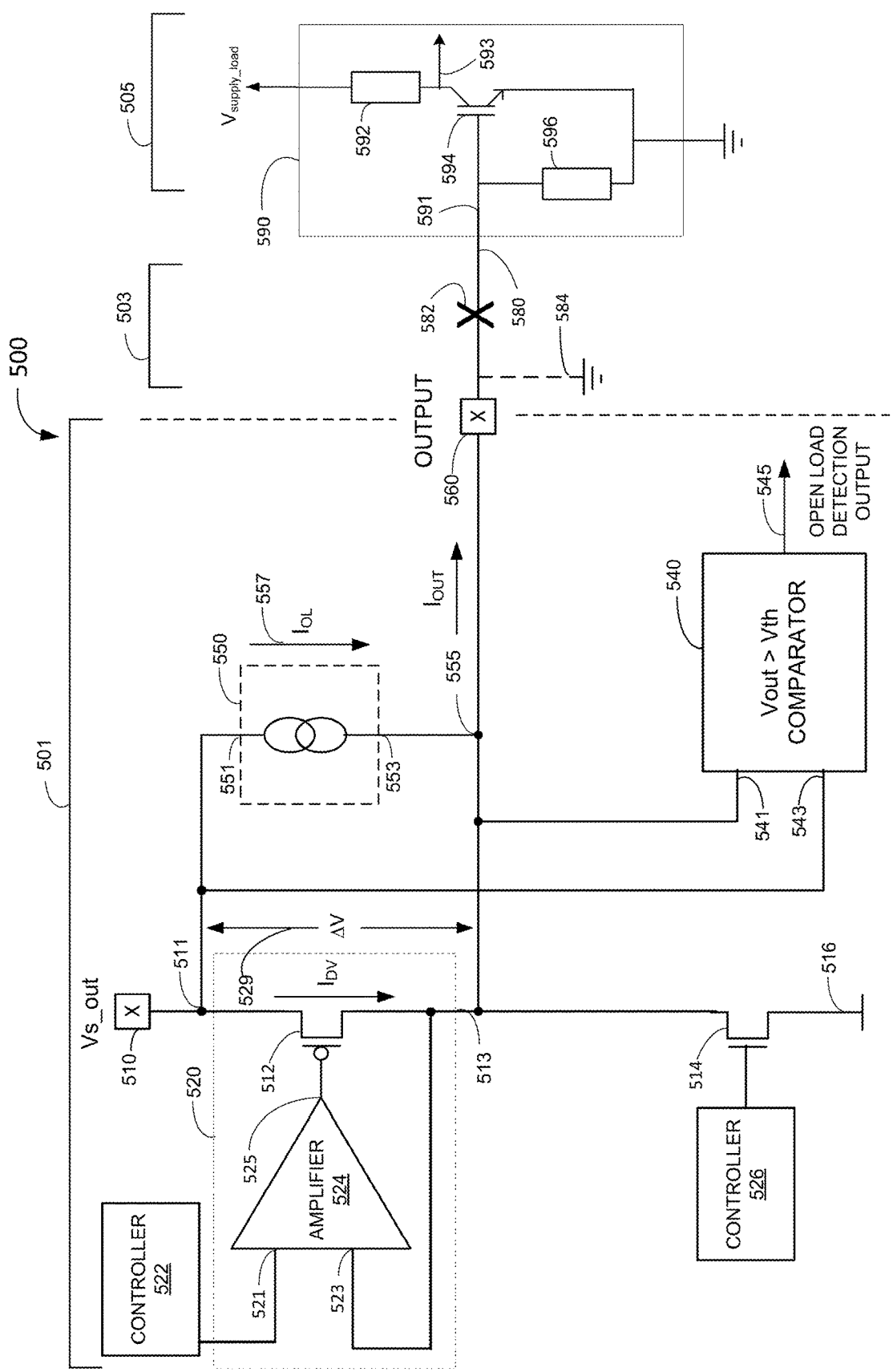
FIG. 5 illustrates a schematic diagram comprising an open load detection circuit in accordance with one or more example techniques described in the present disclosure.

FIG. 5 illustrates a schematic diagram 500 comprising an open load detection circuit 501 in accordance with one or more example techniques described in the present disclosure. In various examples, open load detection circuit 501 includes a delta voltage circuit ($\Delta V$) 520 and a current source 550 coupled to a circuit output 560. As illustrated, a first node 511 of delta voltage circuit 520 is coupled to a voltage supply (Vs_out) 510, and a second node 513 of delta voltage circuit 520 is coupled to a first lead of semiconductor device 514. A second lead of semiconductor device 514 is coupled to ground 516, and a gate of semiconductor 514 is coupled to controller 526. In various examples, controller 526 is configured to provide a control signal to the gate of semiconductor device 514 in order to control semiconductor 514 to operate as a switch for connecting and disconnecting second node 513 of delta voltage circuit 520 and ground 516.

In various examples, delta voltage circuit 520 includes semiconductor device 512 and an amplifier 524. As illustrated, semiconductor device 512 comprises a first lead coupled to first node 511 of delta voltage circuit 520, and a second lead coupled to the second node 513 of delta voltage circuit 520. Amplifier 524 comprises a first input 521 coupled to controller 522, a second input 523 coupled to second node 513 of delta voltage circuit 520, and an output 525 coupled to a gate of semiconductor device 512. In various examples, controller 522 is operable to provide a reference voltage (Vref) to the first input 521 of amplifier 524, and the output voltage level present at second node 513 is provided as feedback to the second input 523 of amplifier 524. Amplifier 524 is configured to provide an output voltage at output 525 that, when applied to semiconductor device 512, allows the semiconductor device 512 to regulate the voltage supplied by voltage supply 510 at node 511 to a voltage level at second node 513 that is the same or substantially the same as the voltage level provided as Vref to the input 521 of amplifier 524.

In this manner, when delta voltage circuit 520 is activated, and a proper load is coupled to circuit 560, the voltage provided at node 555 is precisely controlled by semiconductor device 512 and amplifier 524 to be substantially equal to the Vref voltage being provided to input 521 of amplifier 524. In various examples, the Vref voltage, and thus the voltage level provided to circuit output 560 when delta voltage circuit 520 is activated and a proper load is connected to circuit output 560, is set to be less than the voltage level provided by voltage supply 510, and less than the threshold voltage for detection of an open load condition, but high enough to provide an adequate voltage level to provide a "ON" level signal for device 590 coupled to circuit output 560. In various examples, the "ON" voltage level provided at second node 513 of delta voltage circuit 520 when a proper load is coupled to circuit output 560 is referred to as Vout,O, and is calculated as Vout, O=Vsupply_out−ΔV, wherein Vsupply_out is the voltage level provided by voltage supply 510, and ΔV represents the voltage drop ΔV (529) between first node 511 and second node 513 of delta voltage circuit 520 as a result of the regulation of semiconductor device 512 by amplifier 524 provided to circuit output 560 and load 590.

Semiconductor devices 512 and 514 are not limited to any particular type of semiconductor device, and in various examples are a bipolar transistor, a Metal Oxide Field Effect Transistor (MOSFET), a Complementary Metal-Oxide Semiconductor (CMOS) device, but are not limited to any particular one of these devices or type of devices, can be any other type of device that can operate as a variable resistance as described and shown herein in the open load detection circuit 301. In various examples, semiconductor devices 512 and 514 are not the same type of devices. In various examples, semiconductor device 514 is a Solid State Relay (SSR). Controller 522 is not limited to any particular type of controller, and can be any device or circuit that is operable to be controlled by open load detection circuit 501 to provide a reference voltage to input 521 of amplifier 524. Further, controller 526 in not limited to any particular type of controller, and can be any device or circuit that is operable to be controlled by open load detection circuit 501 to provide a control signal operable to control the state of semiconductor device 514.

In various examples, current source 550 is the current source 350 as illustrated in FIG. 3, and provides the same functions and performance features as described above with respect to current source 350. As illustrated in FIG. 5, current source 550 has an input 551 coupled to voltage supply 510, and a current output 553 coupled to node 555. In various examples, current source 550 is a low drop current source, operable to provide a current output ($I_{OL}$) 557 from current output 553 when a current path exists at node 555 to sink current but that is above the minimum level of the threshold for detection of an open load condition. When a current path exists from node 555 to sink more than the minimum current $I_{OL}$ provided by current source 550, current source 550 is operable to provide current $I_{OL}$ to node 555 while not having an effect on the voltage level at node 555. However, when current source 550 is activated and no current path, or a current path (high ohmic) exists that cannot sink a minimum level (more than a threshold level) of current from the current source 550, current source 550 is operable to pull-up the voltage level provided at node 555 to a voltage level that is above a threshold voltage level for detecting an open load condition at circuit output 560, and that would cause comparator 540 to determine that an open load condition exists relative to circuit output 560. In various examples, when current source 550 is activated and no current path exists at node 555, or only a very small current path for current flow from current source 550 exists, current source 550 is operable to pull the voltage level provided at node 555 to a voltage level that is substantially equal to the voltage level being provided by voltage supply 510.

In various examples, comparator 540 is the comparator 340 as illustrated in FIG. 3, and provides the same functions and performs features in a similar manner as described above with respect to comparator 340, using one or more of the techniques described with respect to FIGS. 4A and 4B. As illustrated in FIG. 5, comparator 540 includes a first input 541 coupled to circuit output 560, a second input coupled to voltage supply 510, and an open load detection output 545. In various examples, comparator 540 is operable to compare the voltage differential between voltage supply 510 and the voltage level provided at circuit output 560, and provide an output signal at open load detection output 545 when the voltage differential between the voltage supply 510 and the voltage level at circuit output 560 is less than a threshold voltage differential level. In various examples, comparator 540 is operable to receive a voltage level at first input 541, compare the voltage level at input 541 to an absolute threshold voltage value, and provide an output signal at output 545 indicative of an open load condition at circuit output 560 if the voltage level at input 541 exceeds the absolute threshold voltage value. The absolute threshold voltage value is set at some value higher than the Vout,O voltage level provided by delta voltage circuit 520 when a proper load is coupled to circuit output 560, but less than the voltage level provided by voltage supply 510.

As shown in FIG. 5, open load detection circuit 501 is operable to be coupled to a load 505, represented by illustrative device 590, through coupling 503, wherein coupling 503 comprising a conductor 580 operable to couple circuit output 560 of open load detection circuit 501 to input 591 of device 590. As illustrated, an open load condition, represented by "X" 582, can exist with respect to the connection provided by conductor 580 as described above with respect to connector 380 and open load condition 382 as described with respect to FIG. 3, and wherein the descriptions of connection 380 and open load condition 382 are applicable to connector 580 and open load condition 582 as illustrated in FIG. 5. In addition, in various examples load 590 includes resistive loads 592 and 596, switching device 594, and switched output 593 that each correspond to resistive loads 392 and 396, switching device 394, and switched output 393, respectively, of device 390 as illustrated in FIG. 3. As such, in these examples the features and functions of load 305 and connection 303 are applicable to load 505, and connection 503, and therefore the full description of connection 503 and load 505 are not repeated here. However, examples of load 505 are not limited to any particular type of load, and in various examples can be any type of load that is operable to be controlled by the circuit output 560 provided by open load detection circuit 501.

Open load detection circuit 501 operates in a manner similar to that described above with respect to open load detection circuit 301 in FIG. 3, but using delta voltage circuit 520 in place of delta voltage circuit 320 as utilized by open load detection circuit 301. For example, when open load detection circuit 501 is providing an "OFF" state indication for device 590 at circuit output 560, controller 522 operates to control amplifier 524 and semiconductor device 512 so that semiconductor device 512 acts as an open switch, and controller 526 operates to control semiconductor device 514 to act as a closed switch. When in this configuration, circuit output 560 is coupled to ground 516 through semiconductor device 514, and no current is flowing through delta voltage control circuit 520. In various examples, device 590 includes a switching device 594 and a resistive load 596 providing a passive pull-down for input 591. As such, the coupling of input 591 to ground provided by circuit output 560 provided an "OFF" state signal level to device 590, causing load 590 to be in the "OFF" state.

During the "OFF" state, current source 550 and comparator 540 can be inactive. However, if current source 550 is active during the "OFF" state, current source 550 is operable to provide a small current at current output 553 to ground through semiconductor device 514, and thus does not affect the voltage level provided at node 555. During the "OFF" state, if comparator 540 is activated, input 541 of comparator 540 is coupled to ground through semiconductor device 514, and thus will not detect an open load condition due to the low voltage level being provided at input 541.

When transitioning from providing the "OFF" state indication to the "ON" state indication at circuit output 560, open load detection circuit 501 operates controller 526 to cause semiconductor device 514 to act as an open switch, disconnecting node 555 and circuit output 560 from ground 516. After disconnecting node 555 and output 560 from ground 516, Open load detection circuit 520 is activated, wherein controller 522 provides the Vref voltage level to input 521 of amplifier 524, and in response, output 525 of amplifier 524 provides a signal to the gate of semiconductor device 512, causing semiconductor device 512 to operate to allow current to flow through semiconductor device 512. Assuming a proper load is connected to circuit output 560, current flow from first node 511 through semiconductor device 512 and out second node 513 of delta voltage circuit 520 will pull second node 513 of delta voltage circuit 520 up to substantially the voltage level of Vref provided at input 521 of amplifier 524, and feedback from second node 513 to input 523 of amplifier 524 will stabilize the voltage level at node 555 at the level of Vref. As the transition from the "OFF" state voltage level to the ON state voltage level is completed, the circuit output 560 will provide a maximum voltage level substantially equal to Vref, which is adequate to provide an "ON" signal to device 590, and thus is operable to transition device 590 from an "OFF" state to an "ON" state. Further, because the voltage level provided at circuit output 560 is less than the threshold voltage level required at circuit output 560 to cause comparator 540 to detect that an open load condition exists with respect to circuit output 560, comparator 540 will not provide an output signal indicative of an open load condition. In these operating conditions, current source 550 will not be operable to control the voltage level at node 555, and will provide the weak current flow $I_{OL}$, similar to that as described above, due to the current path provided at node 555 by load 590.

In an alternative example, when open load detection circuit 501 as illustrated in FIG. 5 is transitioning from providing the "OFF" state indication to the "ON" state indication at circuit output 560, if at any time a proper load is not coupled to circuit output 560 (as represented by an open load condition "X" 582), the following will occur. In an initial current flow output 560 is charged by the delta voltage circuit 520, and the current source 550 and the voltage at output 560 is pulled up to the voltage level Vout,O. In open load condition current source 550 is operable to pull the voltage level provided at node 555 up to a voltage level above the threshold voltage level for detecting an open load condition relative to circuit output 560, while delta voltage circuit 520 is not able to source any current above a voltage level of Vout,O on node 513, and that when provided at input 541 of comparator 540, will cause comparator 540 to generate an output signal at open load detection output 545 indicating that an open load condition exists at circuit output 560. In various examples, as described above comparator 540 uses either a voltage differential or an absolute threshold voltage level to determine that the voltage level provided at node 555 is indicative of an open load condition at circuit output 560.

In addition, once open load detection circuit 501 has completed the transition from providing the "OFF" state indication to providing the "ON" state indication at circuit output 560, monitoring for an open load condition at circuit output 560 can continue while in the "ON" state. If at any time while providing the "ON" state indication at circuit output 560 an open load condition occurs relative to circuit output 560, open load detection circuit 501 is operable to detect the open load condition, and provide an output signal indication that an open load condition was detected in a same manner as described above with respect to the detection of an open load condition during the transition from the "OFF" state to the "ON" state. In various examples, if an open load condition is detected by open load detection circuit 501 during either the transition phase or during the "ON" phase, open load detection circuit 501 is operable to transition from the "ON" state back to the "OFF" state. In various examples, transitioning from the "ON" to the "OFF" state includes deactivating delta voltage circuit 520, and in various examples further includes operating semiconductor device 514 to couple circuit output 560 to ground 516. In various examples, a short circuit condition, represented by "ground" 584, can occur along conductor 580, or simply by a short circuit to circuit output 560. In various examples, both voltage supply 510 and current source 550 are operable to limit current flow, or to stop current flow altogether, to circuit output 560 in the event of a short circuit condition occurring relative to circuit output 560.

Advantages of open load detection circuit 501 include the advantages described above with respect to open load detection circuit 301. In addition, open load detection circuit 501 provides the advantage of a precisely defined and controlled "ON" state output voltage level based on the feedback control and other parameters provided by amplifier 524. In various examples, open load detection circuit 501 is one or more of circuit outputs 122, 124, and 126 of output control circuit 120 as illustrated in FIG. 1. In various examples, processor 112 of CU 110 as illustrated in FIG. 1 provides control signals to control operation of controller 522 and controller 526 of open load detection circuit 501. In various examples, open load detection output 545 of comparator 540 provides an output signal representative of detection of an open load condition as an input to processor 112 of CU 110 for further processing by CU 110. In various examples, in response to receiving a signal indicative of detection of an open load condition, processor 112 of CU 110 is operable to provide open load detection circuit 501 control signals operable to cause open load detection circuit 501 to transition from providing an "ON" state level output at circuit output 560 to providing an "OFF" state level output at circuit output 560.

Figure 6:
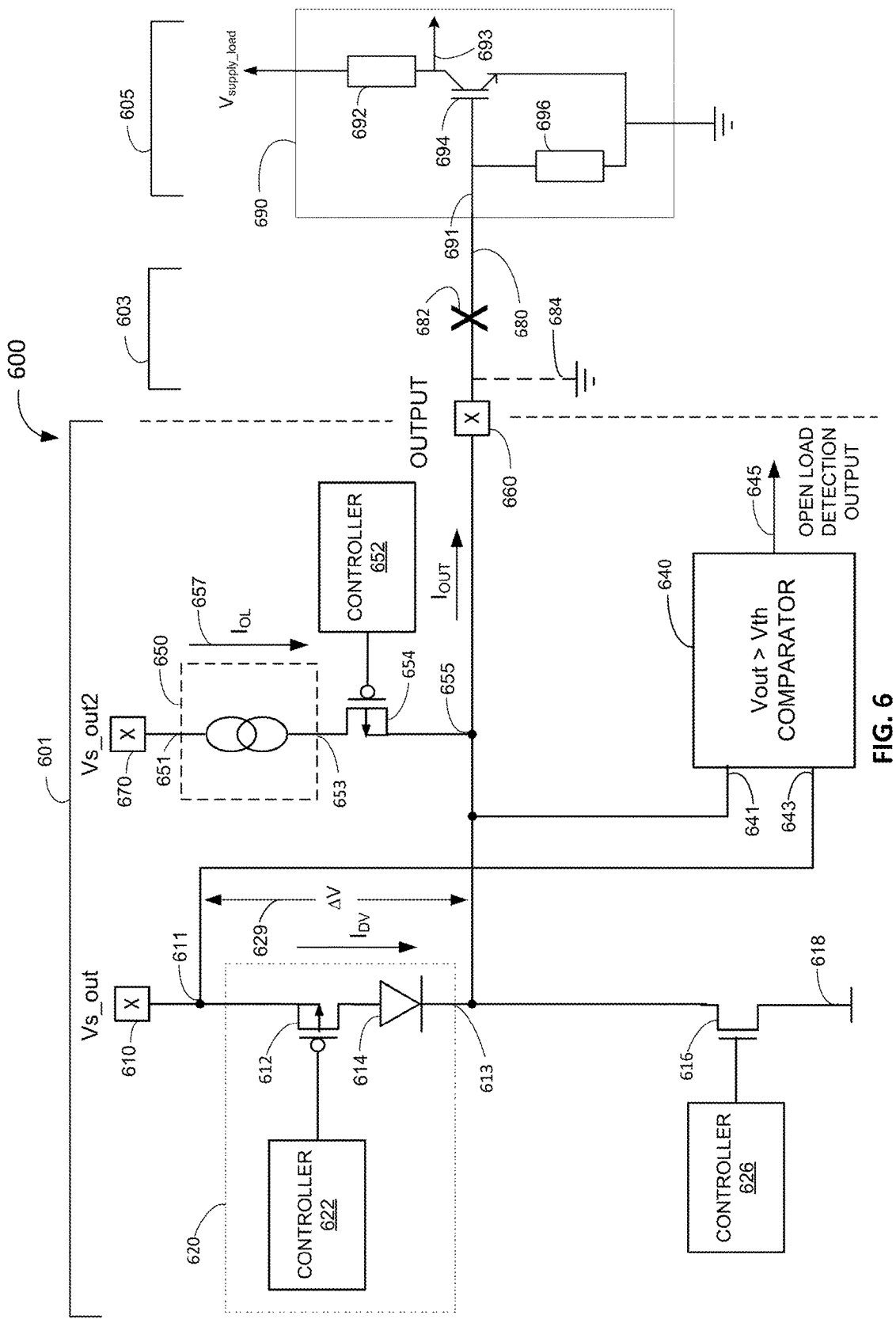
FIG. 6 illustrates a schematic diagram comprising an open load detection circuit in accordance with one or more example techniques described in the present disclosure.

FIG. 6 illustrates a schematic diagram 600 comprising an open load detection circuit 601 in accordance with one or more example techniques described in the present disclosure. In various examples, open load detection circuit 601 includes a delta voltage circuit (ΔV) 620 and a current source 650 coupled to a circuit output 660. As illustrated, a first node 611 of delta voltage circuit 620 is coupled to a voltage supply (Vs_out) 610, and a second node 613 of delta voltage circuit 620 is coupled to a first lead of semiconductor device 616. A second lead of semiconductor device 616 is coupled to ground 618, and a gate of semiconductor 616 is coupled to controller 626. In various examples, controller 626 is configured to provide a control signal to the gate of semiconductor device 616 in order to allow semiconductor device 616 to act as a switch operable to connect or disconnect second node 613 of delta voltage circuit 620 and ground 618.

In various examples, delta voltage circuit 620 includes semiconductor device 612 and a diode 614. As illustrated, semiconductor device 612 comprises a first lead coupled to first node 611 of delta voltage circuit 620, and a second lead coupled to the anode of diode 614. Diode 614 includes a cathode coupled to second node 613 of delta voltage circuit 620. In various examples, a controller 622 is coupled to a gate of semiconductor device 612 and is operable to control semiconductor device 612 so that semiconductor 612 operates as a switch to couple the voltage provided by voltage supply 610 to the anode of diode 614. Under these conditions, if a path for current flow out from second node 613 is available, a current flow through delta voltage circuit 620 will result in a voltage drop, represented by voltage drop (ΔV) 629, between first node 611 and second node 613, and the voltage output provided at node 613 will be provided to node 655 and circuit output 660. In various examples where semiconductor device 612 is operating as a closed switch, the voltage drop ΔV 629 will be simply the voltage drop across diode 614, and the voltage level provided at second node 613 will be substantially Vout,O=Vsupply_voltage−Vdiode, wherein Vsupply_voltage is the voltage level being provided by voltage supply 610, and Vdiode is the voltage drop occurring across diode 614 due to current flow through delta voltage circuit 620. In various examples, Vdiode is substantially 0.7 volts at room temperature. In examples where controller 622 is operable to control semiconductor device 612 as a resistive load, an additional voltage drop across semiconductor device 612 can be generated when a current flow is occurring through delta voltage circuit 620. In operating conditions where semiconductor device 612 is operating as a resistive load, the voltage level provided at second node 613 will be the voltage drop ΔV 629 calculated as Vout,O=Vsupply_voltage−Vdrop612−Vdiode, wherein Vsupply_voltage is the voltage level provided by voltage supply 610, Vdrop612 is the voltage drop across semiconductor device 612 resulting from a current flow through delta voltage circuit 620, and Vdiode is the voltage drop across diode 614 caused by the current flow through delta voltage device 620.

In this manner, when delta voltage circuit 620 is activated, and a proper load is coupled to circuit output 660, the voltage provided at node 655 is provided as Vout,O resulting from the current flow through delta voltage circuit 620. In various examples, the Vout,O voltage level is set to be less than the voltage level provided by voltage supply 610, and less than the threshold voltage for detection of an open load condition, but high enough to provide an adequate voltage level to provide an "ON" signal for device 690 coupled to circuit output 660.

In FIG. 6, semiconductor devices 612 and 616 are not limited to any particular type of semiconductor device, and in various examples are a Solid State Relay (SSR), a bipolar transistor, a Metal Oxide Field Effect Transistor (MOSFET), a Complementary Metal Oxide Device (CMOS), but are not limited to one of these devices or type of devices, can be any other type of device that can operate as a switching device as described and shown herein in the open load detection circuit 601. Further, controller 622 and controller 626 are not limited to any particular type of controller, and can be any devices or circuits that are operable to be controlled by open load detection circuit 601 to provide control signals operable to control the state of semiconductor devices 612 and 616 respectively.

In various examples, current source 650 is the current source 350 as illustrated in FIG. 3, and provides the same functions and performance features as described above with respect to current source 350, but with the differences as further described herein with respect to current source 650. As illustrated in FIG. 6, current source 650 has an input 651 coupled to a second voltage supply (Vs_out2) 670, and a current output 653 coupled to a first lead of semiconductor device 654. As illustrated, semiconductor device 654 includes a second lead coupled to node 655, and a gate coupled to controller 652. In various examples, controller 652 is operable to provide a control signal to the gate of semiconductor device 654 to allow semiconductor device 654 to operate as a diode providing active reverse current flow protection for current source 650. In various examples, when current source 650 is activated, controller 652 provides a control signal to the gate of semiconductor device 654 to couple current output 653 of current source 650 to node 655, allowing current provided from current output 653 to be provided to node 655, but to prevent current from flowing back into current output 653. In various examples, current source 650 is a current source, operable to provide a current output ($I_{OL}$) 657 from current output 653 when a current path exists at node 655 to sink current. When a current path exists from node 655 capable of sinking current a minimum amount of current provided by current source 650, current source 650 is operable to provide current to node 655 while not having an effect on the voltage level at node 655. However, when current source 650 is activated and an open load condition exists at node 655, circuit output 660 is not able to sink any or at least a minimum amount of current provided from current output 653 by current source 650, and current source 650 is operable to pull-up the voltage level provided at node 655 to a voltage level that would exceed the threshold voltage level used to detect an open load condition, and that would cause comparator 640 to determine that an open load condition exists relative to circuit output 660. In various examples, the voltage level provided by second voltage supply 670 is higher than the voltage provided by voltage supply 610. In various examples, the voltage level provided by first voltage supply 610 is a battery voltage as provided in an automotive application. In various examples, a charge pump (not shown) is used to provide a charge pump voltage as the voltage level provided by second voltage supply 670. In various examples, the voltage level provided by second voltage supply 670 is higher than the threshold voltage level that is used by comparator 640 to determine that an open load condition exists relative to circuit output 660.

In various examples, comparator 640 is the comparator 340 as illustrated in FIG. 3, and provides the same functions and performs in a same manner as described above with respect to comparator 340. As illustrated in FIG. 6, comparator 640 includes a first input 641 coupled to circuit output 660, a second input 643 coupled to voltage supply 610, and an open load detection output 645. In various examples, comparator 640 is operable to compare the voltage differential between voltage supply 610 and the voltage level provided at circuit output 660, and provide an output signal at open load detection output 645 when the voltage differential between the voltage supply 610 and the voltage level at circuit output 660 is less than a threshold voltage differential level. In various examples, comparator 640 is operable to receive a voltage level at first input 641, compare the voltage level at input 641 to an absolute threshold voltage level, and provide an output signal at output 645 indicative of an open load condition at circuit output 660 if the voltage level at input 641 exceeds the absolute threshold voltage level. In various examples, the absolute threshold voltage value is set at some value higher than the Vout,O voltage level provided by delta voltage circuit 620 when a proper load is coupled to circuit output 660, but less than the voltage level provided by second voltage supply 670.

As shown in FIG. 6, open load detection circuit 601 is operable to be coupled to a load 605, represented by illustrative device 690, through coupling 603, wherein coupling 603 comprising a conductor 680 operable to couple circuit output 660 of open load detection circuit 601 to input 691 of device 690. As illustrated, an open load condition, represented by open load condition "X" 682, can exist with respect to the connection provided by conductor 680 as described above with respect to connector 380 and open load condition 382 as described with respect to FIG. 3, and wherein the descriptions of connection 380 and open load condition 382 are applicable to connector 680 and open load condition 682 as illustrated in FIG. 6. In addition, in various examples device 690 includes resistive loads 692 and 696, and switching device 694, and switched output 693 that each correspond to resistive loads 392 and 396, switching device 394, and switched output 393, respectively, of load 390 as illustrated in FIG. 3. As such, in these examples the features and functions of load 305 and connection 303 are applicable to load 605 and connection 603, and therefore the full description of connection 603 and load 690 are not repeated here. However, examples of load 605 are not limited to any particular type of load, and in various examples can be any type of load that is operable to be controlled by the circuit output 660 provided by open load detection circuit 601.

Open load detection circuit 601 operates in a manner similar to that described above with respect to open load detection circuit 301 in FIG. 3, but using delta voltage circuit 620 in place of delta voltage circuit 320 as utilized by open load detection circuit 301, and the current source 650 being coupled to a second voltage supply than the delta voltage circuit 620, and having a semiconductor device coupling the output of current source 650 to node 655 and circuit output 660. For example, when open load detection circuit 601 is providing an "OFF" state indication for device 690 at circuit output 660, controller 622 operates to control semiconductor device 612 so that semiconductor device 612 acts as an open switch, and controller 626 operates to control semiconductor device 616 to act as a closed switch. When in this configuration, circuit output 660 is coupled to ground 618 through semiconductor device 616, and no current is flowing through delta voltage control circuit 620. In various examples, device 690 operates in a similar manner as described for load device 390 as illustrated in FIG. 3, where device 690 includes a switching device 694 and a resistive load 696 providing a passive pull-down for input 691. As such, the coupling of input 691 to ground as provided by circuit output 660 provides an "OFF" state signal level to device 690, turning device 690 to the "OFF" state.

During the "OFF" state, current source 650 and comparator 640 can be inactive. However, if current source 650 is active during the "OFF" state, current source 650 is operable to provide a small current at current output 653 through semiconductor device 654 to node 655 and then to ground through semiconductor device 616, and thus does not affect the voltage level provided at node 655. During the "OFF" state, if comparator 640 is activated, input 641 of comparator 640 is coupled to ground through semiconductor device 616, and thus will not detect an open load condition due to the low voltage level being received at input 641.

When transitioning from providing the "OFF" state indication to the "ON" state indication at circuit output 660, open load detection circuit 601 operates controller 626 to cause semiconductor device 616 to act as an open switch, disconnecting node 655 and circuit output 660 from ground 618. Open load detection circuit 620 is activated afterwards, wherein controller 622 provides a control signal causing semiconductor device 612 to operate either as a closed switch or as a resistive load, thus allowing current to flow through semiconductor device 612 and diode 614. Assuming a proper load is connected to circuit output 660, current flow from first node 611 through semiconductor device 612 and diode 614 and out from second node 613 of delta voltage circuit 620 will pull second node 613 of delta voltage circuit 620 up to substantially the voltage level Vout,O representative of the difference between the voltage level provided by voltage supply 610 and the voltage drop ΔV 629. As the transitional from the "OFF" state voltage level to the ON state voltage level is completed, the circuit output 660 will provide a maximum voltage level substantially equal to Vout,O, which is adequate to provide an "ON" signal to device 690, and thus is operable to transition device 690 from an "OFF" state to an "ON" state. Further, because the voltage level provided at circuit output 660 is less than the voltage level required at circuit output 660 to cause comparator 640 to detect an open load condition with respect to circuit output 660, comparator 640 will not provide an output signal indicative of an open load condition. In these operating conditions, current source 650 will not be operable to control the voltage level at node 655, and will provide a weak current flow, similar to that as described above, due to the current path provided at node 655 by load 690.

In an alternative example, when open load detection circuit 601 as illustrated in FIG. 6 is transitioning from providing the "OFF" state indication to the "ON" state indication at circuit output 660, will proceed as follows. At any time a proper load is not coupled to circuit output 660 (as represented by open circuit condition "X" 682), following an initial current flow to charge the delta voltage circuit 620 and circuit output 660 to the voltage level Vout,O. Once the voltage level at output 660 is pulled up to the Vout,O voltage level, activation of delta voltage circuit 620 will not result in a further current flow from first node 611 to second node 613 of delta voltage circuit 620 because circuit output 660 does not provide a path to sink current, or provides only an extremely small path for current to flow from node 655 through load 690 due to the open load condition. Under these conditions, as described above current source 650 is operable to pull the voltage level provided at node 655 up to a voltage level that, when provided at input 641 of comparator 640, will cause comparator 640 to generate an output signal at open load detection output 645 indicating that an open load condition exists at circuit output 660. In various examples, current source 650 is operable to pull the voltage level provided at node 655 up to a voltage level substantially equal to the voltage level being provided by second voltage source 670 when current source 650 is activated and node 655 is not providing a current path to sink current provided to node 655 as a result of the open load condition. In various examples, as described above comparator 640 uses either a voltage differential or an absolute threshold voltage level to determine that the voltage level provided at node 655 is indicative of an open load condition at circuit output 660, as described above.

In addition, once open load detection circuit 601 has completed the transition from providing the "OFF" state indication to providing the "ON" state indication at circuit output 660, monitoring for an open load condition at circuit output 660 can continue while in the "ON" state. If at any time while providing the "ON" state indication at circuit output 660 an open load condition occurs relative to circuit output 660, open load detection circuit 601 is operable to detect the open load condition, and provide an output signal indication that an open load condition was detected in a same manner as described above with respect to the detection of an open load condition during the transition from the "OFF" state to the "ON" state. In various examples, if an open load condition is detected by open load detection circuit 601 during either the transition phase or during the "ON" phase, open load detection circuit 601 is operable to transition from the "ON" state back to the "OFF" state. In various examples, transition from the "ON" state to the "OFF" state includes deactivating delta voltage circuit 620, and in various examples further includes operating semiconductor device 616 so as to couple circuit output 660 to ground 618. In various examples, a short circuit condition, represented by "ground" 684, can occur along conductor 680, or simply by a short circuit to circuit output 660. In various examples, both voltage supplies 610 and 670 and current source 650 are operable to limit current flow, or to stop current flow altogether, to circuit output 660 in the event of a short circuit condition occurring relative to circuit output 660.

Advantages of open load detection circuit 601 include the advantages described above with respect to open load detection circuit 301. In addition, open load detection circuit 601 provides the advantage of simple reverse protection of delta voltage circuit 620 by virtue of diode 614, and the ability to use a different voltage level to which current source 650 can pull circuit output 660 to when an open load condition exists, thus allowing open load detection circuit 602 to include a semiconductor device to protect current source 650.

In various examples, open load detection circuit 601 is one or more of circuit outputs 122, 124, and 126 of output control circuit 120 as illustrated in FIG. 1. In various examples, processor 112 of CU 110 as illustrated in FIG. 1 provides control signals to control operation of controller 622, controller 626, of open load detection circuit 601. Further, reverse protection provided by semiconductor device 654 and controller 652 of open load detection circuit 601 are provided independently of any need for CU 110 input or control. In various examples, controller 652 provides control of reverse protection independently of any input from an external CU. In various examples, open load detection output 645 of comparator 640 provides an output signal representative of detection of an open load condition as an input to processor 112 of CU 110 for further processing by CU 110. In various examples, in response to receiving a signal indicative of detection of an open load condition from open load detection circuit 601, processor 112 of CU 110 is operable to provide open load detection circuit 601 with control signals operable to cause open load detection circuit 601 to transition from providing an "ON" state level output at circuit output 660 to providing an "OFF" state level output at circuit output 660.

Figure 7:
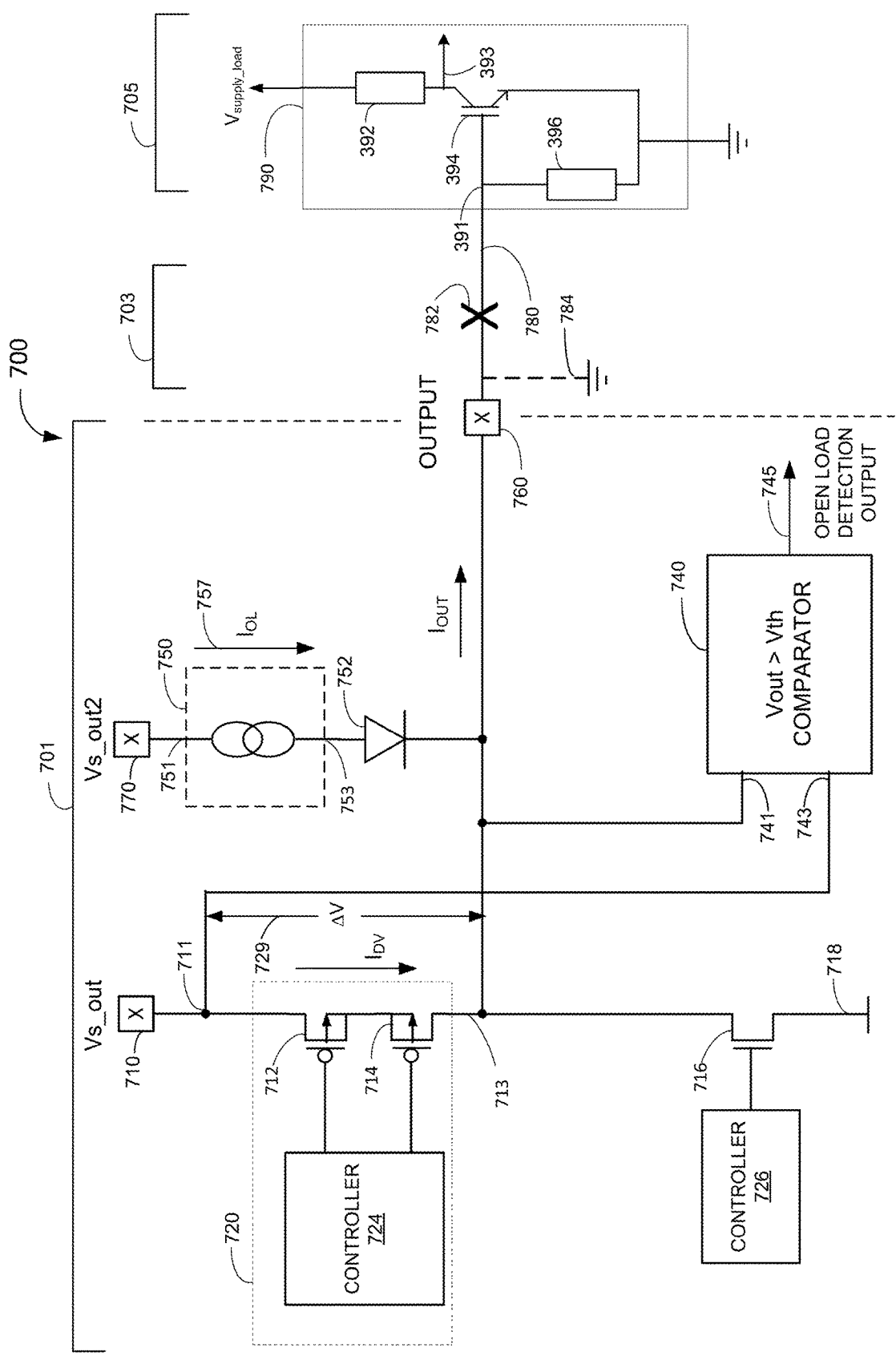
FIG. 7 illustrates a schematic diagram comprising an open load detection circuit in accordance with one or more example techniques described in the present disclosure.

FIG. 7 illustrates a schematic diagram 700 comprising an open load detection circuit 701 in accordance with one or more example techniques described in the present disclosure. In various examples, open load detection circuit 701 includes a delta voltage circuit ($\Delta V$) 720 and a current source 750 coupled through diode 752 to a circuit output 760. As illustrated, a first node 711 of delta voltage circuit 720 is coupled to a voltage supply (Vs_out) 710, and a second node 713 of delta voltage circuit 720 is coupled to a first lead of semiconductor device 716. A second lead of semiconductor device 716 is coupled to ground 718, and a gate of semiconductor 716 is coupled to controller 726. In various examples, controller 726 is configured to provide a control signal to the gate of semiconductor device 716 in order to allow semiconductor device 716 to act as a switch operable to connect or disconnect second node 713 of delta voltage circuit 720 and ground 718.

In various examples, delta voltage circuit 720 includes a first semiconductor device 712 and a second semiconductor device 714. As illustrated, first semiconductor device 712 comprises a first lead coupled to first node 711 of delta voltage circuit 720, and a second lead coupled to a first lead of second semiconductor device 714. Second semiconductor device 714 includes a second lead coupled to second node 713 of delta voltage circuit 720. As illustrated in FIG. 7, a controller 724 is coupled to the gate of first semiconductor device 712, and is also coupled to the gate of second semiconductor device 714. In various examples, controller 724 is operable to control semiconductor device 712 so that semiconductor device 712 acts as backward voltage protection, and couples the voltage provided by voltage supply 710 to the first lead of second semiconductor device 714. In various examples, backward voltage protection of voltage supply 710 is important and/or required because external voltages to which circuit output 760 may be exposed to can be a higher voltage level than the voltage level provided by voltage supply 710. An example of such an instance can be illustrated wherein voltage supply 710 is set to provide +5 volts, and wherein the load 790 are loads in an automotive application wherein voltages such as +12 volts provided as battery voltage could potentially be connected to conductor 780, and thus coupled to voltage supply 710. In such instances, semiconductor 712 is operable to provide backward voltage protection of voltage supply 710 from a higher voltage level being inadvertently applied to the output of voltage supply 710.

In various examples, controller 724 is also operable to control 712 and 714 so that both 712 and 714 can act as a resistance. Additionally 712 can act as backward supply protection, when the gate of 712 is controlled in such a way that current flow back to supply node 710 is prevented. In various examples, semiconductor 714 also acts as a switch. Under these conditions, if a path for current flow out from second node 713 is available, a current flow through delta voltage circuit 720 will result in a voltage drop, represented by voltage drop ($\Delta V$) 729, between first node 711 and second node 713, and the voltage output provided at second node 713 will be provided to node 755 and circuit output 760. In various examples where first semiconductor device 714 is operating as a closed switch and second semiconductor device 712 is operating as a resistive load, the voltage drop ΔV 729 will be simply the voltage drop across second semiconductor device 712, and the voltage level provided at second node 713 will be substantially Vout, O=Vsupply_voltage−Vdrop712, wherein Vsupply_voltage is the voltage level being provided by voltage supply 710, and Vdrop712 is the voltage drop occurring across second semiconductor device 712 due to current flow through delta voltage circuit 720. Examples of the operations performed by semiconductor device 712 and 714 are not limited to these particular combinations and any combination wherein semiconductor device 712 operates as a diode, a variable resistance, and/or a switch, and wherein semiconductor device 714 operates as a variable resistance and/or a switch, are contemplated for use by delta voltage circuit 720. In various examples, when semiconductor device 712 is switched and current is only conducted by the bulk diode, Vdrop712 is substantially 0.7 volts at room temperature. In examples wherein semiconductor device 714 operates as a switch and semiconductor device 712 is operable to provide reverse protection for voltage supply 710, control of the gate voltage of semiconductor device 712 can be set that that voltage drop across semiconductor device 712, and thus provided a ΔV 729, is 0.7 volts.

In various examples, controller 724 is operable to control first semiconductor device 712 and second semiconductor device 714 in non-saturated regions, as would be understood by one of skill in the art, in order to provide a voltage level at second node 713 and a current flow from second node 713 in order to control and provide power to drive a load, such as load 705, as illustrated by device 790 in FIG. 7. Under such conditions, the voltage drop ΔV 729 will be generated as a result of regulation of the current flow through delta voltage circuit 720 in order to provide a voltage and current flow to power the load 705. In operating conditions where first semiconductor device 712 and second semiconductor device 714 are both operating in the linear (non-saturation) region, the voltage level provided at second node 713 will be the voltage drop ΔV 729 calculated as Vout, O=Vsupply_voltage−Vdrop712−Vdrop714, wherein Vsupply_voltage is the voltage level provided by voltage supply 710, Vdrop712 is the voltage drop across first semiconductor device 712 resulting from a current flow through delta voltage circuit 720, and Vdrop714 is the voltage drop across second semiconductor device 714 caused by the current flow through delta voltage device 720.

In this manner, when delta voltage circuit 720 is activated, and a proper load is coupled to circuit output 760, the voltage provided at node 755 is provided as Vout,O by the current flow through delta voltage circuit 720. In various examples, the Vout,O voltage level is set to be less than the voltage level provided by voltage supply 710, and less than the threshold voltage for detection of an open load condition at circuit output 760, but high enough to provide an adequate voltage level to provide a "ON" signal for device 790 coupled to circuit output 760, or in various examples high enough to provide voltage and current levels adequate to drive and operate device 790 coupled to circuit output 760.

In FIG. 7, semiconductor devices 712, 714, and 716 are not limited to any particular types of semiconductor devices, and in various examples are a bipolar transistor, a Metal-Oxide Field Effect Transistor (MOSFET), a Complementary Metal Oxide Semiconductor (CMOS) device, but are not limited to one of these devices or type of devices, can be any other type of device that can operate as a switching device or as a resistive load as described and shown herein in the open load detection circuit 701. As would be understood by one of ordinary skill in the art, controller 724 and controller 726 are not limited to any particular type of controller, and can be any devices or circuits that are operable to be controlled by open load detection circuit 701 to provide control signals that are operable to control the state of semiconductor devices 712, 714, and 716 respectively.

In various examples, current source 750 is the current source 350 as illustrated in FIG. 3, and provides the same functions and performance as described above with respect to current source 350. As illustrated in FIG. 7, current source 750 has an input 751 coupled to a second voltage supply (Vs_out2) 770, and a current output 753 coupled to the anode of diode 752. As illustrated in FIG. 7, diode 752 includes a cathode coupled to node 755. In various examples, second voltage supply 770 is that same voltage supply as first voltage supply 710. In various examples, second voltage supply 770 is a different voltage supply than voltage supply 710, and second voltage supply 770 is operable to provide a voltage level that is higher than the voltage level provided by voltage supply 710. In various examples, when current source 750 is activated, diode 752 is operable to allow current provided from current output 753 to flow to node 755, but prevents current from flowing from node 755 back to current output 753 of current source 750. In various applications, this feature performed by diode 752 is required in order to prevent a voltage level that is inadvertently applied to circuit output 760 from outside open load detection circuit 701, and which is a higher voltage than the voltage level provide by second voltage supply 770, from back driving current into second voltage supply 770. In a similar manner, one or both of semiconductor devices 712 and 714 are operable to prevent a voltage level that is inadvertently applied to circuit output 760 from outside open load detection circuit 701, and which is a higher voltage than the voltage level provide by voltage supply 710, from back driving current into voltage supply 710.

In various examples, current source 750 is a current source, operable to provide a current output ($I_{OL}$) 757 from current output 753 when a current path exists at node 755 to sink current. When a current path exists from node 755 to sink current provided by current source 750, current source 750 is operable to provide current to node 755 while not having an effect on the voltage level provided at node 755. However, when current source 750 is activated and an open load condition as previously described exists at node 755, current source 750 is operable to pull-up the voltage level provided at node 755 to a voltage level that would cause comparator 740 to determine that an open load condition exists relative to circuit output 760. In various examples, when current source 750 is activated and an open load condition exists at node 755, current source 750 is operable to pull the voltage level provided at node 755 to a voltage level that is above the open load detection threshold at node 760 including the voltage drop of diode 752. In various examples, the voltage level provided by second voltage supply 770 is higher than the voltage provided by voltage supply 710. In various examples, the voltage level provided by second voltage supply 770 is a battery voltage as provided in an automotive application. In various examples, a charge pump (not shown) is used to provide a charge pump voltage as the voltage level provided by second voltage supply 770.

In various examples, comparator 740 is the comparator 340 as illustrated in FIG. 3, and provides the same functions and performs in a same manner as described above with respect to comparator 340. As illustrated in FIG. 7, comparator 740 includes a first input 741 coupled to circuit output 760, a second input 743 coupled to voltage supply 710, and an open load detection output 745. In various examples, comparator 740 is operable to compare the voltage differential between voltage supply 710 and the voltage level provided at circuit output 760, and provide an output signal at open load detection output 745 when the voltage differential between the voltage supply 710 and the voltage level at circuit output 760 is less than a threshold differential voltage level. In various examples, comparator 740 is operable to receive a voltage level at first input 741, compare the voltage level at input 741 to an absolute threshold voltage level, and provide an output signal at output 745 indicative of an open load condition at circuit output 760 if the voltage level at input 741 exceeds the absolute threshold voltage level. In various examples, the absolute threshold voltage level is set at some value higher than the Vout,O voltage level provided by delta voltage circuit 720 when a proper load is coupled to circuit output 760, but less than the voltage level provided by second voltage supply 770.

As shown in FIG. 7, open load detection circuit 701 is operable to be coupled to a load 705, represented by illustrative device 790, through coupling 703, coupling 703 comprising a conductor 780 operable to couple circuit output 760 of open load detection circuit 701 to input 791 of device 790. As illustrated, an open load condition, represented by open load condition "X" 782, can exist with respect to the connection provided by conductor 780 as described above with respect to connector 380 and open load condition 382 as described with respect to FIG. 3, and wherein the descriptions of connection 380 and open load condition 382 are applicable to connector 780 and open load condition 782 as illustrated in FIG. 7. In various examples, device 790 is device 390 as illustrated in FIG. 3, including a passive pull down at input 791 corresponding to input 391 of load 390. As such, in these examples the features and functions of load 305 and connection 303 are applicable to load 705 and connection 703, and therefore the full description of connection 703 and load 705 are not repeated here. However, examples of load 790 are not limited to any particular type of load, and in various examples can be any type of load that is operable to be controlled by the circuit output 760 provided by open load detection circuit 701.

Open load detection circuit 701 operates in a manner similar to that described above with respect to open load detection circuit 301 in FIG. 3, but using delta voltage circuit 720 in place of delta voltage circuit 320 as utilized by open load detection circuit 301. For example, when open load detection circuit 701 is providing an "OFF" state indication for device 790 at circuit output 760, controller 724 operates to control first semiconductor device 712 and second semiconductor device 714 to act as an open switch, or to control only semiconductor device 714 to act as an open switch, and controller 726 operates to control semiconductor device 716 to act as a closed switch. When in this configuration, circuit output 760 is coupled to ground 718 through semiconductor device 716, and no current is flowing through delta voltage control circuit 720. In various examples, device 790 operates in a similar manner as described for load device 390 as illustrated in FIG. 3, where device 390 includes a switching device 394 and a resistive load 396 providing a passive pull-down for input 391 as illustrated in FIG. 3. As such, the coupling of input 791 to ground as provided by circuit output 760 provides an "OFF" state voltage level to device 790, turning device 790 to the "OFF" state. During the "OFF" state, current source 750 and comparator 740 can be inactive. However, if current source 750 is active during the "OFF" state, current source 750 is operable to provide a small current at current output 753 through diode 752 to node 755 and then to ground through semiconductor device 716, and thus current source 750 does not affect the voltage level provided at node 755. During the "OFF" state, if comparator 740 is activated, input 741 of comparator 740 is coupled to ground through semiconductor device 716, and thus will not detect an open load condition due to the low voltage level provided to input 741 of comparator 740.

When transitioning from providing the "OFF" state indication to the "ON" state indication at circuit output 760, open load detection circuit 701 operates controller 726 to cause semiconductor device 716 to act as an open switch, disconnecting node 755 and circuit output 760 from ground 718. Delta voltage circuit 720 is activated afterwards, wherein controller 724 provides a control signals causing first semiconductor device 712 to operate either as a closed switch or as a resistive load, and causing semiconductor device 714 to operate in a linear range, as described above, thus allowing current to flow through first semiconductor device 712 and second semiconductor device 714. Assuming a proper load is connected to circuit output 760, current flow from first node 711 through semiconductor devices 712 and 714 and out from second node 713 of delta voltage circuit 720 will pull second node 713 of delta voltage circuit 720 up to substantially the voltage level Vout,O representative of the difference between the voltage level provided by voltage supply 710 and the voltage drop $\Delta V$ 729. As the transition from the "OFF" state voltage level to the ON state voltage level is completed, the circuit output 760 will provide a maximum voltage level substantially equal to Vout,O, which is adequate to provide an "ON" signal to device 790, or to drive a resistive or inductive load to an ON state, and thus is operable to transition load 705 from an "OFF" state to an "ON" state. Further, because the voltage level provided at circuit output 760 is less than the voltage level required at circuit output 760 to cause comparator 740 to detect an open load condition with respect to circuit output 760, comparator 740 will not provide an output signal indicative of an open load condition. In these operating conditions, current source 750 will not be operable to control the voltage level at node 755, and will provide a weak current flow, similar to that as described above, due to the current path provided at node 755 by load 705.

In an alternative example, when open load detection circuit 701 as illustrated in FIG. 7 is transitioning from providing the "OFF" state indication to the "ON" state indication at circuit output 760, after a brief initial time where a current flows to charge output 760 up to the Vout,O voltage level, if at any time after this initial period proper load is not coupled to circuit output 760 and an open circuit condition exists, (as represented by open load condition "X" 782), activation of delta voltage circuit 720 will result in a current flow through delta voltage circuit 720 only until the voltage at nod 713 is pulled up to Vout,O is reached. Once the Vout,O output voltage is reached, no further current flow from first node 711 to second node 713 of delta voltage circuit 720 will occur because circuit output 760 does not provide a path to sink current from node 755 through load 790, or provides only an extremely small current path for current to be sunk from node 755, due to the open load condition. Under these conditions, as described above current source 750 together with diode 752 is operable to pull the voltage level provided at node 755 up to a voltage level that, when provided at input 741 of comparator 740, will cause comparator 740 to generate an output signal at open load detection output 745 indicating that an open load condition exists at circuit output 760. In various examples, current source 750 together with diode 752 is operable to pull the voltage level provided at node 755 up to a voltage level substantially equal to the voltage level being provided by second voltage source 770 reduced by the voltage drop over diode 752 when current source 750 is activated and node 755 is not providing a current path to sink current provided to node 755 as a result of the open load condition. In various examples, as described above comparator 740 uses either a voltage differential or an absolute threshold voltage level to determine that the voltage level provided at node 755 is indicative of an open load condition at circuit output 760. In various examples, the voltage level provided by second voltage supply 770 is higher than the threshold voltage level used by comparator 740 to determine that an open load condition exists at circuit output 760.

In addition, once open load detection circuit 701 has completed the transition from providing the "OFF" state indication to providing the "ON" state indication at circuit output 760, monitoring for an open load condition at circuit output 760 can continue while in the "ON" state. If at any time while providing the "ON" state indication at circuit output 760 an open load condition occurs relative to circuit output 760, open load detection circuit 701 is operable to detect the open load condition, and provide an output signal indication that an open load condition was detected in a same manner as described above with respect to the detection of an open load condition during the transition from the "OFF" state to the "ON" state as described above. In various examples, if an open load condition is detected by open load detection circuit 701 during either the transition phase or during the "ON" phase, open load detection circuit 701 is operable to transition from the "ON" state back to the "OFF" state. In various examples, transition from the "ON" to the "OFF" state includes deactivating delta voltage circuit 720, and in various examples further includes operating semiconductor device 716 so as to couple circuit output 760 to ground 718. In various examples, a short circuit condition, represented by "ground" 784, can occur along conductor 780, or simply by a short circuit to circuit output 760. In various examples, both voltage supplies 710 and 770 and current source 750 are operable to limit current flow, or to stop current flow altogether, to circuit output 760 in the event of a short circuit condition occurring relative to circuit output 760.

Advantages of open load detection circuit 701 include the advantages described above with respect to open load detection circuit 301. In addition, open load detection circuit 701 provides the advantage of being operable to drive resistive or inductive loads that require higher power requirements while still providing open load detection during the entire time the load is being transition from an "OFF" to an "ON" state, and during the entire time the load is being operated in the "ON" state. Further, in the examples illustrated in FIG. 7, both the delta voltage circuit 720 and current source 750 are protected against current being back driven through these circuits from the circuit output 760, thus meeting the requirements for applications that mandate this feature as part of a circuit output.

In various examples, open load detection circuit 701 is one or more of circuit outputs 122, 124, and 126 of output control circuit 120 as illustrated in FIG. 1. In various examples, processor 112 of CU 110 as illustrated in FIG. 1 provides control signals to control operation of controller 724 and controller 726 of open load detection circuit 701. In various examples, open load detection output 745 of comparator 740 provides an output signal representative of detection of an open load condition as an input to processor 112 of CU 110 for further processing by CU 110. In various examples, in response to receiving a signal indicative of detection of an open load condition from open load detection circuit 701, processor 112 of CU 110 is operable to provide open load detection circuit 701 with control signals operable to cause open load detection circuit 701 to transition from providing an "ON" state level output at circuit output 760 to providing an "OFF" state indication at circuit output 760.

Figure 8:
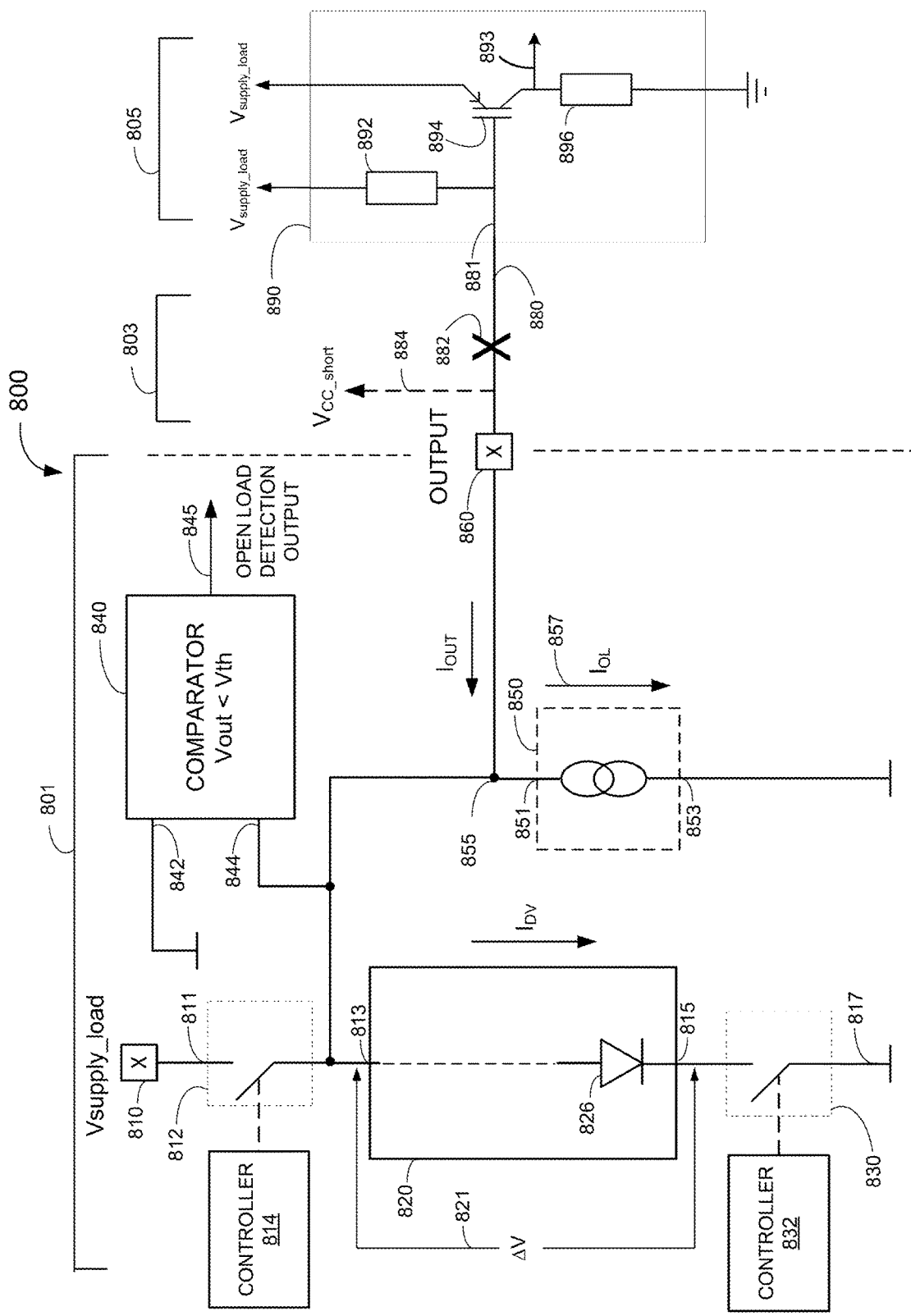
FIG. 8 illustrates a schematic diagram comprising an open load detection circuit in accordance with one or more example techniques described in the present disclosure.

FIG. 8 illustrates a schematic diagram 800 comprising an open load detection circuit 801 in accordance with one or more example techniques described in the present disclosure. In various examples, open load detection circuit 801 operates in a manner similar to the devices and systems described with respect to FIG. 3 and FIGS. 5-7, but with differences such as different polarities, and described herein with respect to open load detection circuit 801, and wherein open load detection circuit 801 is configured to provide a signal indicative of an "OFF" state and indicative of on "ON" state at circuit output 860 for connection to a load 805, represented by illustrative device 890, wherein device 890 includes a passive pull-up at input 881. As illustrated in FIG. 8, device 890 includes an input 881 that is pulled up to a voltage supply Vsupply_load through resistive load 892 unless a voltage level from another source, such as circuit output 860, provides another voltage level to input 881. Switching device 894 includes a gate coupled to input 881, a first lead also coupled directly to voltage supply Vsupply_load, and a second lead coupled to ground through resistive load 896. As illustrated, switching device 894 includes a switchable output 893 coupled to the second lead of switching device 894. When input 881 is provided a voltage level or is floating, the gate of switching device 894 is pulled up to the voltage level provided by voltage supply Vsupply_load, causing switching device 894 to be turned off, and switched output 893 to be coupled to ground through resistive load 896. In various examples, this is an OFF state for load 890. When input 881 is grounded, or provided a second voltage operable to switch device 894 on, switching device 894 is turned on, causing switching device 894 to act as a closed switch, and coupling switched output 893 to voltage supply Vsupply_load. In various examples, this is an "ON" state for device 890. Thus, by providing a voltage level of Vsupply_load at input 881, device 890 can be turned to an "OFF" state, and by grounding or providing a second voltage level at input 881, device 890 can be turned to an "ON" state. In various examples, open load circuit 801 is operable to provide a voltage level through connector 880 of coupling 803 to turn device 890 off, and to ground input 881 of device 890 or to provide a second voltage level at to turn device 890 on, and to detect when an open load condition exists relative to circuit output 860 in open load detection circuit 801.

In various examples, open load detection circuit 801 includes a delta voltage circuit (ΔV) 820 and a current source 850 coupled to a circuit output 860. As illustrated, voltage supply 810 is coupled a first lead 811 of switch 812, a second lead of switch 812 is coupled to a first node 813 of delta voltage circuit 820. A controller 814 is coupled to switch 812, and is operable to control the operation of switch 812. In various examples, switch 812 and controller 814 are switch 312 and controller 314, respectively, as described with respect to FIG. 3, and can comprise any of the examples described with respect to switch 312 and controller 314.

Referring again to FIG. 8, delta voltage circuit 820 includes a second node 815 coupled to a first lead of switch 830. Switch 830 includes a second lead coupled to ground 817. As illustrated, controller 832 is coupled to switch 830, and is operable to control the operation of switch 830. In various examples, switch 830 and controller 832 are switch 330 and controller 332, respectively, as described with respect to FIG. 3, and can comprise any of the examples described with respect to switch 330 and controller 332. In various examples, delta voltage circuit 820 includes diode 826 having an anode coupled to first node 813, and a cathode coupled to second node 815 of delta voltage circuit 820. However, the example of delta voltage circuit 820 as illustrated in FIG. 8 is merely illustrative, and examples of delta voltage circuit 820 are not limited to comprising just a diode. In various examples, delta voltage circuit 820 comprises any one of the delta voltage circuits 320, 520, 620, or 720 as illustrated and described in the present disclosure. As illustrated in FIG. 8, node 855, and thus circuit output 860, are coupled to first node 813 of delta voltage circuit 820. Further, and in contrast to the current source 350 as shown in FIG. 3, current 550 as shown in FIG. 5, current source 650 as shown in FIG. 6, and current source 750 as shown in FIG. 7, current source 850 has an input 851 coupled to the circuit output 860 of open load detection circuit 801, and the output of current source 850 is coupled to ground. As such, current source 850 is operable to sink current from circuit output 860 to ground, and thus to also sink current from load 890 when load 890 is electrically coupled to circuit output 860.

In various examples, controller 832 is operable to control switch 830 to couple second node 815 of delta voltage circuit 820 to ground. Under these conditions, if current flow is being provided to circuit output 860 from a load coupled to circuit output 860, a current flow through delta voltage circuit 820 will result, causing a voltage drop, represented by voltage drop ΔV 821, between first node 813 and second node 815 of delta voltage circuit 820. In various examples, the voltage provided by the load, represented as "Vload" will substantially be equal to the ground voltage plus the voltage drop ΔV 821 occurring across first node 813 and second node 815 of delta voltage circuit 820. In this manner, when delta voltage circuit 820 is activated, and a proper load is coupled to circuit output 860, delta voltage circuit 820 acts as a current sink for current provided at circuit output 860 through node 855, while maintaining a voltage level Vload at node 855 and circuit output 860. In various examples, the Vload voltage level is set to be more than the voltage level provided by ground 817, but low enough to provide an adequate voltage level at circuit output 860 so as to provide an "ON" signal for device 890 coupled to circuit output 860. In various examples, current source 850 is the current source 350 as illustrated in FIG. 3, and provides the same functions and performance features as described above with respect to current source 350, but coupled as described above, and instead of sourcing current to the circuit output, current source 850 is operable to sink current from circuit output 860. As illustrated in FIG. 8, current source 850 has a first input 851 coupled to node 855, and a current output 853 coupled to ground. In various examples, current source 850 is a low drop current source, operable to sink a current ($I_{OL}$) 857 from node 855 through current output 853 to ground. When current source 850 is active and current is provided to circuit output 860, current source 850 is operable to sink current provided at node 855 without affecting the voltage level provided at node 855. However, when current source 850 is activated and current is not being provided to node 855, or only an extremely small current is being provided to circuit output 860 from connector 880, such as when a high ohmic condition exists relative to circuit output 860, current source 850 is operable to pull the voltage level provided at node 855 to ground or to a voltage level coupled to the output 853 of current source 850.

As illustrated in FIG. 8, comparator 840 includes a first input 844 coupled to circuit output 860, a second input 842 coupled to ground, and an open load detection output 845. In various examples, comparator 840 is operable to compare the voltage differential between ground and the voltage level provided at circuit output 860, and provide an output signal at open load detection output 845 when the voltage differential between ground and the voltage level at circuit output 860 is less than a threshold differential voltage. In various examples, comparator 840 is operable to receive a voltage level at first input 844, compare the voltage level at input 844 to an absolute threshold voltage level, and provide an output signal at output 845 indicative of an open load condition at circuit output 860 if the voltage level at input 844 is less than the absolute threshold voltage level. In various examples, the absolute threshold voltage level is set at some value higher than that voltage level for ground, but less the Vload voltage level provided by delta voltage circuit 820 when a proper load is coupled to circuit output 860.

As shown in FIG. 8, open load detection circuit 801 is operable to be coupled to a load 805, represented by illustrative device 890, through coupling 803, coupling 803 comprising a conductor 880 operable to couple circuit output 860 of open load detection circuit 801 to input 881 of device 890. As illustrated, an open load condition, represented by open load condition "X" 882, can exist with respect to the connection provided by conductor 880 as described above with respect to connector 380 and open load condition 382 as described with respect to FIG. 3, and wherein the descriptions of connection 380 and open load condition 382 are applicable to connector 880 and open load condition 882 as illustrated in FIG. 8. In addition, in various examples device 890 includes resistive loads 892 and 896, and switching device 894, and switched output 893 as described above. However, examples of load 805 are not limited to any particular type of load, and in various examples can be any type of load that is operable to be controlled by the circuit output 860 provided by open load detection circuit 801.

Open load detection circuit 801, using delta voltage circuit 820, is operable to provide a voltage level as an output signal indicative of an "OFF" state for load 805 by coupling circuit output 860 to voltage supply 810, and to provide an "ON" state for load 805 by providing a low voltage level Vload at circuit output 860 by sinking current through delta voltage circuit 820. For example, when open load detection circuit 801 is providing an "OFF" state indication for load 805 at circuit output 860, controller 814 operates to control switch 812 to act as a closed switch, thus coupling voltage supply 810 to node 855 and circuit output 860, and controller 832 operates switch 830 to open, disconnecting delta voltage circuit 820 from ground 817. When in this configuration, circuit output 860 is coupled to a voltage level provided by voltage supply 810 that provides an "OFF" state indication to load 805, and no current is flowing through delta voltage control circuit 820.

During the "OFF" state, current source 850 and comparator 840 can be inactive. However, if current source 850 is active during the "OFF" state, current source 850 is operable to sink a small current at current input 851 from node 855 so that current source 850 does not affect the voltage level provided at node 855. During the "OFF" state, if comparator 840 is activated, input 844 of comparator 840 is coupled to the voltage provided by voltage supply 810, and thus will not detect an open load condition due to the high voltage level provided to input 844.

When transitioning from providing the "OFF" state indication to the "ON" state indication at circuit output 860, open load detection circuit 801 operates controller 814 to cause switch 812 to act as an open switch, disconnecting node 855 and circuit output 860 from voltage supply 810. Delta voltage circuit 820 is also activated, wherein controller 832 provides a control signal causing switch 830 to act as a closed switch, thus coupling second terminal 815 of delta voltage circuit 820 to ground 817, and allowing any current provided at node 855 from circuit output 860 to be sunk to ground through delta voltage circuit 820. Assuming a proper load is connected to circuit output 860, a current flow provided from load 805 to circuit output 860 will flow through first node 813, through delta voltage circuit 820, and out second node 815 to ground 817. As a result of the current flow through delta voltage circuit 820, a voltage drop ΔV 821 will be generated between first terminal 813 and second terminal 815, and a voltage level Vout,O representative of the difference between the ground voltage level and the voltage drop ΔV 821 will be provided as Vload at circuit output 860. As the transition from the "OFF" state voltage level to the ON state voltage level is completed, the circuit output 860 will provide the Vout,O voltage level as Vload at circuit output 860, wherein Vload is a voltage level that is adequate to provide an "ON" signal to load 805, and thus is operable to transition load 805 from an "OFF" state to an "ON" state. Further, because the voltage level provided at circuit output 860 is greater than the voltage level provided by ground 817, and thus greater than the voltage level required at circuit output 860 to cause comparator 840 to detect an open load condition with respect to circuit output 860, comparator 840 will not provide an output signal indicative of an open load condition. In these operating conditions, current source 850 will not be operable to control the voltage level at node 855, and will provide a weak current flow to ground due to the Vload voltage level being provided at node 855 by load 805.

In an alternative example, when open load detection circuit 801 as illustrated in FIG. 8 is transitioning from providing the "OFF" state indication to the "ON" state indication at circuit output 860, a brief initial current will flow through voltage delta circuit 820, causing circuit output 860 to be pulled down to the voltage output level normally provided by voltage delta circuit 820 when open load detection circuit is providing transitioning to providing the ON state and no open load conditions exist relative to circuit output 860. However, at any time after this brief initial period a proper load is not coupled to circuit output 860 (as represented by open load condition "X" 882), activation of delta voltage circuit 820 will not result in any further current being provided to node 855 from load 805 being sunk through delta voltage circuit 820. Under these conditions, current source 850 is operable to pull the voltage level provided at node 855 down to a voltage level that is below the open load threshold, which will cause comparator 840 to generate an output signal at output 845 indicative of an open load condition at circuit output 860. In various examples, comparator 840 uses either a voltage differential or an absolute threshold voltage level to determine that the voltage level provided at node 855 is indicative of an open load condition at circuit output 860, as described above.

In addition, once open load detection circuit 801 has completed the transition from providing the "OFF" state indication to providing the "ON" state indication at circuit output 860, monitoring for an open load condition at circuit output 860 can continue while in the "ON" state. If at any time while providing the "ON" state indication at circuit output 860 an open load condition occurs relative to circuit output 860, open load detection circuit 801 is operable to detect the open load condition, and provide an output signal indication that an open load condition was detected in a same manner as described above with respect to the detection of an open load condition during the transition from the "OFF" state to the "ON" state as described above. In various examples, if an open load condition is detected by open load detection circuit 801 during either the transition phase or during the "ON" phase, open load detection circuit 801 is operable to transition from the "ON" state back to the "OFF" state. In various examples, transition from the "ON" to the "OFF" state includes deactivating delta voltage circuit 820, and in various examples further includes operating switch 812 so as to couple circuit output 860 to voltage supply 810. In various examples, a short circuit condition to a voltage supply external to open load detection circuit 801 is inadvertently coupled to conductor 880 or circuit output 860, as represented by "VCC_short" 884. Coupling to VCC_short 884 can occur along conductor 880, or simply by a short circuit to circuit output 860. In various examples, voltage supply 810 is operable to limit current flow, or to stop current flow altogether, to circuit output 860 in the event of a short circuit condition occurring relative to circuit output 860. In various examples, delta voltage circuit 820 and current source 850 are operable to limit the total current flow through these devices respectively in conditions where a high voltage level is inadvertency applied to circuit output 860 from a source external to open load detection circuit 801.

Advantages of open load detection circuit 801 include the advantages described above with respect to open load detection circuit 301, but wherein open load detection circuit is operable to detect open load conditions while being operable to be coupled to loads that incorporate a passive pull-up at the input of the load. In various examples, open load detection circuit 801 is one or more of circuit outputs 122, 124, and 126 of output control circuit 120 as illustrated in FIG. 1. In various examples, processor 112 of CU 110 as illustrated in FIG. 1 provides control signals to control operation of controller 814 and controller 832 of open load detection circuit 801. In various examples, open load detection output 845 of comparator 840 provides an output signal representative of detection of an open load condition as an input to processor 112 of CU 110 for further processing by CU 110. In various examples, in response to receiving a signal indicative of detection of an open load condition from open load detection circuit 801, processor 112 of CU 110 is operable to provide open load detection circuit 801 with control signals operable to cause open load detection circuit 801 to transition from providing an "ON" state indication at output circuit 860 to providing an "OFF" state indication output at circuit output 860.

Figure 9A:
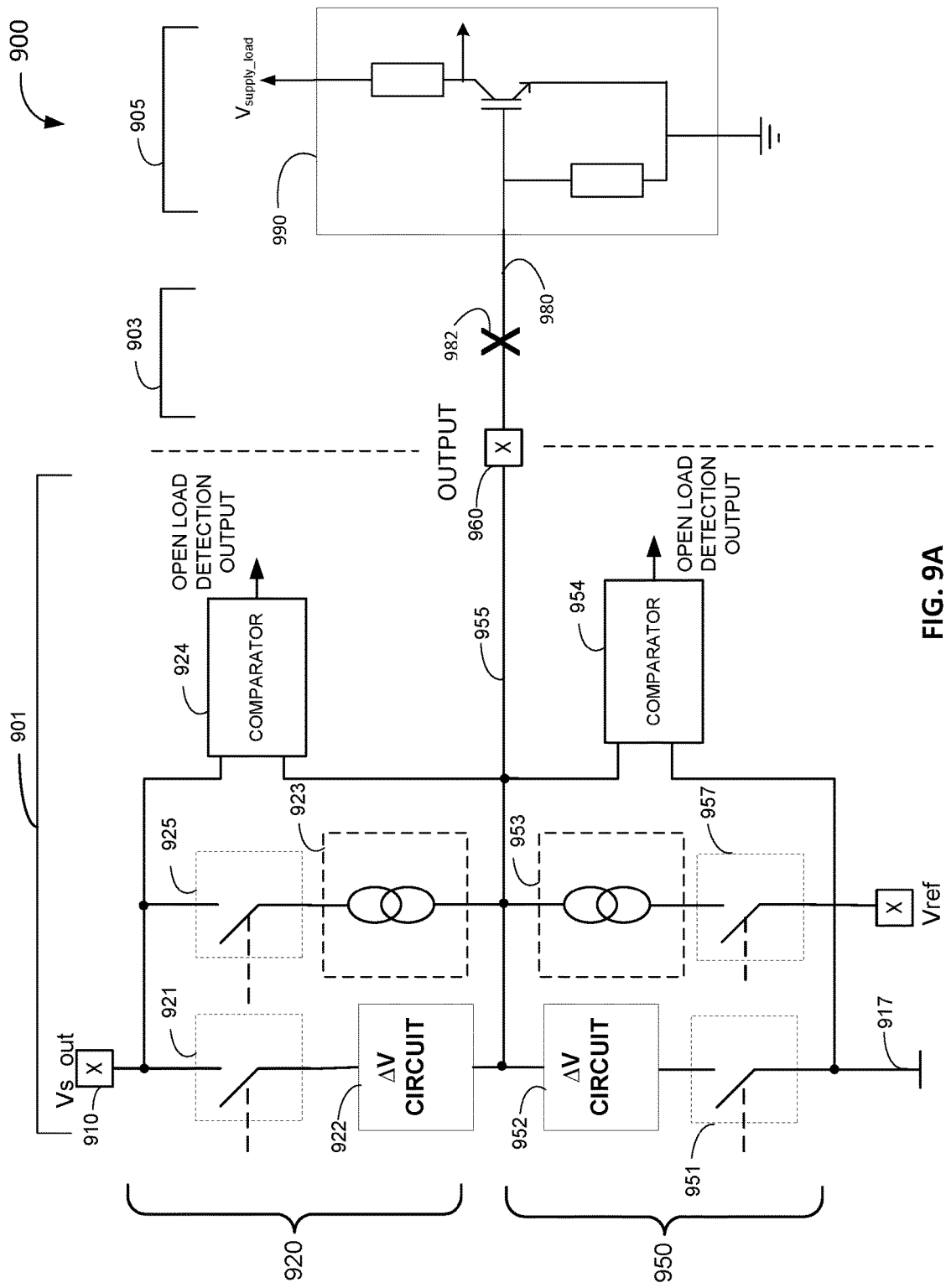
FIG. 9A illustrates a schematic diagram comprising an open load detection circuit in accordance with one or more example techniques described in the present disclosure.

FIG. 9A illustrates a schematic diagram 900 comprising an open load detection circuit 901 in accordance with one or more example techniques described in the present disclosure. Open load detection circuit 901 incudes a circuit output 960 coupled to a load 905, represented by illustrative load 990, through connection 903, including conductor 980 operable to couple circuit output 960 to an input of load 990. As illustrated in FIG. 9A, load 990 is a passively pulled down load, similar to load 390 shown and described with respect to FIG. 3.

As shown in FIG. 9A, open load detection circuit 901 comprises a first open load detection circuit 920 comprising first switch 921, a delta voltage circuit 922, a current source 923, and a comparator 924 coupled to the circuit output 960. The first switch 921, delta voltage circuit 922, current source 923, and comparator 924 are not limited to any particular types of devices, and can be any of the individual examples of a switch, a delta voltage circuit, a current source, and a comparator as described herein. Open load detection circuit 901 further comprises a second open load detection circuit 950 comprising second switch 951, a delta voltage circuit 952, a current source 953, and a comparator 954 coupled to the circuit output 960 as shown in FIG. 9A. The second switch 951, delta voltage circuit 952, current source 953, and comparator 954 are not limited to any particular types of devices, and can be any of the individual examples of a switch, a delta voltage circuit, a current source, and a comparator as described herein.

In operation, open load detection circuit 901 is operable to first open second switch 951 and then close first switch 921 in order to turn on load 990. In a manner similar to the operation described for open load detection circuit 301, by first opening second switch 951 then closing first switch 921, delta voltage circuit 922 is coupled to circuit output 960 through node 955, and thus provides a switch voltage to output 960 that is adequate to turn load 990 to an "ON" state. Delta voltage circuit 922 is operable to provide the switch voltage by reducing the voltage from supply voltage 910 by a voltage drop across delta voltage circuit 922. In various examples, the voltage drop is approximately 0.7 volts, and thus the switch voltage provided to circuit output 960 by delta voltage circuit 922 is approximately 0.7 volts less than the voltage provided as the supply voltage by Vs-out 910. During operation the two switches 921 and 925 act as a switch pair and the two switches 951 and 957 act as a second switch pair. Each of the two switch pairs is always switched together to the same state. In some applications this switching will not be 100% synchronously but my include delays between the two signals of a switch pair. When switches 921 and 925 are closed, current source 923 is operable to overcome the switch voltage provided to the circuit output by pulling the voltage level at output 960 to a level above the switch voltage level provided by delta voltage circuit 922 if an open load condition, represented by "X" 982, exists at circuit output 960. If current source 923 does pull the output voltage at the circuit output 960 up to a voltage level above the switch voltage level, comparator 924 is operable to detect the higher voltage level at circuit output 960, and provide a failure signal, as an output signal indicative of the open load condition. Thus, open load detection circuit 901 is operable to switch on load 990 and provide open load detection for circuit output 960 during substantially the entire time open load detection circuit has first switch 921 closed to turn on load 990.

In addition, open load detection circuit 901 is operable to provide a switch voltage that is adequate to turn load 990 to an "OFF" state by first opening first switch 921 and then closing second switch 951. By closing second switch 951, delta voltage circuit 952 is coupled to circuit output 960 through node 955, and thus provides a switch voltage to output 960 that is adequate to turn load 990 to an "OFF" state. Delta voltage circuit 952 is operable to provide the switch voltage by increasing the voltage from supply voltage 917 by a voltage drop across delta voltage circuit 952. In various examples, the voltage drop is approximately 0.7 volts, and thus the switch voltage provided to circuit output 960 by delta voltage circuit 952 is approximately 0.7 volts higher than the voltage provided as the supply voltage 917.

The external pull-down load will then pull the voltage further down to ground. As the voltage has been pulled to the switching level by delta voltage circuit 952 already, the load is in a defined state and the voltage change caused by the pull-down load does not affect the state of the load. When second switch 951 is closed, also switch 957 is closed and switch 925 has been opened together with switch 921, current source 953 is operable to overcome the switch voltage provided to the circuit output by pulling the voltage level at circuit output 960 to a level below the switch voltage level provided by delta voltage circuit 952 and further below the voltage level 917 to Vref if an open load condition, represented by "X" 982, exists at circuit output 960. If current source 953 does pull the output voltage at the circuit output 960 down to a voltage level below the switch voltage level and below the voltage level 917, comparator 954 is operable to detect the lower voltage level at circuit output 960, and provide a failure signal, as an output signal indicative of the open load condition. Thus, open load detection circuit 901 is operable to switch off load 990, and to provide open load detection for circuit output 960 during substantially the entire time open load detection circuit 901 has second switch 951 closed to turn off load 990. Therefore, open load detection circuit 901 is operable to provide detection of an open load condition for a passively pulled down load both when configured to turn the load on and also when configured to turn the load off.

Figure 9B:
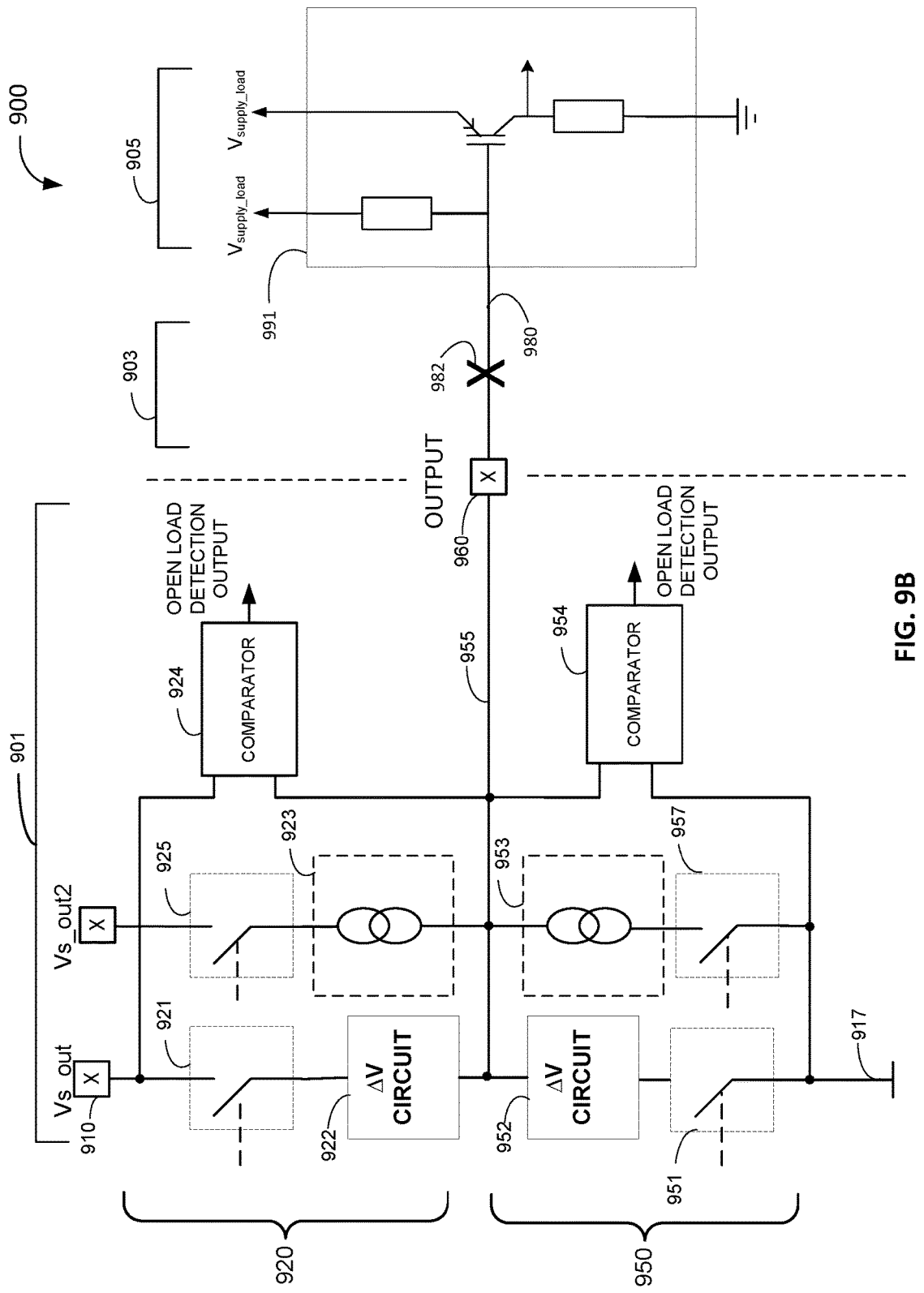
FIG. 9B illustrates a schematic diagram comprising an open load detection circuit in accordance with one or more example techniques described in the present disclosure.

FIG. 9B illustrates open load detection circuit 901 configured in the same manner as shown in FIG. 9A, but having open load detection circuit 901 coupled to load 905, represented by illustrative load 991, wherein load 991 is a passively pulled up load similar to load 890 shown in FIG. 8. As shown in FIG. 9B, open load detection circuit 901 is operable to first open second switch 951 and then to close first switch 921 to turn load 991 to an "OFF" state, and to first open first switch 921 and then to close second switch 951 to turn load 991 to an "ON" state. As such, open load detection circuit 920 is operable to provide detection of an open load condition at circuit output 960 when open load detection circuit 901 is configured to turn load 991 to the "OFF" state, and open load detection circuit 950 is operable to provide detection of an open load condition at circuit output 960 when open load circuit 901 is configured to turn load 991 to the 'ON" state. In various examples, as used herein the term "reduce" or "reduction" of the first supply voltage or the second supply voltage to a switch voltage of the first switch or the second switch refers to reducing an absolute value of the first voltage supply or the second voltage supply. In some examples, the term "reduce" or "reduction" of the first supply voltage or the second supply voltage to a switch voltage of the first switch or the second switch refers to delta voltage circuit is coupled to at least one of the first switch or the second switch to create a reduction in voltage magnitude of the first supply voltage or the second supply voltage to a switch voltage of the first switch or the second switch provided to the circuit output. In some examples, a reduction in absolute value of the supply voltage means the supply voltage reduces from a positive value to a lower positive value, for example from +7.0 volts to +6.3 volts. In other examples, reducing an absolute value of the supply voltage means the supply voltage increases from a negative value to a higher (yet still negative) value, for example −7.0 volts to −6.3 volts. In some examples, wherein the supply voltage is considered to be zero volts, a reduction can include "reducing" the zero volts to either a positive voltage, such as but not limited to +0.7 volts, or to a negative voltage, such as but not limited to −0.7 volts.

Figure 10:
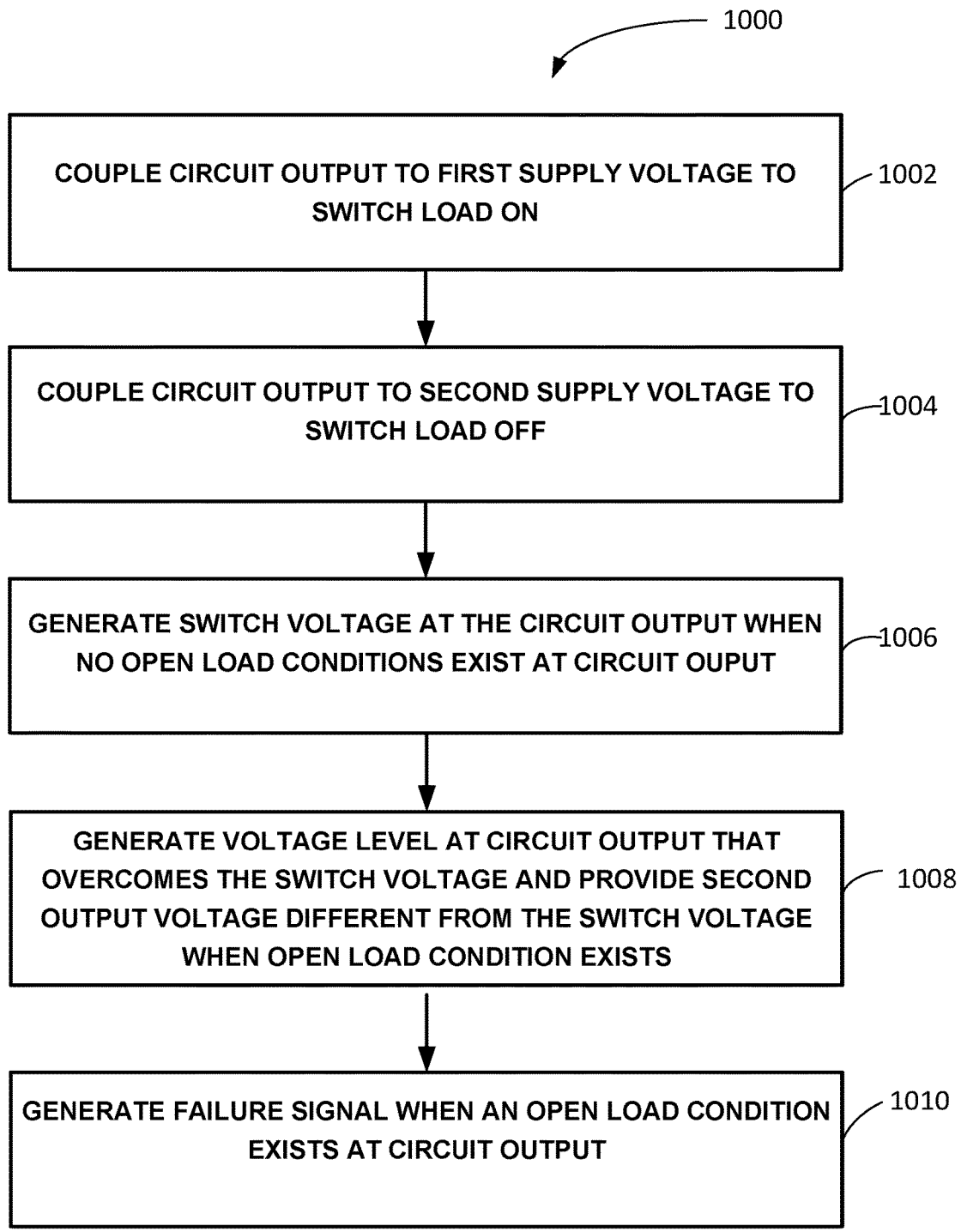
FIG. 10 is a flowchart illustrating various methods in accordance with the various techniques described in the present disclosure.

FIG. 10 is a flowchart 1000 illustrating various methods that may be performed by a circuit in accordance with the techniques described in the present disclosure. In various examples an open load detection circuit (such as open load detection circuits 301, 501, 601, 701, 801 and 901) couple, by a first switch, a circuit output of an open load detection circuit to a first supply voltage to switch a load on (block 1002). In various examples, the open load detection circuit couple, by a second switch, the circuit output to a second supply voltage to switch the load off (block 1004). In various examples, open load detection circuit generates, by at least one delta voltage circuit, a switch voltage at the circuit output when no open load conditions exist at the circuit output (block 1006). In various examples, an open load detection circuit generates, by at least one current source, a voltage level at the circuit output that overcomes the switch voltage and provides a second output voltage different from the switch voltage when an open load condition exists at the circuit output (1008). In various examples, an open load detection circuit generates, by at least on comparator, a failure signal when an open load condition exists at the circuit output (block 1010).

Figure 11:
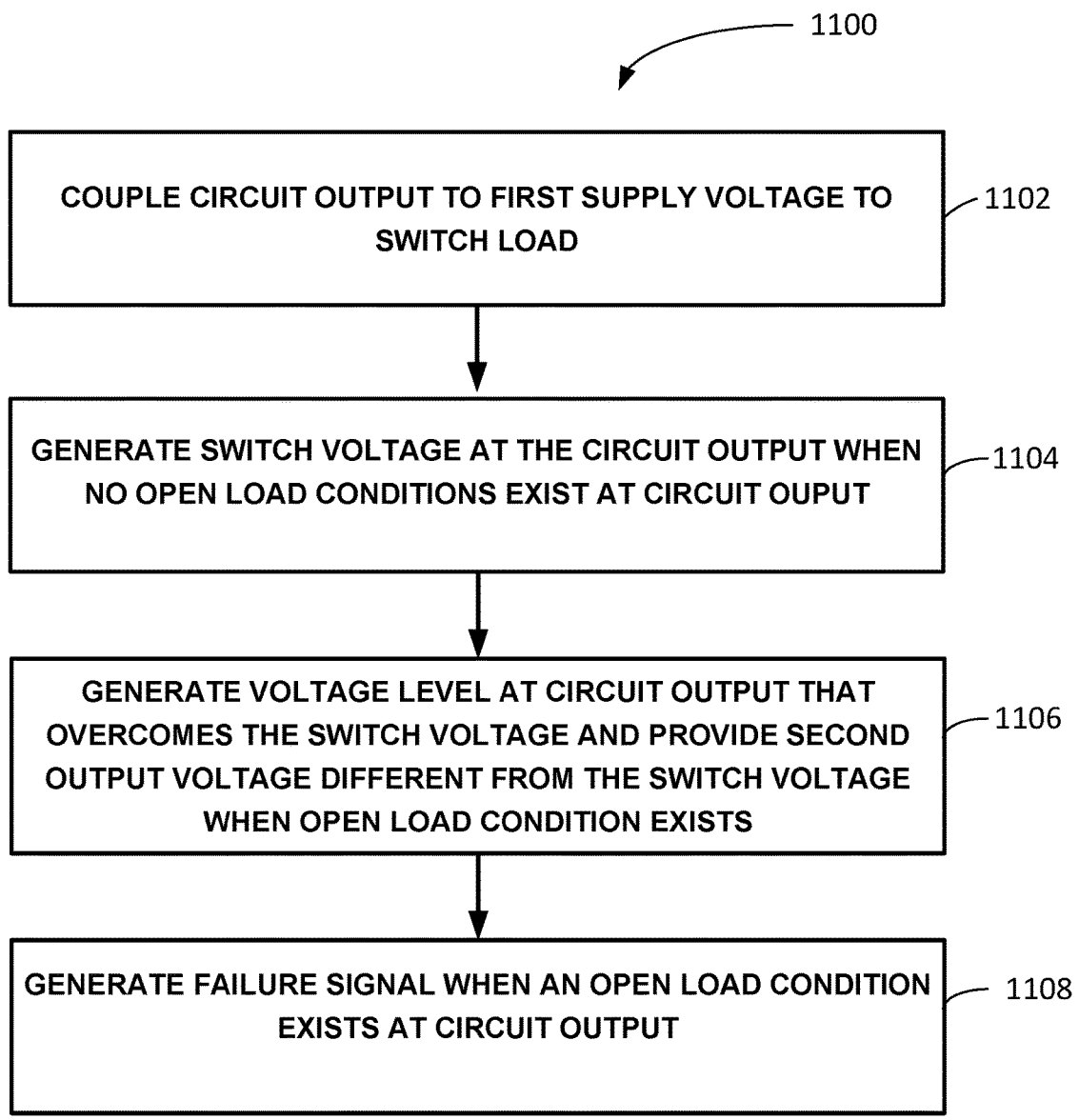
FIG. 11 is a flowchart illustrating various methods in accordance with the various techniques described in the present disclosure.

FIG. 11 is a flowchart 1100 illustrating various methods that may be performed by a circuit in accordance with the techniques described in the present disclosure. In various examples, an open load detection circuit (such as open load detection circuits 301, 501, 601, 701, 801 and 901) couple, by a first switch, a circuit output of an open load detection circuit to a first supply voltage to switch a load (block 1102). In various examples, the open load detection circuit generates, by at least one delta voltage circuit, a switch voltage at the circuit output when no open load conditions exist at the circuit output (block 1104). In various examples, the open load detection circuit generates, by at least one current source, a voltage level at the circuit output that overcomes the switch voltage and provides a second output voltage different from the switch voltage when an open load condition exists at the circuit output (block 1106). In various examples, the open load detection circuit generates, by at least one comparator, a failure signal when an open load condition exists at the circuit output (block 1108).

The techniques described herein may be implemented in hardware, firmware, or any combination thereof. The hardware may, also execute software. Any features described as modules, units or components may be implemented together in an integrated logic device or separately as discrete but interoperable logic devices. In some cases, various features may be implemented as an integrated circuit device, such as an integrated circuit chip or chipset. If implemented in software, the techniques may be realized at least in part by a computer-readable storage medium comprising instructions that, when executed, cause a processor to perform one or more of the techniques described above.

Semiconductor or semiconductor device as described herein generally refers to a transistor (3-lead device) as would be understood by one of ordinary skill in the art. Semiconductor and semiconductor device as used herein is not limited to any particular type of transistor, and any transistor operable to provide the functions of the semiconductor devices described herein, and the equivalents thereof, can be used in these devices and systems. In various examples, a semiconductor or semiconductor device as used herein refers to a Metal-Oxide-Semiconductor Field Effect Transistor (MOSFET) device, or a Complementary Metal-Oxide Semiconductor (CMOS) devices. Various examples, of semiconductor devices described herein also refer to a diode (two lead semiconductor) device, such as a PN junction diode, but diodes as used in devices and systems of open load detection circuits of the present application are not limited to any particular type of diode, and any diode operable to provide the functions of the diodes described herein, and the equivalents thereof, can be used in these devices and systems. In various examples, use of the word "coupled" or "coupling" refers to a direct coupling between lead or terminals of a device or electrical component by a conductor without intervening devices or electrical components, as would be understood by a person of ordinary skill in the art. In various examples, use of the word "coupled" or "coupling refers to electrical coupling of devices or electrical components that may include coupling through one or more intervening devices or other electrical components, as would be understood by one of ordinary skill in the art.

A computer-readable storage medium may form part of a computer program product, which may include packaging materials. A computer-readable storage medium may comprise a computer data storage medium such as random access memory (RAM), synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates code in the form of instructions or data structures and that can be accessed, read, and/or executed by a computer.

The code or instructions may be executed by one or more processors, such as one or more DSPs, general purpose microprocessors, ASICs, field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated software modules or hardware modules. The disclosure also contemplates any of a variety of integrated circuit devices that include circuitry to implement one or more of the techniques described in the present disclosure. Such circuitry may be provided in a single integrated circuit chip or in multiple, interoperable integrated circuit chips in a so-called chipset. Such integrated circuit devices may be used in a variety of applications.

The following examples describe one or more aspects of the disclosure.

Example 1

An open load detection circuit comprising: a circuit output configured to provide an output voltage to a load, a first switch coupled to the circuit output and coupled to a first supply voltage configured to switch the load on, a second switch coupled to the circuit output and coupled to a second supply voltage configured to switch the load off, at least one delta voltage circuit coupled to the circuit output configured to provide a delta voltage, wherein the delta voltage circuit is coupled to at least one of the first switch or the second switch to create a reduction in voltage magnitude of the first supply voltage or the second supply voltage to a switch voltage of the first switch or the second switch provided to the circuit output, at least one current source coupled to the circuit output to provide a current to the circuit output, the current source associated to the output and the same supply as the delta voltage circuit and configured to overcome the switch voltage provided to the circuit output in a case of an open load condition, and at least one comparator configured to provide a failure signal in the case of an open load condition.

Example 2

The open load detection circuit according to example 1, wherein the at least one delta voltage circuit is directly coupled to the first switch and is configured to provide the switch voltage to the circuit output to switch the load on when the first switch is closed, wherein a voltage provided by the at least one current source to overcome the switch voltage is greater than the switch voltage, and wherein the at least one comparator is configured to provide the failure signal in the case an open load condition exists at the circuit output while open load circuit is configured to switch the load on.

Example 3

The open load detection circuit according to any of examples 1-2, wherein the at least one delta voltage circuit is directly coupled to the second switch and is configured to provide the switch voltage to the circuit output to switch the load on when the second switch is closed, wherein a voltage provided by the at least one current source to overcome the switch voltage is less than the switch voltage, and wherein the at least one comparator is configured to provide the failure signal in the case an open load condition exists at the circuit output while open load circuit is configured to switch the load on.

Example 4

The open load detection circuit according to any of examples 1-3, wherein the at least one delta voltage circuit is directly coupled to the second switch and is configured to provide the switch voltage to the circuit output to switch the load off when the second switch is closed, wherein a voltage provided by the at least one current source to overcome the switch voltage is less than the switch voltage, and wherein the at least one comparator is configured to provide the failure signal in the case an open load condition exists at the circuit output while open load circuit is configured to switch the load off.

Example 5

The open load detection circuit according to any of examples 1-4, wherein the at least one delta voltage circuit is directly coupled to the first switch and is configured to provide the switch voltage to the circuit output to switch the load off when the first switch is closed, wherein a voltage provided by the at least one current source to overcome the switch voltage is greater than the switch voltage, and wherein the at least one comparator is configured to provide the failure signal in the case an open load condition exists at the circuit output while open load circuit is configured to switch the load off.

Example 6

The open load detection circuit according to any of examples 1-5, further comprising: a second delta voltage circuit, a third and fourth switch, and a second comparator each coupled to the circuit output and a second current source coupled to the fourth switch; wherein the first of the at least one delta voltage circuit is directly coupled to the first switch and is configured to provide the switch voltage to the circuit output to switch the load on when the first switch is closed, and the third switch is closed to couple the at least one current source to the output and the fourth switch is opened to disconnect the second current source from the output, wherein a voltage provided by the at least one current source to overcome the switch voltage is greater than the switch voltage, wherein the at least one comparator is configured to provide the failure signal in the case an open load condition exists at the circuit output while open load circuit is configured to switch the load on, wherein the second delta voltage circuit is directly coupled to the second switch and is configured to provide the switch voltage to the circuit output to switch the load off when the second switch is closed, and the fourth switch is closed to couple the at second current source to the output and the third switch is opened to disconnect the alt least one current source from the output, wherein a voltage provided by the second current source to overcome the switch voltage is less than the switch voltage, and wherein the second comparator is configured to provide the failure signal in the case an open load condition exists at the circuit output while open load circuit is configured to switch the load off.

Example 7

The open load detection circuit according to any of examples 1-6, further comprising: a second delta voltage circuit, a third and fourth switch, and a second comparator each coupled to the circuit output and a second current source coupled to the fourth switch; wherein the first of the at least one delta voltage circuit is directly coupled to the first switch and is configured to provide the switch voltage to the circuit output to switch the load off when the first switch is closed, and the third switch is closed to couple the at least one current source to the output and the fourth switch is opened to disconnect the second current source from the output, wherein a voltage provided by the at least one current source to overcome the switch voltage is greater than the switch voltage, wherein the at least one comparator is configured to provide the failure signal in the case an open load condition exists at the circuit output while open load circuit is configured to switch the load off, wherein the second delta voltage circuit is directly coupled to the second switch and is configured to provide the switch voltage to the circuit output to switch the load on when the second switch is closed, and the fourth switch is closed to couple the at second current source to the output and the third switch is opened to disconnect the alt least one current source from the output, wherein a voltage provided by the second current source to overcome the switch voltage is less than the switch voltage, and wherein the second comparator is configured to provide the failure signal in the case an open load condition exists at the circuit output while open load circuit is configured to switch the load on.

Example 8

The open load detection circuit according to any of examples 1-7, wherein the delta voltage circuit comprises a diode.

Example 9

The open load detection circuit according to any of examples 1-8, where the delta voltage circuit and the switch comprise at least one regulated transistor.

Example 10

The open load detection circuit according to any of examples 1-9, wherein the delta voltage circuit comprises a pair of regulated transistors arranged in an anti-serial configuration.

Example 11

The open load detection according to any of examples 1-10, wherein a first input of the at least one comparator is coupled to one of the first or the second supply voltages, and wherein a second input of the at least one comparator is coupled to the circuit output.

Example 12

The open load detection according to any of examples 1-11, wherein a first input of the at least one comparator is coupled to a first reference voltage, and wherein a second input of the comparator is coupled to the circuit output.

Example 13

The open load detection according to any of examples 1-12, wherein a voltage provided at the circuit output is greater than the first supply voltage when an open load condition exists at the circuit output.

Example 14

The open load detection circuit according to any of examples 1-13, wherein a voltage provided at the circuit output is less than the second supply voltage when an open load condition exists at the circuit output.

Example 15

The open load detection circuit according to any of examples 1-14, wherein the load comprises a metal-oxide semiconductor field-effect transistor (MOSFET) device, and the circuit output is directly coupled to a gate of the MOSFET device.

Example 16

The open load detection circuit according to any of examples 1-15, wherein the load comprises an insulated-gate bipolar transistor (IGBT) device, and the circuit output is directly coupled to a gate of the IGBT device.

Example 17

The open load detection circuit according to any of examples 1-16, wherein the load comprises a smart module.

Example 18

The open load detection circuit according to any of examples 1-17, wherein the load comprises a resistive load.

Example 19

The open load detection circuit according to any of examples 1-18, wherein the load comprises an inductive load.

Example 20

The open load detection circuit according to any of examples 1-19, wherein the delta voltage circuit comprises a resistor.

Example 21

A method comprising: coupling, by a first switch, a circuit output of an open load detection circuit to a first supply voltage to switch a load on, coupling, by a second switch, the circuit output to a second supply voltage to switch the load off, generating, by at least one delta voltage circuit, a switch voltage at the circuit output when no open load conditions exist at the circuit output, generating, by at least one current source, a voltage level at the circuit output that overcomes the switch voltage and provides a second output voltage different from the switch voltage when an open load condition exists at the circuit output, and generating, by at least one comparator, a failure signal when an open load condition exists at the circuit output.

Example 22

The method according to example 21, further comprising: coupling the at least one delta voltage circuit directly to the first supply voltage through the first switch by closing the first switch to generate the switch voltage at the circuit output to switch the load on, overcoming, by the at least one current source, the switch voltage to provide the second output voltage at the circuit output if an open load condition exists at the circuit output, comparing, by the at least one comparator, whether the switch voltage or the second output voltage is being provided at the circuit output, and generating, by the at least one comparator, the failure signal if the second output voltage is being provided at the circuit output.

Example 23

The method according to any of examples 21-22, further comprising: coupling the at least one delta voltage circuit directly to the second supply voltage through the second switch by closing the second switch to generate the switch voltage at the circuit output to switch the load on, overcoming, by the at least one current source, the switch voltage to provide the second output voltage at the circuit output if an open load condition exists at the circuit output, comparing, by the at least one comparator, whether the switch voltage or the second output voltage is being provided at the circuit output, and generating, by the at least one comparator, the failure signal if the second output voltage is being provided at the circuit output.

Example 24

The method according to any of examples 21-23, further comprising: coupling the at least one delta voltage circuit directly to the second supply voltage through the second switch by closing the second switch to generate the switch voltage at the circuit output to switch the load off, overcoming, by the at least one current source, the switch voltage to provide the second output voltage at the circuit output if an open load condition exists at the circuit output, comparing, by the at least one comparator, whether the switch voltage or the second output voltage is being provided at the circuit output, and generating, by the at least comparator, the failure signal if the second output voltage is being provided at the circuit output.

Example 25

The method according to any of examples 21-24, further comprising: coupling the at least one delta voltage circuit directly to the first supply voltage through the first switch by closing the first switch to generate the switch voltage at the circuit output to switch the load off, overcoming, by the at least one current source, the switch voltage to provide the second output voltage at the circuit output if an open load condition exists at the circuit output, comparing, by the at least one comparator, whether the switch voltage or the second output voltage is being provided at the circuit output, and generating, by the at least one comparator, the failure signal if the second output voltage is being provided at the circuit output.

Example 26

The method according to any of examples 21-25, further comprising: coupling the at least one delta voltage circuit directly to the first supply voltage through the first switch by first opening the second switch and then closing the first switch to generate the switch voltage at the circuit output to switch the load on, overcoming, by coupling the at least one current source directly to the first supply voltage through a third switch by opening a fourth switch and closing the third switch, the switch voltage to provide the second output voltage at the circuit output if an open load condition exists at the circuit output, comparing, by the at least one comparator, whether the switch voltage or the second output voltage is being provided at the circuit output, generating, by the at least one comparator, the failure signal if the second output voltage is being provided at the circuit output and the first switch is closed, coupling a second delta voltage circuit directly to the second supply voltage through the second switch by first opening the first switch and then closing the second switch to generate the switch voltage at the circuit output to switch the load off, overcoming, by coupling a second current source directly to the second supply voltage through the fourth switch by opening the third switch and closing the fourth switch, the switch voltage to provide the second output voltage at the circuit output if an open load condition exists at the circuit output, comparing, by a second comparator, whether the switch voltage or the second output voltage is being provided at the circuit output, and generating, by a second comparator, the failure signal if the second output voltage is being provided at the circuit output and the second switch is closed.

Example 27

The method according to any of examples 21-26, further comprising: coupling the at least one delta voltage circuit directly to the first supply voltage through the first switch by first opening the second switch and then closing the first switch to generate the switch voltage at the circuit output to switch the load off, overcoming, by coupling the at least one current source directly to the first supply voltage through the third switch by opening the fourth switch and closing the third switch, the switch voltage to provide the second output voltage at the circuit output if an open load condition exists at the circuit output, comparing, by the at least one comparator, whether the switch voltage or the second output voltage is being provided at the circuit output, generating, by the at least one comparator, the failure signal if the second output voltage is being provided at the circuit output and the first switch is closed, coupling a second delta voltage circuit directly to the second supply voltage through the second switch by first opening the first switch and then closing the second switch to generate the switch voltage at the circuit output to switch the load on, overcoming, by coupling a second current source directly to the second supply voltage through the fourth switch by opening the third switch and closing the fourth switch, the switch voltage to provide the second output voltage at the circuit output if an open load condition exists at the circuit output, comparing, by a second comparator, whether the switch voltage or the second output voltage is being provided at the circuit output, and generating, by a second comparator, the failure signal if the second output voltage is being provided at the circuit output and the second switch is closed.

Example 28

The method according to any of examples 21-27, wherein the delta voltage circuit comprises a diode.

Example 29

The method according to any of examples 21-28, where the delta voltage circuit comprises a regulated transistor.

Example 30

The method according to any of examples 21-29, wherein the delta voltage circuit comprises a pair of regulated transistors arranged in an anti-serial configuration.

Example 31

The method according to any of examples 21-30, wherein a first input of the at least one comparator is coupled to one of the first or the second supply voltages, and wherein a second input of the at least one comparator is coupled to the circuit output.

Example 32

The method according to any of examples 21-31, wherein a first input of the at least one comparator is coupled to a first reference voltage and wherein a second input of the at least one comparator is coupled to the circuit output.

Example 33

The method according to any of examples 21-32, wherein a voltage provided at the circuit output is greater than the first supply voltage when an open load condition exists at the circuit output.

Example 34

The method according to any of examples 21-33, wherein a voltage provided at the circuit output is less than the second supply voltage when an open load condition exists at the circuit output.

Example 35

The method according to any of examples 21-34, wherein the load comprises a metal-oxide semiconductor field-effect transistor (MOSFET) device, and the circuit output is directly coupled to a gate of the MOSFET device.

Example 36

The method according to any of examples 21-35, wherein the load comprises an insulated-gate bipolar transistor (IGBT) device, and the circuit output is directly coupled to a gate of the IGBT device.

Example 37

The method according to any of examples 21-36, wherein the load comprises a smart module.

Example 38

The method according to any of examples 21-37, wherein the load comprises one of a resistive load or an inductive load.

Example 39

The method according to any of examples 21-38, wherein the delta voltage circuit comprises a resistor.

Example 40

An open load detection circuit comprising: a circuit output configured to provide an output voltage to a load, a first switch coupled to the circuit output and coupled to a first supply voltage configured to switch the load, at least one delta voltage circuit coupled to the circuit output configured to provide a delta voltage, wherein the delta voltage circuit is coupled to the first switch to create a reduction in voltage magnitude of the first supply voltage to a switch voltage of the first switch provided to the circuit output, at least one current source coupled to the circuit output to provide a current to the circuit output, the current source configured to overcome the switch voltage provided to the circuit output in a case of an open load condition, and at least one comparator configured to provide a failure signal in the case of an open load condition.

Example 41

The open load detection circuit according to example 40, wherein the at least one delta voltage circuit is directly coupled to the first switch and is configured to provide the switch voltage to the circuit output to switch the load on when the first switch is closed, wherein a voltage provided by the at least one current source to overcome the switch voltage is greater than the switch voltage, and wherein the at least one comparator is configured to provide the failure signal in the case an open load condition exists at the circuit output while open load circuit is configured to switch the load on.

Example 42

The open load detection circuit according to any of examples 40-41, wherein the at least one delta voltage circuit is directly coupled to the first switch and is configured to provide the switch voltage to the circuit output to switch the load off when the first switch is closed, wherein a voltage provided by the at least one current source to overcome the switch voltage is greater than the switch voltage, and wherein the at least one comparator is configured to provide the failure signal in the case an open load condition exists at the circuit output while open load circuit is configured to switch the load off.

Example 43

The open load detection circuit according to any of examples 40-42, wherein the delta voltage circuit comprises a diode.

Example 44

The open load detection circuit according to any of examples 40-43, where the delta voltage circuit and the switch comprise at least one regulated transistor.

Example 45

The open load detection circuit according to any of examples 40-44, wherein the delta voltage circuit comprises a pair of regulated transistors arranged in an anti-serial configuration.

Example 46

The open load detection according to any of examples 40-45, wherein a first input of the at least one comparator is coupled to one of the first or the second supply voltages, and wherein a second input of the at least one comparator is coupled to the circuit output.

Example 47

The open load detection according to any of examples 40-46, wherein a first input of the at least one comparator is coupled to a first reference voltage, and wherein a second input of the comparator is coupled to the circuit output.

Example 48

The open load detection according to any of examples 40-47, wherein a voltage provided at the circuit output is greater than the switch first supply voltage if no load is connected to the circuit output.

Example 49

The open load detection circuit according to any of examples 40-48, wherein a voltage provided at the circuit output is less than the second supply voltage if no load is connected to the circuit output.

Example 50

The open load detection circuit according to any of examples 40-49, wherein the load comprises a metal-oxide semiconductor field-effect transistor (MOSFET) device, and the circuit output is directly coupled to a gate of the MOSFET device.

Example 51

The open load detection circuit according to any of examples 40-50, wherein the load comprises an insulated-gate bipolar transistor (IGBT) device, and the circuit output is directly coupled to a gate of the IGBT device.

Example 52

The open load detection circuit according to any of examples 40-51, wherein the load comprises a smart module.

Example 53

The open load detection circuit according to any of examples 40-52, wherein the load comprises a resistive load.

Example 54

The open load detection circuit according to any of examples 40-53, wherein the load comprises an inductive load.

Example 55

The open load detection circuit according to any of examples 40-54, wherein the delta voltage circuit comprises a resistor.

Example 56

A method comprising: coupling, by a first switch, a circuit output of an open load detection circuit to a first supply voltage to switch a load, generating, by at least one delta voltage circuit, a switch voltage at the circuit output when no open load conditions exist at the circuit output, generating, by at least one current source, a voltage level at the circuit output that overcomes the switch voltage and provides a second output voltage different from the switch voltage when an open load condition exists at the circuit output, and generating, by at least one comparator, a failure signal when an open load condition exists at the circuit output.

Example 57

The method of example 56, further comprising: coupling the at least one delta voltage circuit directly to the first supply voltage through the first switch by closing the first switch to generate the switch voltage at the circuit output to switch the load on, overcoming, by the at least one current source, the switch voltage to provide the second output voltage at the circuit output if an open load condition exists at the circuit output, comparing, by the at least one comparator, whether the switch voltage or the second output voltage is being provided at the circuit output, and generating, by the at least one comparator, the failure signal if the second output voltage is being provided at the circuit output.

Example 58

The method according to any of examples 56-57, further comprising: coupling the at least one delta voltage circuit directly to the first supply voltage through the first switch by closing the first switch to generate the switch voltage at the circuit output to switch the load off, overcoming, by the at least one current source, the switch voltage to provide the second output voltage at the circuit output if an open load condition exists at the circuit output, comparing, by the at least one comparator, whether the switch voltage or the second output voltage is being provided at the circuit output, and generating, by the at least one comparator, the failure signal if the second output voltage is being provided at the circuit output.

Example 59

The method according to any of examples 56-58, wherein the delta voltage circuit comprise a diode.

Example 60

The method according to any of examples 56-59, wherein the delta voltage circuit and the switch comprise at least one regulated transistor.

Example 61

The method according to any of examples 56-60, wherein the delta voltage circuit comprises a pair of regulated transistors arranged in an anti-serial configuration.

Example 62

The method according to any of examples 56-61, wherein a first input of the at least one comparator is coupled to one of the first or the second supply voltages, and wherein a second input of the at least one comparator is coupled to the circuit output.

Example 63

The method according to any of examples 56-62, wherein a first input of the at least one comparator is coupled to a first reference voltage, and wherein a second input of the at least one comparator is coupled to the circuit output.

Example 64

The method according to any of examples 56-63, wherein a voltage provided at the circuit output is greater than the first supply voltage if no load is connected to the circuit output.

Example 65

The method according to any of examples 56-64, wherein a voltage provided at the circuit output is less than the second supply voltage if no load is connected to the circuit output.

Example 66

The method according to any of examples 56-65, wherein the load comprises a metal-oxide semiconductor field-effect transistor (MOSFET) device, and the circuit output is directly coupled to a gate of the MOSFET device.

Example 67

The method according to any of examples 56-66, wherein the load comprises an insulated-gate bipolar transistor (IGBT) device, and the circuit output is directly coupled to a gate of the IGBT device.

Example 68

The method according to any of examples 56-67, wherein the load comprises a smart module.

Example 69

The method according to any of examples 56-68, wherein the load comprises one of a resistive load or an inductive load.

Example 70

The method according to any of examples 56-69, wherein the delta voltage circuit comprises a resistor.

Various examples have been described. These and other examples are within the scope of the following claims. The following claims illustrate one or more aspects of the disclosure.

What is claimed is:

1. An open load detection circuit comprising:
a circuit output configured to provide an output voltage to a load,
a first switch coupled to the circuit output and to a first supply voltage and configured to switch the load,
at least one delta voltage circuit coupled to the circuit output and configured to provide a delta voltage, wherein the at least one delta voltage circuit is further coupled to the first switch and configured to create a reduction in voltage magnitude of the first supply voltage to a switch voltage of the first switch and to provide the switch voltage to the circuit output,
at least one current source coupled to the circuit output and configured to provide a current to the circuit output and to overcome the switch voltage provided to the circuit output in a case of an open load condition, and
at least one comparator including a first input coupled to the circuit output, wherein the at least one comparator is configured to provide a failure signal in the case of an open load condition.

2. The open load detection circuit of claim 1,
wherein the at least one delta voltage circuit is directly coupled to the first switch and is configured to provide the switch voltage to the circuit output to switch the load on when the first switch is closed,
wherein a voltage provided by the at least one current source to overcome the switch voltage is greater than the switch voltage, and
wherein the at least one comparator is configured to provide the failure signal in the case an open load condition exists at the circuit output while the open load detection circuit is configured to switch the load on.

3. The open load detection circuit of claim 1, further comprising:
a second switch coupled to the circuit output and to a second supply voltage and configured to switch the load on,
wherein the at least one delta voltage circuit is directly coupled to a second switch and is configured to provide the switch voltage to the circuit output to switch the load on when the second switch is closed,
wherein a voltage provided by the at least one current source to overcome the switch voltage is less than the switch voltage, and
wherein the at least one comparator is configured to provide the failure signal in the case an open load condition exists at the circuit output while the open load detection circuit is configured to switch the load on.

4. The open load detection circuit of claim 1, further comprising:
a second switch coupled to the circuit output and to a second supply voltage and configured to switch the load off,
wherein the at least one delta voltage circuit is directly coupled to the second switch and is configured to provide the switch voltage to the circuit output to switch the load off when the second switch is closed,
wherein a voltage provided by the at least one current source to overcome the switch voltage is less than the switch voltage and greater than the second supply voltage, and
wherein the at least one comparator is configured to provide the failure signal in the case an open load condition exists at the circuit output while the open load detection circuit is configured to switch the load off.

5. The open load detection circuit of claim 1,
wherein the at least one delta voltage circuit is directly coupled to the first switch and is configured to provide the switch voltage to the circuit output to switch the load off when the first switch is closed,
wherein a voltage provided by the at least one current source to overcome the switch voltage is greater than the switch voltage, and
wherein the at least one comparator is configured to provide the failure signal in the case an open load condition exists at the circuit output while the open load detection circuit is configured to switch the load off.

6. The open load detection circuit of claim 1, further comprising:
a second switch coupled to the circuit output and to a second supply voltage and configured to switch the load off,
a second delta voltage circuit, a second current source, and a second comparator each coupled to the circuit output;
wherein a first of the at least one delta voltage circuit is directly coupled to the first switch and is configured to provide the switch voltage to the circuit output to switch the load on when the first switch is closed,
wherein a voltage provided by the at least one current source to overcome the switch voltage is greater than the switch voltage,
wherein the at least one comparator is configured to provide the failure signal in the case an open load condition exists at the circuit output while the open load detection circuit is configured to switch the load on,
wherein the second delta voltage circuit is directly coupled to the second switch and is configured to provide the switch voltage to the circuit output to switch the load off when the second switch is closed,
wherein a voltage provided by the second current source to overcome the switch voltage is less than the switch voltage, and
wherein the second comparator is configured to provide the failure signal in the case an open load condition exists at the circuit output while the open load detection circuit is configured to switch the load off.

7. The open load detection circuit of claim 1, further comprising:
a second switch coupled to the circuit output and to a second supply voltage and configured to switch the load on, a second delta voltage circuit, a second current source, and a second comparator each coupled to the circuit output;
wherein a first of the at least one delta voltage circuit is directly coupled to the first switch and is configured to provide the switch voltage to the circuit output to switch the load off when the first switch is closed,
wherein a voltage provided by the at least one current source to overcome the switch voltage is greater than the switch voltage,
wherein the at least one comparator is configured to provide the failure signal in the case an open load condition exists at the circuit output while the open load detection circuit is configured to switch the load off,
wherein the second delta voltage circuit is directly coupled to the second switch and is configured to provide the switch voltage to the circuit output to switch the load on when the second switch is closed,
wherein a voltage provided by the second current source to overcome the switch voltage is less than the switch voltage, and
wherein the second comparator is configured to provide the failure signal in the case an open load condition exists at the circuit output while the open load detection circuit is configured to switch the load on.

8. The open load detection circuit of claim 1, wherein the at least one delta voltage circuit comprises a diode.

9. The open load detection circuit of claim 1, where the at least one delta voltage circuit and the first switch comprise at least one regulated transistor.

10. The open load detection circuit of claim 1, wherein the at least one delta voltage circuit comprises a pair of regulated transistors arranged in an anti-serial configuration.

11. The open load detection of claim 1,
wherein a second input of the at least one comparator is coupled to one of the first supply voltage or a second supply voltage.

12. The open load detection of claim 1,
wherein a second input of the at least one comparator is coupled to a first reference voltage.

13. The open load detection of claim 1, wherein a voltage provided at the circuit output is greater than the first supply voltage when an open load condition exists at the circuit output.

14. The open load detection circuit of claim 3, wherein a voltage provided at the circuit output is less than the second supply voltage when an open load condition exists at the circuit output.

15. The open load detection circuit of claim 1,
wherein the load comprises a metal-oxide semiconductor field-effect transistor (MOSFET) device, and
wherein the circuit output is directly coupled to a gate of the MOSFET device.

16. The open load detection circuit of claim 1, wherein the load comprises an insulated-gate bipolar transistor (IGBT) device, and the circuit output is directly coupled to a gate of the IGBT device.

17. The open load detection circuit of claim 1, wherein the load comprises a smart module.

18. The open load detection circuit of claim 1, wherein the load comprises a resistive load.

19. The open load detection circuit of claim 1, wherein the load comprises an inductive load.

20. The open load detection circuit of claim 1, wherein the at least one delta voltage circuit comprises a resistor.

21. A method comprising:
coupling, by a first switch, a circuit output of an open load detection circuit to a first supply voltage to switch a load,
generating, by at least one delta voltage circuit, a switch voltage at the circuit output when no open load conditions exist at the circuit output,
generating, by at least one current source, a voltage level at the circuit output that overcomes the switch voltage and provides a second output voltage different from the switch voltage when an open load condition exists at the circuit output,
receiving, by at least one comparator, the voltage level at the circuit output, and
generating, by the at least one comparator, a failure signal when an open load condition exists at the circuit output.

22. The method of claim 21, further comprising:
coupling the at least one delta voltage circuit directly to the first supply voltage through the first switch by closing the first switch to generate the switch voltage at the circuit output to switch the load on,
overcoming, by the at least one current source, the switch voltage to provide the second output voltage at the circuit output if an open load condition exists at the circuit output,
comparing, by the at least one comparator, whether the switch voltage or the second output voltage is being provided at the circuit output, and
generating, by the at least one comparator, the failure signal if the second output voltage is being provided at the circuit output.

23. The method of claim 21, further comprising:
coupling, by a second switch, the circuit output to a second supply voltage to switch the load on,
coupling the at least one delta voltage circuit directly to the second supply voltage through the second switch by closing the second switch to generate the switch voltage at the circuit output to switch the load on,
overcoming, by the at least one current source, the switch voltage to provide the second output voltage at the circuit output if an open load condition exists at the circuit output,
comparing, by the at least one comparator, whether the switch voltage or the second output voltage is being provided at the circuit output, and
generating, by the at least one comparator, the failure signal if the second output voltage is being provided at the circuit output.

24. The method of claim 21, further comprising:
coupling, by a second switch, the circuit output to a second supply voltage to switch the load off,
coupling the at least one delta voltage circuit directly to the second supply voltage through the second switch by closing the second switch to generate the switch voltage at the circuit output to switch the load off,
overcoming, by the at least one current source, the switch voltage to provide the second output voltage at the circuit output if an open load condition exists at the circuit output,
comparing, by the at least one comparator, whether the switch voltage or the second output voltage is being provided at the circuit output, and
generating, by the at least comparator, the failure signal if the second output voltage is being provided at the circuit output.

25. The method of claim 21, further comprising:
coupling the at least one delta voltage circuit directly to the first supply voltage through the first switch by closing the first switch to generate the switch voltage at the circuit output to switch the load off, overcoming, by the at least one current source, the switch voltage to provide the second output voltage at the circuit output if an open load condition exists at the circuit output, comparing, by the at least one comparator, whether the switch voltage or the second output voltage is being provided at the circuit output, and generating, by the at least one comparator, the failure signal if the second output voltage is being provided at the circuit output.

26. The method of claim 21, further comprising:

coupling the at least one delta voltage circuit directly to the first supply voltage through the first switch by first opening the second switch and then closing the first switch to generate the switch voltage at the circuit output to switch the load on, overcoming, by the at least one current source, the switch voltage to provide the second output voltage at the circuit output if an open load condition exists at the circuit output, comparing, by the at least one comparator, whether the switch voltage or the second output voltage is being provided at the circuit output, generating, by the at least one comparator, the failure signal if the second output voltage is being provided at the circuit output and the first switch is closed, coupling, by a second switch, the circuit output to a second supply voltage to switch the load off, coupling a second delta voltage circuit directly to the second supply voltage through the second switch by first opening the first switch and then closing the second switch to generate the switch voltage at the circuit output to switch the load off, overcoming, by a second current source, the switch voltage to provide the second output voltage at the circuit output if an open load condition exists at the circuit output, comparing, by a second comparator, whether the switch voltage or the second output voltage is being provided at the circuit output, and generating, by a second comparator, the failure signal if the second output voltage is being provided at the circuit output and the second switch is closed.

27. The method of claim 21, further comprising:

coupling the at least one delta voltage circuit directly to the first supply voltage through the first switch by first opening the second switch and then closing the first switch to generate the switch voltage at the circuit output to switch the load off, overcoming, by the at least one current source, the switch voltage to provide the second output voltage at the circuit output if an open load condition exists at the circuit output, comparing, by the at least one comparator, whether the switch voltage or the second output voltage is being provided at the circuit output, generating, by the at least one comparator, the failure signal if the second output voltage is being provided at the circuit output and the first switch is closed, coupling, by a second switch, the circuit output to a second supply voltage to switch the load on, coupling a second delta voltage circuit directly to the second supply voltage through the second switch by first opening the first switch and then closing the second switch to generate the switch voltage at the circuit output to switch the load on, overcoming, by a second current source, the switch voltage to provide the second output voltage at the circuit output if an open load condition exists at the circuit output, comparing, by a second comparator, whether the switch voltage or the second output voltage is being provided at the circuit output, and generating, by a second comparator, the failure signal if the second output voltage is being provided at the circuit output and the second switch is closed.

28. The method of claim 21, wherein the at least one delta voltage circuit comprises a diode.

29. The method of claim 21, wherein the at least one delta voltage circuit and the switch comprise at least one regulated transistor.

30. The method of claim 21, wherein the at least one delta voltage circuit comprises a pair of regulated transistors arranged in an anti-serial configuration.

31. The method of claim 21,
wherein a first input of the at least one comparator is coupled to one of the first supply voltage or a second supply voltage, and
wherein a second input of the at least one comparator is coupled to the circuit output.

32. The method of claim 21,
wherein a first input of the at least one comparator is coupled to a first reference voltage, and
wherein a second input of the at least one comparator is coupled to the circuit output.

33. The method of claim 21, wherein a voltage provided at the circuit output is greater than the first supply voltage when an open load condition exists at the circuit output.

34. The method of claim 23, wherein a voltage provided at the circuit output is less than the second supply voltage when an open load condition exists at the circuit output.

35. The method of claim 21,
wherein the load comprises a metal-oxide semiconductor field-effect transistor (MOSFET) device, and
wherein the circuit output is directly coupled to a gate of the MOSFET device.

36. The method of claim 21, wherein the load comprises an insulated-gate bipolar transistor (IGBT) device, and the circuit output is directly coupled to a gate of the IGBT device.

37. The method of claim 21, wherein the load comprises a smart module.

38. The method of claim 21, wherein the load comprises one of a resistive load or an inductive load.

39. The method of claim 21, wherein the at least one delta voltage circuit comprises a resistor.

* * * * *